(12) United States Patent
Kato

(10) Patent No.: US 10,074,576 B2
(45) Date of Patent: Sep. 11, 2018

(54) SEMICONDUCTOR MEMORY DEVICE

(71) Applicant: Semiconductor Energy Laboratory Co., Ltd., Kanagawa-ken (JP)

(72) Inventor: Kiyoshi Kato, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 254 days.

(21) Appl. No.: 14/632,375

(22) Filed: Feb. 26, 2015

(65) Prior Publication Data

US 2015/0287745 A1   Oct. 8, 2015

(30) Foreign Application Priority Data

Feb. 28, 2014 (JP) ................................. 2014-039280

(51) Int. Cl.
*H01L 21/8258* (2006.01)
*H01L 27/12* (2006.01)
(Continued)

(52) U.S. Cl.
CPC ...... *H01L 21/8258* (2013.01); *H01L 27/0688* (2013.01); *H01L 27/092* (2013.01);
(Continued)

(58) Field of Classification Search
CPC ............. H01L 27/0688; H01L 21/8258; H01L 27/092; H01L 27/1225; H01L 27/1207;
(Continued)

(56) References Cited

U.S. PATENT DOCUMENTS 5,731,856 A    3/1998  Kim et al.
5,744,864 A    4/1998  Cillessen et al.
(Continued)

FOREIGN PATENT DOCUMENTS

EP    1 737 044 A1    12/2006
EP    2 226 847 A2    9/2010
(Continued)

OTHER PUBLICATIONS

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Mohsen Ahmadi
(74) *Attorney, Agent, or Firm* — Husch Blackwell LLP

(57) ABSTRACT

A semiconductor device including a circuit that has a reduced area is provided. Alternatively, a semiconductor device including a circuit that can have a smaller power supply voltage variation is provided.

The semiconductor device includes a first transistor, a second transistor, a first power supply wiring, and a second power supply wiring. The first transistor and the second transistor are stacked. The first power supply wiring and the second power supply wiring are stacked. The second power supply wiring and the first power supply wiring at least partly overlap with each other. The second power supply wiring and the first power supply wiring are substantially parallel to each other. A source electrode of the first transistor is electrically connected to the first power supply wiring. A source electrode of the second transistor is electrically connected to the second power supply wiring. The second transistor is an n-channel transistor, and a channel formation region is formed using an oxide semiconductor. The first transistor is a p-channel transistor, and a channel formation region is formed using silicon.

17 Claims, 39 Drawing Sheets

(51) Int. Cl.
  *H01L 29/786* (2006.01)
  *H01L 27/092* (2006.01)
  *H01L 27/06* (2006.01)
(52) U.S. Cl.
  CPC ...... *H01L 27/1225* (2013.01); *H01L 29/7869* (2013.01); *H01L 29/78696* (2013.01)
(58) Field of Classification Search
  CPC ........... H01L 29/7869; H01L 29/78696; H01L 29/78645; H01L 29/66969
  See application file for complete search history.

(56) References Cited

U.S. PATENT DOCUMENTS

| | | | |
|---|---|---|---|
| 5,949,098 A * | 9/1999 | Mori | H01L 23/5222 257/207 |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,482,974 B2 | 7/2013 | Saito et al. | |
| 9,236,408 B2 * | 1/2016 | Yamazaki | H01L 27/14609 |
| 9,472,678 B2 * | 10/2016 | Yamazaki | H01L 27/0886 |
| 9,673,224 B2 * | 6/2017 | Yamazaki | H01L 27/1225 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0156277 A1 * | 7/2005 | Nakano | H01L 23/5223 257/532 |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0089417 A1 * | 4/2011 | Yamazaki | H01L 27/0688 257/43 |
| 2011/0101351 A1 | 5/2011 | Yamazaki et al. | |
| 2012/0075917 A1 * | 3/2012 | Takemura | G11C 8/14 365/149 |
| 2013/0093096 A1 * | 4/2013 | Furumiya | H01L 23/5225 257/773 |
| 2013/0285049 A1 | 10/2013 | Ohmaru et al. | |
| 2013/0334533 A1 * | 12/2013 | Yamazaki | H01L 29/7869 257/57 |
| 2015/0364606 A1 * | 12/2015 | Yamazaki | G11C 16/0433 257/43 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |

(56) References Cited

FOREIGN PATENT DOCUMENTS

| JP | 2011-187950 A | 9/2011 |
|---|---|---|
| WO | WO 2004/114391 A1 | 12/2004 |

OTHER PUBLICATIONS

Asaoka, Y. et al., "29.1: Polarizer-Free Reflective LCD Combined With Ultra Low-Power Driving Technology," SID Digest '09: SID International Symposium Digest of Technical Papers, May 31, 2009, pp. 395-398.
Chern, H. et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.
Cho, D. et al., "21.2: Al and Sn-Doped Zinc Indium Oxide Thin Film Transistors for AMOLED Back-Plane," SID Digest '09: SID International Symposium Digest of Technical Papers, May 31, 2009, pp. 280-283.
Clark, S. et al., "First Principles Methods Using CASTEP," Zeitschrift fur Kristallographie, 2005, vol. 220, pp. 567-570.
Coates, D. et al., "Optical Studies of the Amorphous Liquid-Cholesteric Liquid Crystal Transition:The "Blue Phase"," Physics Letters, Sep. 10, 1973, vol. 45A, No. 2, pp. 115-116.
Costello, M. et al., "Electron Microscopy of a Cholesteric Liquid Crystal and Its Blue Phase," Physical Review. A, May 1, 1984, vol. 29, No. 5, pp. 2957-2959.
Dembo, H. et al., "RFCPUS on Glass and Plastic Substrates Fabricated by TFT Transfer Technology," IEDM 05: Technical Digest of International Electron Devices Meeting, Dec. 5, 2005, pp. 1067-1069.
Fortunato, E. et al., "Wide-Bandgap High-Mobility ZnO Thin-Film Transistors Produced at Room Temperature," Applied Physics Letters, Sep. 27, 2004, vol. 85, No. 13, pp. 2541-2543.
Fung, T. et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.
Godo, H. et al., "P-9:Numerical Analysis on Temperature Dependence of Characteristics of Amorphous In—Ga—Zn-Oxide TFT," SID Digest '09 : SID International Symposium Digest of Technical Papers, May 31, 2009, pp. 1110-1112.
Godo, H. et al., "Temperature Dependence of Characteristics and Electronic Structure for Amorphous In—Ga—Zn-Oxide TFT," AM-FPD '09 Digest of Technical Papers, Jul. 1, 2009, pp. 41-44.
Hayashi, R. et al., "42.1: Invited Paper: Improved Amorphous In—Ga—Zn—O TFTs," SID Digest '08 : SID International Symposium Digest of Technical Papers, May 20, 2008, vol. 39, pp. 621-624.
Hirao, T. et al., "Novel Top-Gate Zinc Oxide Thin-Film Transistors (ZnO TFTs) for AMLCDS," Journal of the Society for Information Display, 2007, vol. 15, No. 1, pp. 17-22.
Hosono, H. et al., "Working Hypothesis to Explore Novel Wide Band Gap Electrically Conducting Amorphous Oxides and Examples," Journal of Non-Crystalline Solids, 1996, vol. 198-200, pp. 165-169.
Hosono, H., "68.3:Invited Paper:Transparent Amorphous Oxide Semiconductors for High Performance TFT", SID Digest '07: SID International Symposium Digest of Technical Papers, 2007, vol. 38, pp. 1830-1833.
Hsieh, H. et al., "P-29:Modeling of Amorphous Oxide Semiconductor Thin Film Transistors and Subgap Density of States," SID Digest '08: SID International Symposium Digest of Technical Papers, May 20, 2008, vol. 39, pp. 1277-1280.
Ikeda, T. et al., "Full-Functional System Liquid Crystal Display Using CG-Silicon Technology," SID Digest '04: SID International Symposium Digest of Technical Papers, 2004, vol. 35, pp. 860-863.
Janotti, A. et al., "Native Point Defects in ZnO," Physical Review. B, Oct. 4, 2007, vol. 76, No. 16, pp. 165202-1-165202-22.
Janotti, A. et al., "Oxygen Vacancies in ZnO," Applied Physics Letters, 2005, vol. 87, pp. 122102-1-122102-3.

Jeong, J. et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.
Jin, D. et al., "65.2:Distinguished Paper:World-Largest (6.5") Flexible Full Color Top Emission AMOLED Display on Plastic Film and Its Bending Properties," SID Digest '09: SID International Symposium Digest of Technical Papers, May 31, 2009, pp. 983-985.
Kanno, H. et al., "White Stacked Electrophosphorecent Organic Light-Emitting Devices Employing MoO3 as a Charge-Generation Layer," Advanced Materials, 2006, vol. 18, No. 3, pp. 339-342.
Kikuchi, H. et al., "39.1:Invited Paper:Optically Isotropic Nano-Structured Liquid Crystal Composites for Display Applications," SID Digest '09: SID International Symposium Digest of Technical Papers, May 31, 2009, pp. 578-581.
Kikuchi, H. et al., "62.2: Invited Paper:Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.
Kikuchi, H. et al., "Polymer-Stabilized Liquid Crystal Blue Phases," Nature Materials, Sep. 2, 2002, vol. 1, pp. 64-68.
Kim, S. et al., "High-Performance Oxide Thin Film Transistors Passivated by Various Gas Plasmas", 214th ECS Meeting, 2008, No. 2317, ECS.
Kimizuka, N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.," Journal of Solid State Chemistry, 1985, vol. 60, pp. 382-384.
Kimizuka, N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.
Kitzerow, H. et al., "Observation of Blue Phases in Chiral Networks," Liquid Crystals, 1993, vol. 14, No. 3, pp. 911-916.
Kurokawa, Y. et al., "UHF RFCPUS on Flexible and Glass Substrates for Secure RFID Systems," Journal of Solid-State Circuits , 2008, vol. 43, No. 1, pp. 292-299.
Lany, S. et al., "Dopability, Intrinsic Conductivity, and Nonstoichiometry of Transparent Conducting Oxides", Physical Review Letters, Jan. 26, 2007, vol. 98, pp. 045501-1-045501-4.
Lee, H. et al., "Current Status of, Challenges to, and Perspective View of AM-OLED," IDW '06 : Proceedings of the 13th International Display Workshops, Dec. 7, 2006, pp. 663-666.
Lee, J. et al., "World's Largest (15-Inch) XGA AMLCD Panel Using IGZO Oxide TFT," SID Digest '08: SID International Symposium Digest of Technical Papers, May 20, 2008, vol. 39, pp. 625-628.
Lee, M. et al., "15.4:Excellent Performance of Indium-Oxide-Based Thin-Film Transistors by DC Sputtering," SID Digest '09 : SID International Symposium Digest of Technical Papers, May 31, 2009, pp. 191-193.
Li, C. et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.
Masuda, S. et al., "Transparent Thin Film Transistors Using ZnO as an Active Channel Layer and Their Electrical Properties," Journal of Applied Physics, Feb. 1, 2003, vol. 93, No. 3, pp. 1624-1630.
Meiboom, S. et al., "Theory of the Blue Phase of Cholesteric Liquid Crystals," Physical Review Letters, May 4, 1981, vol. 46, No. 18, pp. 1216-1219.
Miyasaka, M., "SUFTLA Flexible Microelectronics on Their Way to Business," SID Digest '07: SID International Symposium Digest of Technical Papers, 2007, vol. 38, pp. 1673-1676.
Mo, Y. et al., "Amorphous Oxide TFT Backplanes for Large Size AMOLED Displays", IDW '08 : Proceedings of the 6th International Display Workshops, Dec. 3, 2008, pp. 581-584.
Nakamura, M. et al., "The Phase Relations in the In2O3—Ga2ZnO4—ZnO System at 1350° C.," Journal of Solid State Chemistry, Aug. 1, 1991, vol. 93, No. 2, pp. 298-315.

(56) References Cited

OTHER PUBLICATIONS

Nakamura, M., "Synthesis of Homologous Compound with New Long-Period Structure," Nirim Newsletter, Mar. 1, 1995, vol. 150, pp. 1-4.

Nomura, K. et al., "Amorphous Oxide Semiconductors for High-Performance Flexible Thin-Film Transistors," Japanese Journal of Applied Physics, 2006, vol. 45, No. 5B, pp. 4303-4308.

Nomura, K. et al., "Carrier Transport in Transparent Oxide Semiconductor with Intrinsic Structural Randomness Probed Using Single-Crystalline $InGaO_3(ZnO)_5$ Films," Applied Physics Letters, Sep. 13, 2004, vol. 85, No. 11, pp. 1993-1995.

Nomura, K. et al., "Room-Temperature Fabrication of Transparent Flexible Thin-Film Transistors Using Amorphous Oxide Semiconductors," Nature, Nov. 25, 2004, vol. 432, pp. 488-492.

Nomura, K. et al., "Thin-Film Transistor Fabricated in Single-Crystalline Transparent Oxide Semiconductor," Science, May 23, 2003, vol. 300, No. 5623, pp. 1269-1272.

Nowatari, H. et al., "60.2: Intermediate Connector With Suppressed Voltage Loss for White Tandem OLEDS," SID Digest '09: SID International Symposium Digest of Technical Papers, May 31, 2009, vol. 40, pp. 899-902.

Oba, F. et al., "Defect Energetics in ZnO: A Hybrid Hartree-Fock Density Functional Study," Physical Review. B, 2008, vol. 77, pp. 245202-1-245202-6.

Oh, M. et al., "Improving the Gate Stability of ZnO Thin-Film Transistors With Aluminum Oxide Dielectric Layers," Journal of the Electrochemical Society, 2008, vol. 155, No. 12, pp. H1009-H1014.

Ohara, H. et al., "21.3:4.0 In. QVGA AMOLED Display Using In—Ga—Zn-Oxide TFTs With a Novel Passivation Layer," SID Digest '09: SID International Symposium Digest of Technical Papers, May 31, 2009, pp. 284-287.

Ohara, H. et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M. et al., "Amorphous Transparent Conductive Oxide $InGaO_3(ZnO)_m$ (m<4):a $Zn4s$ conductor," Philosophical Magazine, 2001, vol. 81, No. 5, pp. 501-515.

Orita, M. et al., "Mechanism of Electrical Conductivity of Transparent $InGaZnO_4$," Physical Review. B, Jan. 15, 2000, vol. 61, No. 3, pp. 1811-1816.

Osada, T. et al., "15.2: Development of Driver-Integrated Panel using Amorphous In—Ga—Zn-Oxide TFT," SID Digest '09: SID International Symposium Digest of Technical Papers, May 31, 2009, pp. 184-187.

Osada, T. et al., "Development of Driver-Integrated Panel Using Amorphous In—Ga—Zn-Oxide TFT," AM-FPD '09 Digest of Technical Papers, Jul. 1, 2009, pp. 33-36.

Park, J. et al., "Amorphous Indium-Gallium-Zinc Oxide TFTs and Their Application for Large Size AMOLED," AM-FPD '08 Digest of Technical Papers, Jul. 2, 2008, pp. 275-278.

Park, J. et al., "Dry Etching of ZnO Films and Plasma-Induced Damage to Optical Properties," Journal of Vacuum Science & Technology B, Mar. 1, 2003, vol. 21, No. 2, pp. 800-803.

Park, J. et al., "Electronic Transport Properties of Amorphous Indium-Gallium-Zinc Oxide Semiconductor Upon Exposure to Water," Applied Physics Letters, 2008, vol. 92, pp. 072104-1-072104-3.

Park, J. et al., "High Performance Amorphous Oxide Thin Film Transistors with Self-Aligned Top-Gate Structure," IEDM 09: Technical Digest of International Electron Devices Meeting, Dec. 7, 2009, pp. 191-194.

Park, J. et al., "Improvements in the Device Characteristics of Amorphous Indium Gallium Zinc Oxide Thin-Film Transistors by Ar Plasma Treatment," Applied Physics Letters, Jun. 26, 2007, vol. 90, No. 26, pp. 262106-1-262106-3.

Park, S. et al., "Challenge to Future Displays: Transparent AM-OLED Driven by PEALD Grown ZnO TFT," IMID '07 Digest, 2007, pp. 1249-1252.

Park, Sang-Hee et al., "42.3: Transparent ZnO Thin Film Transistor for the Application of High Aperture Radio Bottom Emission AM-OLED Display," SID Digest '08: SID International Symposium Digest of Technical Papers, May 20, 2008, vol. 39, pp. 629-632.

Prins, M. et al., "A Ferroelectric Transparent Thin-Film Transistor," Applied Physics Letters, Jun. 17, 1996, vol. 68, No. 25, pp. 3650-3652.

Sakata, J. et al., "Development of 4.0-In. AMOLED Display With Driver Circuit Using Amorphous In—Ga—Zn-Oxide TFTs," IDW '09: Proceedings of the 16th International Display Workshops, 2009, pp. 689-692.

Son, K. et al., "42.4L: Late-News Paper: 4 Inch QVGA AMOLED Driven by the Threshold Voltage Controlled Amorphous GIZO ($Ga_2O_3$—$In_2O_3$—ZnO) TFT," SID Digest '08: SID International Symposium Digest of Technical Papers, May 20, 2008, vol. 39, pp. 633-636.

Takahashi, M. et al., "Theoretical Analysis of IGZO Transparent Amorphous Oxide Semiconductor," IDW '08: Proceedings of the 15th International Display Workshops, Dec. 3, 2008, pp. 1637-1640.

Tsuda, K. et al., "Ultra Low Power Consumption Technologies for Mobile TFT-LCDs," IDW '02: Proceedings of the 9th International Display Workshops, Dec. 4, 2002, pp. 295-298.

Ueno, K. et al., "Field-Effect Transistor on $SrTiO_3$ With Sputtered $Al_2O_3$ Gate Insulator," Applied Physics Letters, Sep. 1, 2003, vol. 83, No. 9, pp. 1755-1757.

Van de Walle, C., "Hydrogen as a Cause of Doping in Zinc Oxide," Physical Review Letters, Jul. 31, 2000, Vol, 85, No. 5, pp. 1012-1015.

Weste, N. et al., "1.5.4 Gate Layouts," Cmos Vlsi Design: a Circuits and Systems Perspective (Fourth Edition), Mar. 1, 2010, pp. 27-28. Eng.

* cited by examiner

CAAC-OS nc-OS

☐ Proportion of non-CAAC   ▤ Proportion of CAAC

As-sputtered

After heat treatment at 450 °C

SEMICONDUCTOR MEMORY DEVICE

BACKGROUND OF THE INVENTION

1. Field of the Invention

The present invention relates to an object, a method, or a manufacturing method. Alternatively, the present invention relates to a process, a machine, manufacture, or a composition (composition of matter). In particular, the present invention relates to, for example, a semiconductor, a semiconductor device, a display device, a light-emitting device, a lighting device, a power storage device, a memory device, or a processor. Alternatively, the present invention relates to a manufacturing method of a semiconductor, a semiconductor device, a display device, a light-emitting device, a lighting device, a power storage device, a memory device, or a processor. Alternatively, the present invention relates to a driving method of a semiconductor device, a display device, a light-emitting device, a lighting device, a power storage device, a memory device, or a processor.

Note that in this specification and the like, a semiconductor device refers to a general device that can function by utilizing semiconductor characteristics. A memory device, a display device, a light-emitting device, a lighting device, an electro-optical device, a semiconductor circuit, and an electronic device and the like include a semiconductor device in some cases.

2. Description of the Related Art

Transistors including channel formation regions containing semiconductor silicon (Si) (hereinafter referred to as Si transistors) are widely used for electronic devices such as an integrated circuits and an image display devices. An integrated circuit includes a cell where n-channel Si transistors and p-channel Si transistors are arranged and wired, such as an inverter circuits, a NAND circuit, or a flip-flop (also referred to as a logic cell or a standard cell in some cases) as a component (see Non-Patent Document 1).

Meanwhile, a transistor whose channel formation region contains an oxide semiconductor (OS) such as an In—Ga—Zn oxide (In—Ga—Zn—O) (hereinafter such a transistor is referred to as an OS transistor) is known. It is known that a transistor containing an oxide semiconductor has an extremely low off-state current because an oxide semiconductor has a wider bandgap than silicon. For example, Patent Document 1 describes a semiconductor device in which an OS transistor is used in a memory cell so that data can be held even after the stop of power supply.

In addition, in recent years, a demand for an integrated circuit in which semiconductor elements such as a miniaturized transistor are integrated with high density has risen with increased performance and reductions in the size and weight of an electronic device.

PRIOR ART DOCUMENTS

Patent Document

[Patent Document 1] Japanese Published Patent Application No. 2011-187950

Non-Patent Document

[Non-Patent Document 1] Neil H. E. Weste and David Money Harris, CMOS VLSI Design: A Circuits and Systems Perspective (4th Edition), Addison Wesley, p. 27, 2011.

SUMMARY OF THE INVENTION

An object of one embodiment of the present invention is at least one of the following: to provide a semiconductor device (cell) including a circuit that has a reduced area and in which a plurality of transistors are arranged and wired; to provide a semiconductor device (cell) including a circuit that that can have a higher operating speed and in which a plurality of transistors are arranged and wired; to provide a semiconductor device (cell) including a circuit that can have lower power consumption and in which a plurality of transistors are arranged and wired; to provide a semiconductor device (cell) including a circuit that can have a smaller power supply voltage variation and in which a plurality of transistors are arranged and wired; to provide a small semiconductor device in which a plurality of transistors are arranged and wired; to provide a semiconductor device that can have a higher processing speed and in which a plurality of transistors are arranged and wired; to provide a semiconductor device that can have lower power consumption and in which a plurality of transistors are arranged and wired; to provide a semiconductor device whose cost can be reduced and in which a plurality of transistors are arranged and wired; and to provide a novel semiconductor device.

Note that the description of these objects does not disturb the existence of other objects. Note that one embodiment of the present invention does not necessarily achieve all the objects. Note that other objects will be apparent from and can be derived from the description of the specification, the drawings, the claims, and the like.

(1) One embodiment of the present invention is a semiconductor device including a first transistor, a second transistor, a first conductor, and a second conductor. The first transistor and the second transistor are stacked. A first power supply voltage is supplied to the first conductor. A second power supply voltage is supplied to the second conductor. The first conductor includes a first region. The second conductor includes a second region. The first region and the second region overlap with each other with one or more layers of insulators therebetween and extend parallel to each other. A source electrode or a drain electrode of the first transistor is electrically connected to the first conductor. A source electrode or a drain electrode of the second transistor is electrically connected to the second conductor. The second transistor is an n-channel transistor. A channel formation region of the second transistor is formed using an oxide semiconductor. The first transistor is a p-channel transistor. A channel formation region of the first transistor is formed using silicon.

(2) Another embodiment of the present invention is the semiconductor device relating to the embodiment (1) that includes an input terminal and an output terminal. The widths of the first conductor and the second conductor are each larger than the width of the conductor connected to the input terminal and larger than the width of the conductor connected to the output terminal.

(3) Another embodiment of the present invention is the semiconductor device relating to any one of the embodiments (1) and (2) that includes a first insulator having a first opening, a second insulator having a second opening, a third conductor, and a fourth conductor. The source electrode or the drain electrode of the first transistor is directly connected to the first conductor through the third conductor in the first opening. The source electrode or the drain electrode of the second transistor is directly connected to the second conductor through the fourth conductor in the second opening.

(4) Another embodiment of the present invention is the semiconductor device relating to any one of the embodiments (1) to (3) in which a transistor is provided neither between the first conductor and the first transistor nor between the second conductor and the second transistor.

(5) Another embodiment of the present invention is the semiconductor device relating to any one of the embodiments (1) to (4) in which no conductor is provided between the first region and the second region.

(6) Another embodiment of the present invention is the semiconductor device relating to any one of the embodiments (1) to (5) in which the first conductor and the second conductor are formed of conductors in adjacent layers.

(7) Another embodiment of the present invention is the semiconductor device relating to any one of the embodiments (1) to (6) in which the channel formation region of the first transistor, the first conductor, the second conductor, and the channel formation region of the second transistor are stacked in this order.

(8) Another embodiment of the present invention is the semiconductor device relating to any one of the embodiments (1) to (6) in which the channel formation region of the first transistor, the first conductor, the channel formation region of the second transistor, and the second conductor are stacked in this order.

(9) Another embodiment of the present invention is the semiconductor device relating to any one of the embodiments (1) to (8) in which the direction in which the source electrode, the gate electrode, and the drain electrode of the first transistor are arranged is parallel or antiparallel to the direction in which the source electrode, the gate electrode, and the drain electrode of the second transistor are arranged, and the gate electrode of the first transistor is electrically connected to the gate electrode of the second transistor.

(10) Another embodiment of the present invention is the semiconductor device relating to any one of the embodiments (1) to (9) in which the direction of a current flow in the first transistor is parallel or antiparallel to the direction of a current flow in the second transistor, and the gate electrode of the first transistor is electrically connected to the gate electrode of the second transistor.

(11) Another embodiment of the present invention is the semiconductor device relating to any one of the embodiments (1) to (10) in which an oxide semiconductor forming the channel formation region of the second transistor includes a plurality of crystal parts whose c-axes are aligned, and a region where a diffraction pattern showing crystals whose c-axes are aligned is observed constitutes 90% or more of the oxide semiconductor in a certain range.

(12) Another embodiment of the present invention is a storage device including a memory cell array including the semiconductor device relating to any one of the embodiments (1) to (11).

(13) Another embodiment of the present invention is an RFID tag including an antenna and the semiconductor device relating to any one of the embodiments (1) to (11).

(14) Another embodiment of the present invention is an electronic device including a printed circuit board and the semiconductor device relating to any one of the embodiments (1) to (11).

A semiconductor device including a circuit that has a reduced area and in which transistors are arranged and wired can be provided. Alternatively, a semiconductor device including a circuit that can have a higher operating speed and in which transistors are arranged and wired can be provided. Alternatively, a semiconductor device including a circuit that can have lower power consumption and in which transistors are arranged and wired can be provided. Alternatively, a semiconductor device including a circuit that can have a smaller power supply voltage variation and in which transistors are arranged and wired can be provided. Alternatively, a novel semiconductor device can be provided. Note that the description of these effects does not disturb the existence of other effects. Note that one embodiment of the present invention does not necessarily have all these effects. Note that other effects will be apparent from and can be derived from the description of the specification, the drawings, the claims, and the like.

DETAILED DESCRIPTION OF THE INVENTION

Figure 1:
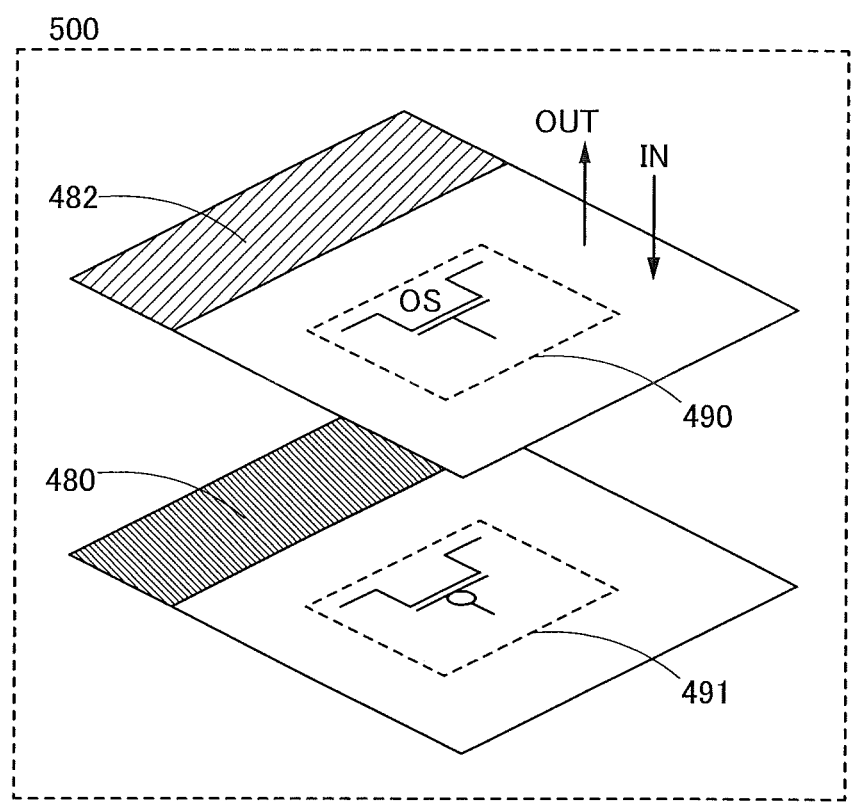
FIG. 1 is a schematic view illustrating a semiconductor device relating to one embodiment of the present invention.

Embodiments of the present invention will be described in detail with the reference to the drawings. However, the present invention is not limited to the description below, and it is easily understood by those skilled in the art that the modes and details can be modified in various ways. Furthermore, the present invention is not construed as being limited to description of the embodiments described below. Note that in describing structures of the present invention with reference to the drawings, common reference numerals are used for the same portions in different drawings. Note that the same hatched pattern is applied to similar portions, and the similar portions are not especially denoted by reference numerals in some cases.

Note that the size, the thickness of films (layers), or regions in drawings is sometimes exaggerated for simplicity.

In addition, a voltage refers to a potential difference between a given potential and a reference potential (e.g., a source potential or a ground potential (GND)) in many cases. Thus, a voltage can be referred to as a potential and vice versa.

Note that the ordinal numbers such as first and second are used for convenience and do not denote the order of steps or the stacking order of layers. Therefore, for example, description can be given even when first is replaced with second or third, as appropriate. In addition, the ordinal numbers in this specification and the like are not necessarily the same as those used to specify one embodiment of the present invention.

Note that an expression "semiconductor" includes the characteristics of an "insulator" in some cases when the conductivity is sufficiently low, for example. Furthermore, a "semiconductor" and an "insulator" cannot be strictly distinguished from each other in some cases because a border between the "semiconductor" and the "insulator" is not clear. Accordingly, a "semiconductor" described in this specification can be called an "insulator" in some cases. Similarly, an "insulator" described in this specification can be called a "semiconductor" in some cases.

Furthermore, an expression "semiconductor" includes the characteristics of a "conductor" in some cases when the conductivity is sufficiently high, for example. Furthermore, a "semiconductor" and a "conductor" cannot be strictly distinguished from each other in some cases because a border between the "semiconductor" and the "conductor" is not clear. Accordingly, a "semiconductor" described in this specification can be called a "conductor" in some cases. Similarly, a "conductor" described in this specification can be called a "semiconductor" in some cases.

Note that an impurity in a semiconductor refers to, for example, elements other than the main components of the semiconductor. For example, an element with a concentration of lower than 0.1 atomic % is an impurity. When an impurity is contained, the density of states (DOS) may be formed in a semiconductor, the carrier mobility may be decreased, or the crystallinity may be decreased, for example. In the case where the semiconductor is an oxide semiconductor, examples of an impurity that changes the characteristics of the semiconductor include Group 1 elements, Group 2 elements, Group 14 elements, Group 15 elements, and transition metals other than the main components; specifically, there are hydrogen (included in water), lithium, sodium, silicon, boron, phosphorus, carbon, nitrogen, and the like, for example. In the case of an oxide semiconductor, oxygen vacancies may be formed by entry of impurities such as hydrogen, for example. Furthermore, in the case where the semiconductor is silicon, examples of an impurity that changes the characteristics of the semiconductor include oxygen, Group 1 elements except hydrogen, Group 2 elements, Group 13 elements, and Group 15 elements.

Note that in the embodiments described below, for example, a single layer or a stack of an insulator containing one or more kinds of boron, carbon, nitrogen, oxygen, fluorine, magnesium, aluminum, silicon, phosphorus, chlorine, argon, gallium, germanium, yttrium, zirconium, lanthanum, neodymium, hafnium, and tantalum may be used as an insulator unless otherwise specified. Alternatively, a resin may be used for the insulator. For example, a resin containing polyimide, polyamide, acrylic, silicone, or the like may be used. The use of a resin does not need planarization treatment performed on the top surface of the insulator in some cases. By using a resin, a thick film can be formed in a short time; thus, the productivity can be increased. As the insulator, a single layer or a stack of an insulator containing aluminum oxide, silicon nitride oxide, silicon nitride, gallium oxide, yttrium oxide, zirconium oxide, lanthanum oxide, neodymium oxide, hafnium oxide, or tantalum oxide may preferably be used.

Note that in the following embodiments, unless otherwise specified, for example, a single layer or a stack of a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten may be used as a conductor. An alloy film or a compound film may be used, for example, and a conductor containing aluminum, a conductor containing copper and titanium, a conductor containing copper and manganese, a conductor containing indium, tin, and oxygen, a conductor containing titanium and nitrogen, or the like may be used.

Note that in this specification, the phrase "A has a region with a concentration B" includes, for example, the case where the concentration of the whole of a region of A in the depth direction is B, the case where the average concentration in a region of A in the depth direction is B, the case where the median value of a concentration in a region of A in the depth direction is B, the case where the maximum value of a concentration in a region of A in the depth direction is B, the case where the minimum value of a concentration in a region of A in the depth direction is B, the case where the convergence value of a concentration in a region of A in the depth direction is B, the case where a concentration in a region in which a probable value of A is obtained in measurement is B, and the like.

Note that in this specification, the phrase "A has a region with a size B, a length B, a thickness B, a width B, or a distance B" includes, for example, the case where the whole of a region of A has a size B, a length B, a thickness B, a width B, or a distance B, the case where the average value in a region of A is a size B, a length B, a thickness B, a width B, or a distance B, the case where the median value in a region of A is a size B, a length B, a thickness B, a width B, or a distance B, the case where the maximum value in a region of A is a size B, a length B, a thickness B, a width B, or a distance B, the case where the minimum value in a region of A is a size B, a length B, a thickness B, a width B, or a distance B, the case where the convergence value in a region of A is a size B, a length B, a thickness B, a width B, or a distance B, and the case where a region in which a probable value of A is obtained in measurement has a size B, a length B, a thickness B, a width B, a distance B, and the like".

Note that the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. Note that in one transistor, channel lengths in all regions are not necessarily the same. In other words, the channel length of one transistor is not fixed to one value in some cases. Therefore, in this specification, the channel length is any one of values, the maximum value, the minimum value, or the average value in a region where a channel is formed.

A channel width refers to, for example, the length of a portion where a source and a drain face each other in a region where a semiconductor (or a portion where a current flows in a semiconductor when a transistor is on) and a gate electrode overlap with each other, or a region where a channel is formed. Note that in one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on the transistor structure, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the top view.

Incidentally, in a transistor having a three-dimensional structure, an effective channel width is difficult to estimate by actual measurement in some cases. For example, to estimate an effective channel width from a design value, it is necessary to assume that the shape of a semiconductor is known. Therefore, in the case where the shape of a semiconductor is not known accurately, it is difficult to measure an effective channel width accurately.

Note that functions of a "source" and a "drain" of a transistor are sometimes replaced with each other when a transistor of opposite polarity is used or when the direction of a current flow is changed in circuit operation, for example. Therefore, the terms "source" and "drain" can be replaced with each other in this specification.

Note that in this specification, the term "parallel" indicates that the angle formed between two straight lines is greater than or equal to −10° and less than or equal to 10°, and accordingly includes the case where the angle is greater than or equal to −5° and less than or equal to 5°. In addition, the term "perpendicular" indicates that the angle formed between two straight lines is greater than or equal to 80° and less than or equal to 100°, and accordingly includes the case where the angle is greater than or equal to 85° and less than or equal to 95°.

Embodiment 1

In this embodiment, a semiconductor device related to one embodiment of the present invention will be described with reference to drawings.

A structural example of a semiconductor device where transistors are arranged and wired will be described with reference to FIG. 1.

FIG. 1 is a schematic diagram of a semiconductor device 500 where a transistor 490 and a transistor 491 are arranged and wired. The semiconductor device 500 includes the transistor 491, a conductor 480 serving as a wiring, the transistor 490, and a conductor 482 serving as a wiring. The semiconductor device 500 may include a transistor formed at the same time as the transistor 490. Channel formation regions of the transistor and the transistor 490 are formed using the same semiconductor material. The semiconductor device 500 may include a transistor formed at the same time as the transistor 491. Channel formation regions of the transistor and the transistor 491 are formed using the same semiconductor material. The transistor 490 and the transistor 491 are stacked. The conductor 480 has a function of supplying a high power supply voltage (VDD) (hereinafter also referred to as a high power supply wiring). The conductor 482 has a function of supplying a low power supply voltage (VSS) (hereinafter also referred to as a low power supply wiring). The conductor 482 and the conductor 480 are stacked.

As the transistor 491, a high-switching-speed p-channel transistor can be used, for example. The switching speed of the transistor 491 is, for example, less than 10 ns, preferably less than 1 ns, more preferably less than 0.1 ns. For example, a p-channel Si transistor can be used as the transistor 491. As the transistor 490, a high-switching-speed n-channel transistor can be used, for example. The switching speed of the transistor 490 is, for example, less than 10 ns, preferably less than 1 ns, more preferably less than 0.1 ns. For example, a transistor including an oxide semiconductor (preferably an oxide containing In, Ga, and Zn) in a channel formation region can be used as the transistor 490 (hereinafter also referred to as a transistor including an oxide semiconductor).

Note that the switching speed of a transistor refers to a speed at which one transistor alone is turned on. This can be regarded as a speed corresponding to time taken for charge accumulated in the gate capacitance that corresponds to an increase in the drain current of the transistor in response to change of the gate voltage. Alternatively, the switching speed of a transistor may refer to a speed corresponding to the maximum frequency (cut-off frequency) at which a current gain is more than 1 when the transistor is used as an amplifier.

The semiconductor device 500 is a semiconductor device that can function as a circuit by arranging and wiring the transistor 491 and/or a transistor formed at the same time as the transistor 491 and the transistor 490 and/or a transistor formed at the same time as the transistor 490. The semiconductor device 500 also includes power supply wirings for supplying power to the transistors. The semiconductor device 500 may be a unit serving as a component of various electronic circuits. Such a unit is called a standard cell, a logic cell, or simply a cell.

The transistors and the power supply wirings included in the semiconductor device 500 are arranged closely. Furthermore, the power supply wirings are preferably arranged regularly at the end portion of a cell area, in which case an electronic circuit can be downsized.

The semiconductor device 500 (cell) includes an inverter circuit, a NAND circuit, an AND circuit, a NOR circuit, an OR circuit, a buffer, a level shifter, an XOR circuit, an XNOR circuit, an AND-NOR circuit, an OR-NAND circuit, an AND-OR-INV circuit, an OR-AND-INV circuit, an analog switch, a flip-flop, a settable flip-flop, a resettable flip-flop, a settable and resettable flip-flop, an adder, a half-adder, a multiplexer, a demultiplexer, a register, a scan register, a retention register, an isolator, a decoder, or the like.

In particular, when a p-channel transistor and an n-channel transistor are arranged and wired, a complementary metal oxide semiconductor (CMOS: Complementary Metal Oxide Semiconductor) circuit can be formed. With a CMOS circuit, power consumption of an electronic circuit can be reduced.

Examples of electronic circuits using the semiconductor device 500 (cell) include a CPU, a GPU (Graphics Processing Unit), a DSP (Digital Signal Processor), a MCU (Microcontroller Unit), an RF-ID (Radio Frequency Identification), a custom LSI, and the like. In these electronic circuits, a plurality of cells are arranged in a plurality of rows and input/output terminals of the cells are connected by wirings so that the electronic circuits can function.

A low power supply wiring (conductor 482) is connected to a source electrode (or a source region) of the transistor 490. Alternatively, the source electrode (or the source region) of the transistor 490 is connected to the low power supply wiring (conductor 482) through the transistor formed at the same time as the transistor 490. A high power supply wiring (conductor 480) is connected to a source electrode (or a source region) of the transistor 491. Alternatively, the source electrode (or the source region) of the transistor 491 is connected to the high power supply wiring (conductor 480) through the transistor formed at the same time as the transistor 491. The low power supply wiring (conductor 482) and the high power supply wiring (conductor 480) are arranged substantially parallel to each other and overlap with each other. An output signal OUT is output from one or more of a drain electrode (or a drain region) of the transistor 490, a drain electrode (or a drain region) of the transistor formed at the same time as the transistor 490, a drain electrode (or a drain region) of the transistor 491, and a drain electrode (or a drain region) of the transistor formed at the same time as the transistor 491. An input signal IN is input to one or more of a gate electrode of the transistor 490, a gate electrode of the transistor formed at the same time as the transistor 490, a gate electrode of the transistor 491, and a gate electrode of the transistor foiined at the same time as the transistor 491.

The low power supply wiring (conductor 482) and the high power supply wiring (conductor 480) are arranged substantially parallel to each other so as to overlap with each other, whereby the wirings have large parasitic capacitance (also referred to as wiring capacitance). Consequently, the use of the wirings as power supply wirings can reduce a voltage variation due to power source noise, so that a circuit that is resistant to power source noise and capable of reducing a power supply voltage variation can be obtained. To reduce a power supply voltage variation, a capacitor may be intentionally provided for a power supply wiring in a semiconductor device using the semiconductor device 500 (cell). When the low power supply wiring (conductor 482) and the high power supply wiring (conductor 480) have large wiring capacitance, such a capacitor can be small. Therefore, the semiconductor device can be downsized. Furthermore, when the low power supply wiring (conductor 482) and the high power supply wiring (conductor 480) are arranged so as to overlap with each other, the area occupied by the wirings can be reduced, and the area of the semiconductor device 500 (cell) can be reduced.

Conductors for wirings adjacent to each other in the vertical direction are preferably used for the low power supply wiring (conductor 482) and the high power supply wiring (conductor 480). The use of conductors for wirings adjacent to each other in the vertical direction reduces the distance between the wirings, so that the wirings have large wiring capacitance. As a result, a circuit that is resistant to power source noise and capable of reducing a power supply voltage variation can be obtained. Furthermore, a semiconductor device to which the semiconductor device 500 (cell) is applied can be downsized.

Note that "a conductor A for a wiring and a conductor B for a wiring are adjacent to each other in the vertical direction" means that the conductor A for a wiring is a conductor for a wiring in an i-th layer, and the conductor B for a wiring is a conductor for a wiring in an (i+1)-th layer (i is an integer of 1 or more and (n−1) or less) in the case where a semiconductor device includes conductors for wirings in n layers provided sequentially from the substrate side.

Alternatively, conductors in adjacent layers are preferably used for the low power supply wiring (conductor 482) and the high power supply wiring (conductor 480). Alternatively, it is preferred that a conductor not be provided to overlap with the low power supply wiring (conductor 482) and the high power supply wiring (conductor 480) between the wirings in the semiconductor device 500 (cell).

The transistor 490 and the transistor 491 are arranged so as to overlap with each other. As a result, the area of the semiconductor device 500 (cell) can be reduced.

Note that "the transistor 490 and the transistor 491 overlap with each other" means that at least part of the gate electrode, the drain electrode (or the drain region), and the source electrode (or the source electrode) of the transistor 490 overlaps with part of the gate electrode, the drain electrode (or the drain region), and the source electrode (or the source electrode) of the transistor 491, that a region including the gate electrode, the drain electrode (or the drain region), and the source electrode (or the source electrode) of the transistor 490 at least partly overlaps with a region including the gate electrode, the drain electrode (or the drain region), and the source electrode (or the source electrode) of the transistor 491, or that a region including a component of the transistor 490 at least partly overlaps with a region including a component of the transistor 491.

The transistor 490 and the transistor 491 are arranged so as to overlap with each other, whereby the direction in which a current flows in the transistor 490 is substantially parallel or antiparallel to the direction in which a current flows in the transistor 491. Alternatively, the direction in which the source electrode, the gate electrode, and the drain electrode of the transistor 490 are arranged is substantially parallel to the direction in which the source electrode, the gate electrode, and the drain electrode of the transistor 491 are arranged. Consequently, when the gate electrode of the transistor 490 is connected to the gate electrode of the transistor 491, the transistor 490, the transistor 491, and a connection portion of the gate electrodes can be provided in a small region, which can reduce the area of the semiconductor device 500 (cell).

Moreover, when the transistor 491 or a transistor that is the same kind as the transistor 491 and the transistor 490 or a transistor that is the same kind as the transistor 490 are stacked, the area can be reduced compared with the case where stacking is not performed, decreasing the length of a wiring for connecting the transistors. Consequently, parasitic capacitance due to a signal wiring can be reduced. Thus, the operating speed of the semiconductor device 500 (cell) can be increased.

The transistor 490 is located above the transistor 491. The conductor 482 is located above the conductor 480. The conductor 482 is located above the transistor 491.

Note that "a portion A is above a portion B" means that the portion A is located apart from the portion B or that the portion A is formed after formation of the portion B. The portion includes a region, a conductor, an insulator, a transistor, an electrode, or the like. Particularly in the case where a semiconductor device includes conductors for wirings in n layers sequentially from the substrate side, "the portion A is located below a conductor C" means that the portion A is located between a conductor for a wiring in the i-th layer and a conductor for a wiring in the (i+1)-th layer and the conductor C uses a conductor for a wiring in any of the layers from the (i+1)-th layer to the n-th layer. "The portion A is located above the conductor C" means that the portion A is located between a conductor for a wiring in the i-th layer and a conductor for a wiring in the (i+1)-th layer and the conductor C uses a conductor for a wiring in any of the layers from the first layer to the i-th layer.

The transistors and the power supply wirings in the semiconductor device 500 are closely arranged; thus, an electronic circuit can be small. A region (also called a cell area) occupied by the semiconductor device 500 (cell) may be a rectangle with a height of Hcell and a width of Wcell. Incidentally, as wirings for connecting the plurality of cells, at least a wiring (conductor) extending in the height direction and a wiring (conductor) extending in the width direction that are substantially perpendicular to each other are preferably used. When the pitch of wirings extending in the height direction is Px and the pitch of wirings extending in the width direction is Py, the cell may have a cell area with a height Hcell that is an integral multiple of Py and a width Wcell that is an integral multiple of Px. In that case, the cells can be connected efficiently.

Figure 39:
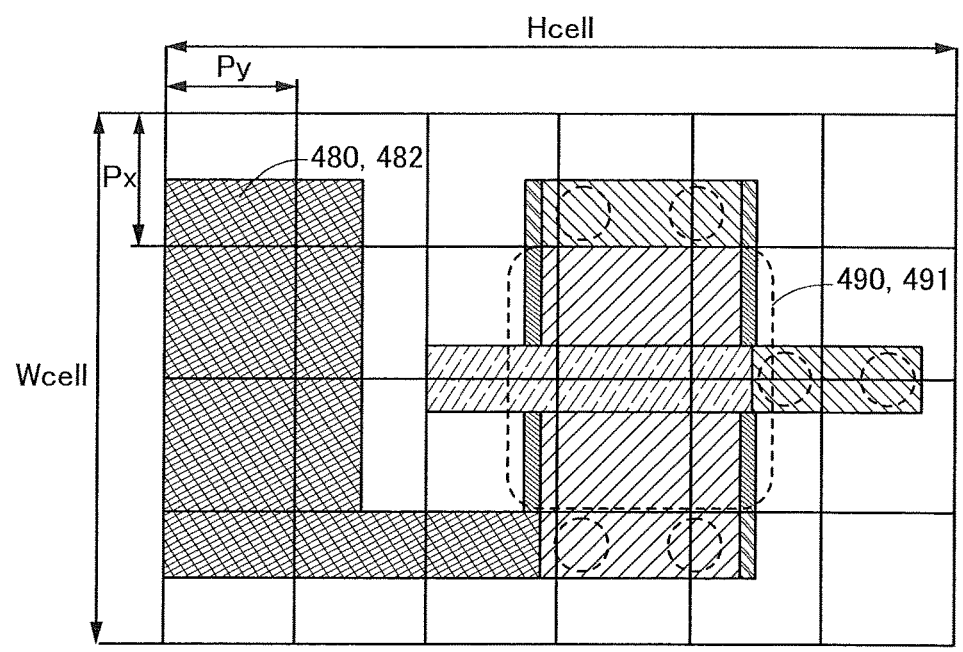
FIG. 39 is a schematic view illustrating a semiconductor device relating to one embodiment of the present invention.

FIG. 39 is an example of a top view of an inverter circuit cell. Detailed explanation of the top view will be described later, and the cell area will be described here. Note that a portion such as an insulator is omitted in FIG. 39 for easy understanding. The cell illustrated in FIG. 39 includes the transistor 490, the transistor 491, the conductor 480, and the conductor 482. The transistor 490 overlaps with the transistor 491. The conductor 480 overlaps with the conductor 482. The height and the width of the cell are 6*Py and 4*Px, respectively.

The cell area of the semiconductor device 500 (cell) can be small. For example, the height of an inverter circuit cell can be preferably WW+WT+5*Py or less, more preferably WW+WT+4*Py or less. Here, WW is the width of a power supply line, and WT is the maximum channel width of the channel width of a plurality of transistors in the semiconductor device 500 (cell). Furthermore, the width of the cell can be preferably 5*Px or less, more preferably 4*Px or less. Furthermore, in the case of a small inverter, the height of the cell can be 6*Py or less. Furthermore, for example, in the case of a 2-input NAND circuit, the height of the cell can be preferably WW+WT+7*Py or less, more preferably WW+WT+5*Py or less, and the width of the cell can be preferably 5*Px or less, more preferably 4*Px or less.

Moreover, the heights of the plurality of cells are preferably the same. In that case, the height of the cells is set to the height of a row and the plurality of cells are arranged in a plurality of rows, whereby they can be arranged and wired efficiently.

In the case where the source electrode or the drain electrode of the transistor 490 is electrically connected to the conductor (482) serving as a power supply wiring in order that the transistors and the power supply wirings in the semiconductor device 500 (cell) are closely arranged, the source electrode or the drain electrode of the transistor 490 is preferably directly connected to the conductor through a conductor (also referred to as a via) provided in an opening formed in an insulator. Alternatively, the source electrode or the drain electrode of the transistor 490 is preferably connected to the conductor through a via and a conductor between vias. In the case where the source electrode or the drain electrode of the transistor 491 is electrically connected to the conductor (480) serving as a power supply wiring, the source electrode or the drain electrode of the transistor 491 is preferably directly connected to the conductor through a conductor provided in an opening formed in an insulator. Alternatively, the source electrode or the drain electrode of the transistor 491 is preferably connected to the conductor through a via and a conductor between vias.

To closely arrange the transistors and the power supply wirings in the semiconductor device 500 (cell), no transistor is preferably provided between the transistor 490 and the conductor (482) serving as a power supply wiring and between the transistor 491 and the conductor (480) serving as a power supply wiring in the semiconductor device 500 (cell).

To closely arrange the transistors and the power supply wirings in the semiconductor device 500 (cell) and efficiently arrange the plurality of cells, the power supply wirings are preferably arranged regularly in an end portion of the cell area. Particularly in the semiconductor device (cell) of one embodiment of the present invention, the power supply wirings may be arranged only in an end portion of one side of the cell area. The cell area may be small compared with the case where the power supply wirings are arranged in end portions of both sides of the cell area.

Structural examples of semiconductor devices in which transistors are arranged and wired will be described with reference to FIG. 31. A schematic view of the semiconductor device in FIG. 31 schematically illustrates the positional relation of the transistor 491, the high power supply wiring (conductor 480), the transistor 490, and the low power supply wiring (conductor 482) in the semiconductor device 500 (cell) in FIG. 1.

Figure 31A:
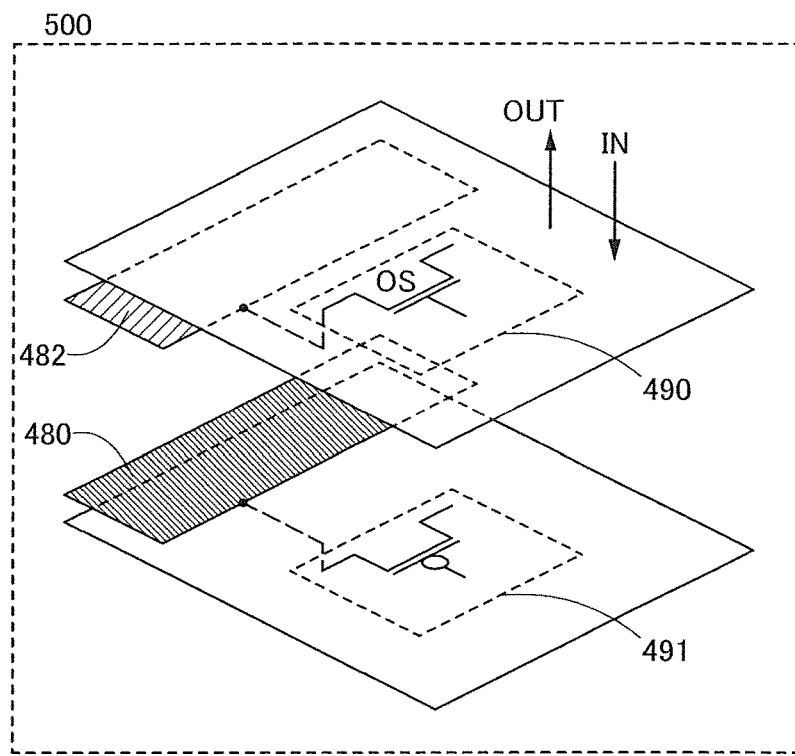
FIGS. 31A-31B are schematic views illustrating a semiconductor device relating to one embodiment of the present invention.

In the semiconductor device 500 (cell) in FIG. 31A, the transistor 491, the high power supply wiring (conductor 480), the low power supply wiring (conductor 482), and the transistor 490 are stacked in this order. In other words, the high power supply wiring (conductor 480) is positioned above the transistor 491, the low power supply wiring (conductor 482) is positioned above and overlaps with the high power supply wiring (conductor 480), and the transistor 490 is positioned above the low power supply wiring (conductor 482).

With such a structure, the low power supply wiring (conductor 482) and the high power supply wiring (conductor 480) are located close to each other in the vertical direction, leading to large wiring capacitance. Thus, a circuit that is resistant to power source noise and capable of reducing a power supply voltage variation can be obtained. Furthermore, a semiconductor device to which the semiconductor device 500 (cell) is applied can be downsized.

Figure 31B:
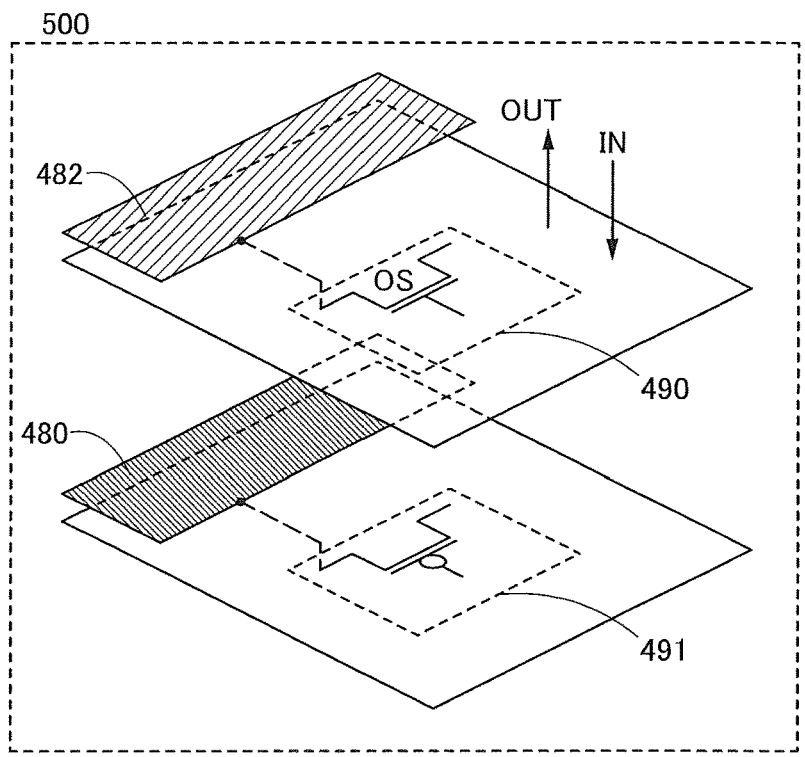

In the semiconductor device 500 (cell) in FIG. 31B, the transistor 491, the high power supply wiring (conductor 480), the transistor 490, and the low power supply wiring (conductor 482) are stacked in this order. In other words, the high power supply wiring (conductor 480) is positioned above the transistor 491, the transistor 490 is positioned above the high power supply wiring (conductor 480), and the low power supply wiring (conductor 482) is positioned above the transistor 490.

The semiconductor device 500 (cell) may have a structure where the source electrode (or the source region) or the drain electrode (or the drain region) of the transistor 490 is connected to only the conductor above the transistor 490. In that case, the conductor is used as a connection wiring between the transistors in the semiconductor device 500 (cell). Thus, the conductor is difficult to use as a connection wiring among the plurality of semiconductor devices 500 (cells). This is because wiring positions are irregular in connection among the plurality of semiconductor devices 500 (cells), and thus when unusable regions are scattered, the number of wirings that need to be diverted increases. Even in such a case, the conductor can be used as the power supply wiring without almost no increase in the area. This is because the power supply wirings are regularly arranged in an end portion of the semiconductor device 500 (cell) region. In such a case, the power supply wiring (conductor 482) and the connection wiring among the transistors in the semiconductor device 500 (cell) that are stacked can be formed using the conductor in the same layer, so that the manufacturing cost can be reduced.

The more specific device structure of the semiconductor device 500 (cell) in FIG. 1 will be described with reference to FIG. 2 to FIG. 4 and FIG. 19. A semiconductor device 501 (cell) illustrated in FIG. 2 corresponds to the semiconductor device 500 (cell) illustrated in FIG. 1, and the transistor 490 and the transistor 491 are arranged and wired in the semiconductor device (cell).

Figure 2:
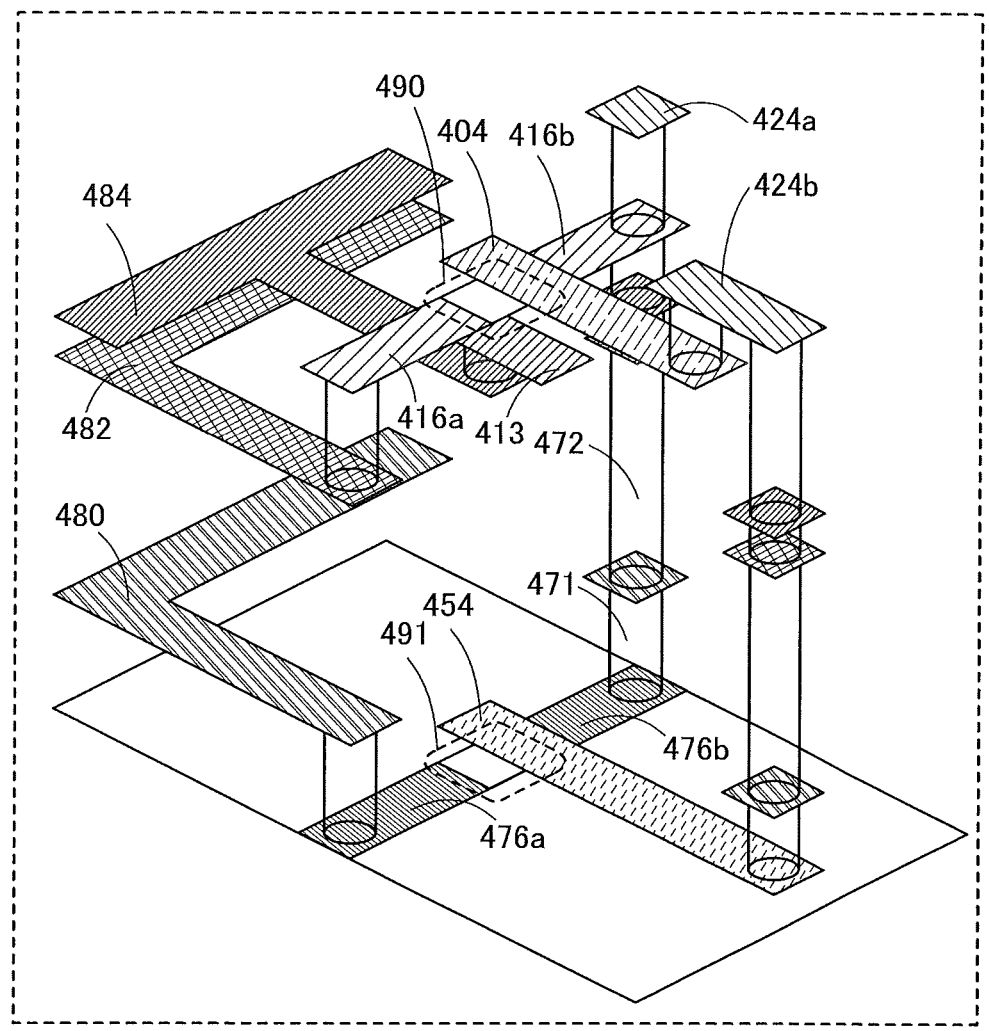
FIG. 2 is a schematic view illustrating a semiconductor device relating to one embodiment of the present invention.

FIG. 2 is a schematic view illustrating an example of the structure of the semiconductor device 501 (cell). Note that in FIG. 2 and FIG. 3, a portion such as an insulator is omitted and the same hatch pattern is used for conductors or the like formed in the same layer for easy understanding.

Figure 3A:
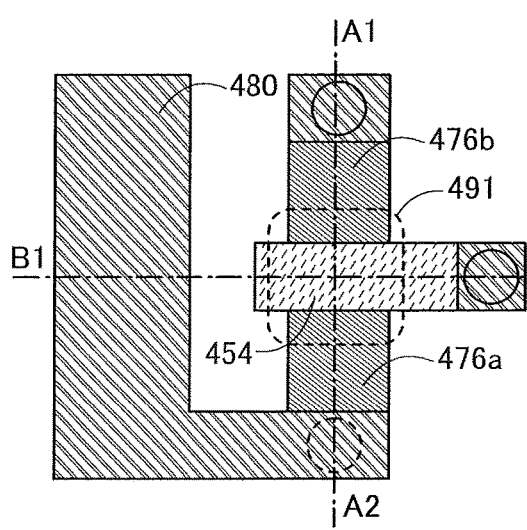
FIGS. 3A-3B are top views illustrating a semiconductor device relating to one embodiment of the present invention.
Figure 3B:
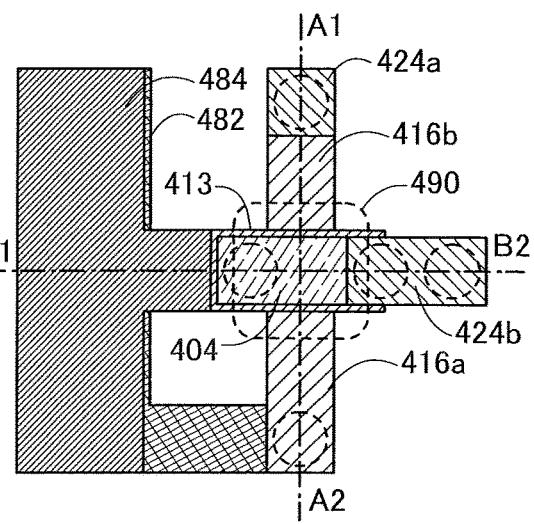

FIG. 3 is a top view illustrating a structural example of the semiconductor device 501 (cell). FIG. 3(A) is the top view of a region of the semiconductor device 501 (cell) that includes the transistor 491 and the conductor 480. FIG. 3(B) is the top view of a region of the semiconductor device 501 (cell) that includes the transistor 490, the conductor 482, and the conductor 484.

Figure 4:
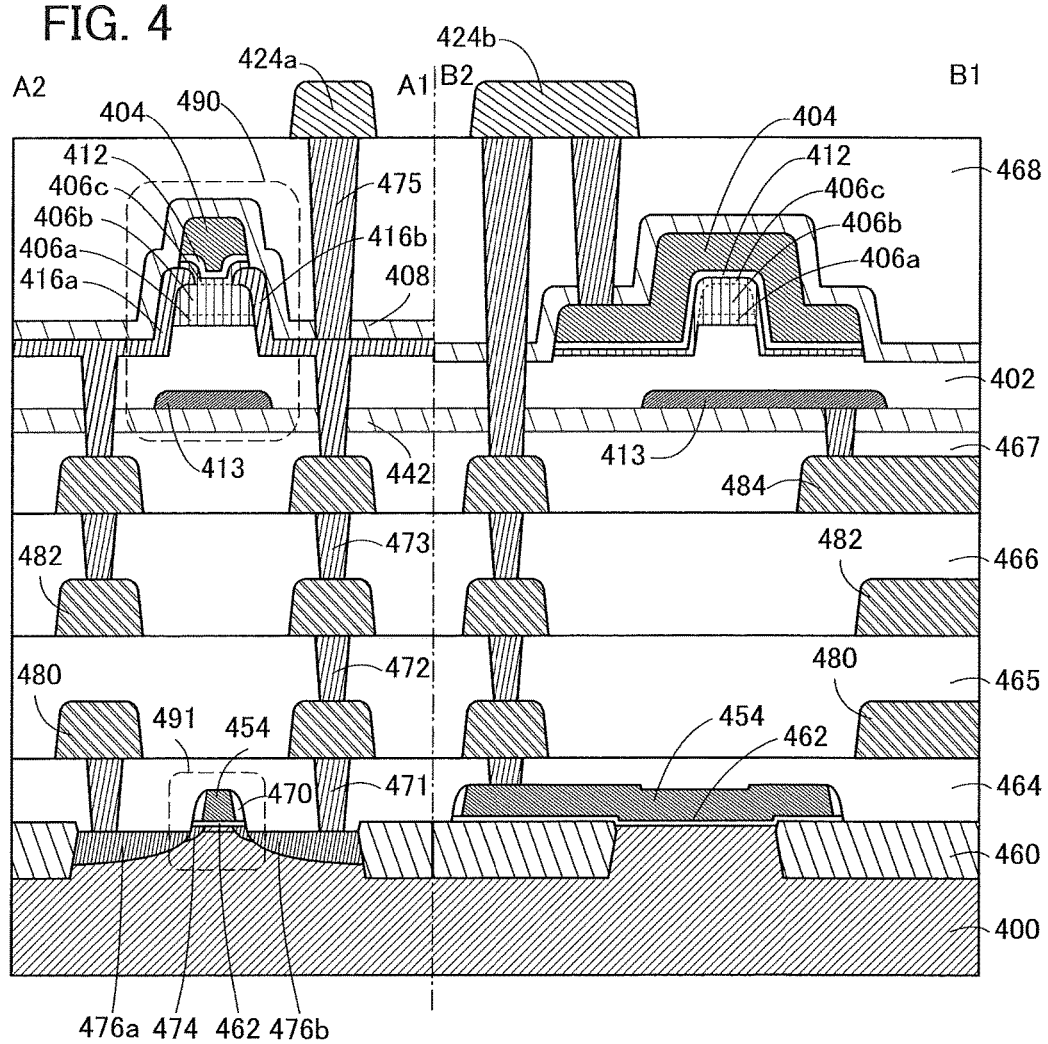
FIG. 4 is a cross-sectional view illustrating a semiconductor device relating to one embodiment of the present invention.

FIG. 4 is a cross-sectional view illustrating an example of the structure of the semiconductor device 501 (cell). A cross-sectional view taken along dashed dotted line A1-A2 in FIGS. 3(A) and 3(B) is illustrated on the left side of FIG. 4, and a cross-sectional view taken along dashed dotted line B1-B2 in FIGS. 3(A) and 3(B) is illustrated on the right side of FIG. 4.

Figure 19:
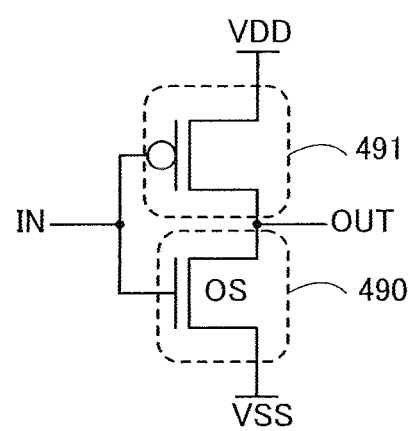
FIG. 19 is a circuit diagram illustrating a semiconductor device relating to one embodiment of the present invention.

The semiconductor device 501 (cell) includes the transistor 491 and the transistor 490 which constitute a CMOS inverter circuit illustrated in FIG. 19. In the CMOS inverter circuit, an output signal OUT is an inversion signal of the input signal IN. A p-channel transistor with a high switching speed can be used as the transistor 491, for example. In this embodiment, description is given assuming that a p-channel Si transistor is used as the transistor 491. An n-channel transistor with a high switching speed can be used as the transistor 490, for example. In this embodiment, description is given assuming that a transistor including an oxide semiconductor (preferably an oxide containing In, Ga, and Zn) is used as the transistor 490.

The semiconductor device 501 (cell) includes the transistor 491, the conductor 480, the transistor 490, the conductor 482, and the conductors 424a and 424b. The transistor 490 and the transistor 491 are stacked. The conductor 482 and the conductor 480 are stacked. The transistor 491 includes a region 476a, a region 476b, and a conductor 454. The transistor 490 includes a conductor 416a, a conductor 416b, and a conductor 404.

The semiconductor device 501 (cell) includes the conductor 484. The transistor 490 includes a conductor 413.

The conductor 482 has a function as a wiring (low power supply wiring) that supplies the low power supply voltage (VSS). The conductor 480 has a function as a wiring (high power supply wiring) that supplies the high power supply voltage (VDD). The regions 476a and 476b have functions as the source and drain electrodes (or the source and drain regions) of the transistor 491. The conductor 454 has a function as the gate electrode of the transistor 491. The conductors 416a and 416b have functions as the source and drain electrodes (or the source and drain regions) of the transistor 490. The conductor 404 has a function as the gate electrode of the transistor 490.

The conductor 413 has a function as the gate electrode of the transistor 490. The conductor 484 has a function as a wiring that supplies a voltage to the gate electrode of the transistor 490.

Note that the conductor 413 and the conductor 404 have functions as gate electrodes of the transistor 490, and may be supplied with different potentials. For example, by applying a negative or positive gate voltage to the conductor 413, the threshold voltage of the transistor 490 may be adjusted.

The high power supply wiring (conductor 480) is electrically connected to the source region (region 476a) of the transistor 491. The low power supply wiring (conductor 482) is electrically connected to the source electrode (conductor 416a) of the transistor 490. The high power supply wiring (conductor 480) and the low power supply wiring (conductor 482) are arranged substantially parallel to each other so as to overlap with each other. The gate electrode (conductor 404) of the transistor 490 is electrically connected to the gate electrode (conductor 454) of the transistor 491. The drain electrode (conductor 416b) of the transistor 490 is electrically connected to the drain region (region 476b) of the transistor 491. The output signal OUT is output to the outside from the conductor 424a that is located above the conductor 416b and connected to the drain electrode (conductor 416b) of the transistor 490 and the drain region (region 476b) of the transistor 491. The input signal IN is input from the outside to the conductor 424b that is located above the conductor 404 and connected to the gate electrode (conductor 404) of the transistor 490 and the gate electrode (conductor 454) of the transistor 491.

The gate electrode (conductor 413) of the transistor 490 is electrically connected to a wiring (conductor 484) that supplies a gate voltage. The wiring (conductor 484) that supplies a gate voltage and the low power supply wiring (conductor 482) are arranged substantially parallel to each other so as to overlap with each other.

The low power supply wiring (conductor 482) and the high power supply wiring (conductor 480) are arranged substantially parallel to each other so as to overlap with each other, whereby the wirings have large parasitic capacitance (also referred to as wiring capacitance). Thus, the use of the wirings as power supply wirings can reduce a voltage variation due to power source noise, so that a circuit that is resistant to power source noise and capable of reducing a power supply voltage variation can be obtained. Furthermore, to reduce a power supply voltage variation, a capacitor is intentionally provided for a power supply wiring in a semiconductor device using the semiconductor device 501 (cell). When the low power supply wiring (conductor 482) and the high power supply wiring (conductor 480) have large parasitic capacitance, such a capacitor can be small. Therefore, the semiconductor device to which the semiconductor device 501 (cell) is applied can be downsized. Furthermore, when the low power supply wiring (conductor 482) and the high power supply wiring (conductor 480) are arranged so as to overlap with each other, the area occupied by the wirings can be reduced, reducing the area of the semiconductor device to which the semiconductor device 501 (cell) is applied.

For the high power supply wiring (conductor 480) and the low power supply wiring (conductor 482), conductors for wirings adjacent to each other in the vertical direction can be used. The use of conductors for wirings adjacent to each other in the vertical direction reduces the distance between the wirings, so that the wirings have large wiring capacitance. As a result, a circuit that is resistant to power source noise and capable of reducing a power supply voltage variation can be obtained. Furthermore, a semiconductor device to which the semiconductor device 501 (cell) is applied can be downsized.

Alternatively, conductors in adjacent layers are preferably used for the low power supply wiring (conductor 482) and the high power supply wiring (conductor 480). Alternatively, no conductor is preferably provided between the low power supply wiring (conductor 482) and the high power supply wiring (conductor 480).

The transistor 490 and the transistor 491 are arranged so as to overlap with each other. As a result, the area occupied by the semiconductor device 501 (cell) can be reduced.

The transistor 490 and the transistor 491 are arranged so as to overlap with each other, whereby the direction in which a current flows in the transistor 490 is substantially parallel or antiparallel to the direction in which a current flows in the transistor 491. Alternatively, the direction in which the source electrode, the gate electrode, and the drain electrode of the transistor 490 are arranged is substantially parallel to the direction in which the source electrode, the gate electrode, and the drain electrode of the transistor 491 are arranged. Thus, the drain electrode of the transistor 490 and the drain electrode of the transistor 491 can be arranged in close proximity to each other, and the gate electrode of the transistor 490 and the gate electrode of the transistor 491 can be arranged in close proximity to each other. With such arrangement, in the case where the drain electrode of the transistor 490 and the drain electrode of the transistor 491 are connected and the gate electrode of the transistor 490 and the gate electrode of the transistor 491 are connected, the area of connection regions can be small and the area of the semiconductor device 501 (cell) can be reduced.

The direction in which a current flows in the transistor 490 (or the direction in which the source electrode, the gate electrode, and the drain electrode of the transistor 490 are arranged) is substantially parallel to the extending direction of the low power supply wiring (conductor 482). This case is preferred because the source electrode of the transistor 490 and the low power supply wiring (conductor 482) can be connected using a short wiring even if the source electrode and the drain electrode of the transistor 490 are interchanged. The direction in which a current flows in the transistor 491 (or the direction in which the source electrode, the gate electrode, and the drain electrode of the transistor 491 are arranged) is substantially parallel to the extending direction of the high power supply wiring (conductor 480). This case is preferred because the source electrode of the transistor 490 positioned on either side of the gate electrode and the high power supply wiring (conductor 480) can be connected using a short wiring.

Note that the direction in which a current flows in the transistor 490 (or the direction in which the source electrode, the gate electrode, and the drain electrode of the transistor 490 are arranged) may be substantially perpendicular to the extending direction of the low power supply wiring (conductor 482). The case where the source electrode of the transistor 490 is connected to the low power supply wiring (conductor 482 is preferred because the source electrode can be positioned so as to overlap with the low power supply wiring, leading to a reduction in the area. The direction in which a current flows in the transistor 491 (or the direction in which the source electrode, the gate electrode, and the drain electrode of the transistor 491 are arranged) may be substantially perpendicular to the extending direction of the high power supply wiring (conductor 480). The case where the source electrode of the transistor 491 is connected to the high power supply wiring (conductor 480) is preferred because the source electrode can be positioned so as to overlap with the high power supply wiring, leading to a reduction in the area.

Note that in the case where cells adjacent to or close to each other are connected to input/output terminals, an output terminal of the output signal OUT may directly connect the drain electrode (conductor 416b) of the transistor 490 or the drain region (region 476b) of the transistor 491 to input terminals of the cells adjacent to or close to each other, not through the conductor 424a. In addition, an input terminal of the input signal IN may directly connect the gate electrode (conductor 404) of the transistor 490 or the gate electrode (conductor 454) of the transistor 491 to output terminals of the cells adjacent to or close to each other, not through the conductor 424b.

In the semiconductor device 501 (cell) in FIG. 2, the transistor 491, the high power supply wiring (conductor 480), the low power supply wiring (conductor 482), the conductor 484, and the transistor 490 are stacked in this order. In other words, the high power supply wiring (conductor 480) is positioned above the transistor 491, the low power supply wiring (conductor 482) is positioned above and overlaps with the high power supply wiring (conductor 480), the conductor 484 is positioned above and overlaps with the low power supply wiring (conductor 482), and the transistor 490 is positioned above the conductor 484.

The source electrode (or the source region) of the transistor 491 is connected to the high power supply wiring (conductor 480); thus, the connection is easy compared with the case where the source electrode (or the source region) of the transistor 491 is connected to the low power supply wiring (conductor 482) positioned above the high power supply wiring (conductor 480), which is preferred. The source electrode (or the source region) of the transistor 490 is connected to the low power supply wiring (conductor 482); thus, the connection is easy compared with the case where the source electrode (or the source region) of the transistor 490 is connected to the high power supply wiring (conductor 480) positioned below the low power supply wiring (conductor 482), which is preferred.

Furthermore, in the semiconductor device 501 (cell), the wiring widths of the high power supply wiring (conductor 480) and the low power supply wiring (conductor 482) are each preferably larger than the wiring width of the gate electrode (conductor 454) of the transistor 491, the gate electrode (conductor 404) of the transistor 490, or a signal wiring that transmits input/output signals. Alternatively, the wiring widths of the high power supply wiring (conductor 480) and the low power supply wiring (conductor 482) are each preferably larger than the width of the wiring (conductor) connected to the input terminal and the width of the wiring (conductor) connected to the output terminal. This is because the power supply wiring supplies a larger amount of current than the signal wiring in many cases and preferably has lower wiring resistance than the signal wiring.

Moreover, in the semiconductor device 501 (cell), the width of a region where the high power supply wiring (conductor 480) and the low power supply wiring (conductor 482) overlap with each other is preferably larger than the wiring width of the gate electrode (conductor 454) of the transistor 491, the gate electrode (conductor 404) of the transistor 490, or a signal wiring that transmits input/output signals. Alternatively, the width of a region where the high power supply wiring (conductor 480) and the low power supply wiring (conductor 482) overlap with each other is preferably larger than the width of the wiring (conductor) connected to the input terminal and the width of the wiring (conductor) connected to the output terminal.

More detailed description will be given with reference to a cross-sectional view of the semiconductor device in FIG. 4.

The semiconductor device 501 (cell) illustrated in FIG. 4 includes a transistor 491, an insulator 442 over the transistor 491, and the transistor 490 over the insulator 442. Note that the insulator 442 preferably has a function of blocking oxygen and hydrogen.

The transistor 491 includes an insulator 462 over a semiconductor substrate 400, the conductor 454 on the insulator 462, an insulator 470 in contact with a side surface of the conductor 454, regions 476a and 476b of the semiconductor substrate 400 which do not overlap with the conductor 454 and the insulator 470, and a region 474 of the semiconductor substrate 400 which overlaps with the insulator 470.

For the semiconductor substrate 400, a single-material semiconductor of silicon, germanium, or the like or a compound semiconductor of silicon carbide, silicon germanium, gallium arsenide, gallium nitride, indium phosphide, zinc oxide, gallium oxide, or the like may be used, for example. Note that for the semiconductor substrate 400, an amorphous semiconductor or a crystalline semiconductor may be used, and a single crystal semiconductor, a polycrystalline semiconductor, a microcrystalline semiconductor, and the like are given as crystalline semiconductors.

The insulator 462 has a function as a gate insulator of the transistor 491. Furthermore, the conductor 454 has a function as a gate electrode of the transistor 491. Furthermore, the insulator 470 has a function as a sidewall insulator (also referred to as a sidewall) of the conductor 454. Furthermore, the regions 476a and 476b have functions as a source region or a drain region of the transistor 491. Furthermore, the region 474 has a function as a LDD (lightly doped drain) region of the transistor 491.

Note that the region 474 can be formed by adding an impurity using the conductor 454 as a mask. After that, the insulator 470 is fruited and an impurity is added using the conductor 454 and the insulator 470 as masks, so that the regions 476a and 476b can be formed. Thus, when the region 474 and the regions 476a and 476b are formed by adding the same kind of impurities, the region 474 has a lower impurity concentration than the regions 476a and 476b.

When the transistor 491 includes the region 474, a short-channel effect can be suppressed. Therefore, such a structure is found to be suitable for miniaturization.

The transistor 491 is kept away from another transistor provided in the semiconductor substrate 400 by an insulator 460 or the like. Note that although FIG. 4 shows an example where the insulator 460 is formed by a method called STI (shallow trench isolation), the method is not limited to this. For example, instead of the insulator 460, an insulator formed by a LOCOS (local oxidation of silicon) method may be used so that transistors are separated from each other.

The transistor 490 includes the conductor 413; an insulator 402 over the conductor 413; a semiconductor 406a over the insulator 402; a semiconductor 406b over the semiconductor 406a; a conductor 416a and a conductor 416b in contact with side surfaces of the semiconductor 406a and a top surface and side surfaces of the semiconductor 406b; a semiconductor 406c in contact with the side surfaces of the semiconductor 406a, the top surface and the side surfaces of the semiconductor 406b, a top surface and a side surface of the conductor 416a, and a top surface and a side surface of the conductor 416b; an insulator 412 over the semiconductor 406c; and a conductor 404 over the insulator 412. Note that although the conductor 413 is part of the transistor 490 here, it is not limited to this. For example, the conductor 413 may be a component independent of the transistor 490.

The conductor 413 has a function as a gate electrode of the transistor 490. Furthermore, the insulator 402 has a function as a gate insulator of the transistor 490. Furthermore, the conductor 416a and the conductor 416b have functions as a source electrode and a drain electrode of the transistor 490. Furthermore, the insulator 412 has a function as a gate insulator of the transistor 490. Furthermore, the conductor 404 has a function as a gate electrode of the transistor 490.

As illustrated in FIG. 4, the conductors 416a and 416b are in contact with the side surfaces of the semiconductor 406b. Furthermore, the conductor 404 has a structure of electrically surrounding the semiconductor 406b in the channel width direction; not only the top surface but also side surfaces of the semiconductor 406b are surrounded. Such a transistor structure is referred to as a surrounded channel (s-channel) structure. The conductor 404 preferably extends to below the semiconductor 406b.

When the transistor structure is an s-channel structure, a channel formation region is easily controlled by a gate electric field from the side surface of the semiconductor 406b. The structure where the conductor 404 extends to below the semiconductor 406b has more excellent controllability. Thus, the subthreshold swing (also referred to as an S value) of the transistor 490 can be small, so that the amount of current when the transistor 490 is off can be reduced.

By having such a structure, even a miniature transistor can have favorable electrical characteristics. A semiconductor device including the miniaturized transistor can have a high integration degree and high density. Furthermore, since parasitic capacitance in the transistor is reduced, favorable switching characteristics can be obtained. For example, the transistor 490 include a region with a channel length of preferably less than or equal to 40 nm, more preferably less than or equal to 30 nm, still more preferably less than or equal to 20 nm and includes a region with a channel width of preferably less than or equal to 40 nm, more preferably less than or equal to 30 nm, still more preferably less than or equal to 20 nm.

Note that when the transistor 490 has an s-channel structure, a channel is formed in the whole of the semiconductor 406b (bulk) in some cases. Therefore, as the semiconductor 406b has a larger thickness, a channel region becomes larger. For example, the semiconductor 406b should have a region with a thickness of greater than or equal to 20 nm, preferably greater than or equal to 40 nm, more preferably greater than or equal to 60 nm, still more preferably greater than or equal to 100 nm. Note that the semiconductor 406b should have a region with a thickness of, for example, less than or equal to 300 nm, preferably less than or equal to 200 nm, more preferably less than or equal to 150 nm because the productivity of the semiconductor device may be decreased. With such a structure, in the s-channel structure, a large amount of current can flow between a source and a drain of a transistor, so that a high current in a conduction state (on-state current) can be obtained.

Alternatively, at least part (or all) of the conductor 416a (and/or the conductor 416b) is in contact with at least part (or all) of a surface, a side surface, a top surface, and/or a bottom surface of a semiconductor layer, e.g., the semiconductor 406b and the like. The contact region of the semiconductor 406b, in which donor levels are formed by entry of hydrogen into sites of oxygen vacancies in some cases, becomes an n-type conductive region. Note that a state in which hydrogen enters sites of oxygen vacancies is denoted by $V_OH$ in some cases. As a result, a current flows in the n-type conductive region, so that a favorable on-state current can be obtained.

In addition, a CAAC-OS (C Axis Aligned Crystalline Oxide Semiconductor) to be described later is preferably used as the oxide semiconductor. A CAAC-OS is an oxide semiconductor having a plurality of c-axis aligned crystal parts. It is particularly preferred that the proportion of CAAC to be described later be increased. The proportion of CAAC is the proportion of a region where a diffraction pattern of a CAAC-OS is observed in a predetermined area. Increasing the proportion of CAAC can reduce defects and carrier scattering, for example. Furthermore, a CAAC-OS with fewer impurities can be obtained, and for example, extremely low off-state current characteristics can be achieved. In the case of a high quality CAAC-OS, for example, the proportion of CAAC is higher than or equal to 50%, preferably higher than or equal to 80%, more preferably higher than or equal to 90%, still more preferably higher than or equal to 95% and less than or equal to 100%.

Furthermore, it is effective to reduce the concentration of impurities in the semiconductor 406b to make the oxide semiconductor intrinsic or substantially intrinsic. Here, the term "substantially intrinsic" refers to the state where an oxide semiconductor has a carrier density lower than $1\times10^{17}/cm^3$, preferably lower than $1\times10^{15}/cm^3$, more preferably lower than $1\times10^{13}/cm^3$. In the oxide semiconductor, hydrogen, nitrogen, carbon, silicon, and a metal element other than a main component are impurities. For example, hydrogen and nitrogen in the oxide semiconductor contribute to formation of donor levels to increase the carrier density, and silicon forms impurity levels in the oxide semiconductor.

A transistor including the substantially intrinsic oxide semiconductor has a low carrier density in a channel formation region and thus, the transistor rarely has a negative threshold voltage. In addition, because of few carrier traps in the oxide semiconductor, the transistor including the oxide semiconductor has small variations in electrical characteristics and high reliability. Furthermore, a transistor including the oxide semiconductor has an extremely low off-state current.

For example, the drain current at the time when the transistor including an oxide semiconductor is in an off state can be less than or equal to $1\times10^{-18}$ A, preferably less than or equal to $1\times10^{-21}$ A, more preferably less than or equal to $1\times10^{-24}$ A at room temperature (about 25° C.); or less than or equal to $1\times10^{-15}$ A, preferably less than or equal to $1\times10^{-18}$ A, more preferably less than or equal to $1\times10^{-21}$ A at 85° C. Note that an off state of an n-channel transistor refers to a state where the gate voltage is lower than the threshold voltage. Specifically, the transistor is in an off state when the gate voltage is lower than the threshold voltage by 1 V or more, 2 V or more, or 3 V or more.

Furthermore, when the transistor 490 is an accumulation-type one whose majority carriers are electrons, an electric field extending from regions of the semiconductor 406b that are in contact with the source electrode and the drain electrode to the channel formation region is easily blocked within a short distance; thus, carriers can be easily controlled with a gate electric field even when the transistor has a short channel.

Furthermore, unlike in the case of using a semiconductor substrate as a channel formation region, when the transistor is formed over an insulating surface, parasitic capacitance is not formed between the gate electrode and the semiconductor substrate and thus, carriers can be easily controlled with a gate electric field.

With such a structure, favorable electrical characteristics can be achieved. Specifically, excellent subthreshold characteristics, an extremely low off-state current, and a favorable on-state current can be obtained. Furthermore, favorable switching characteristics can be achieved.

The above-described three-layer structure is an example. For example, a two-layer structure without the semiconductor 406a or the semiconductor 406c may be employed. Alternatively, a four-layer structure in which any one of the semiconductors described as examples of the semiconductor 406a, the semiconductor 406b, and the semiconductor 406c is provided over or below the semiconductor 406a or over or below the semiconductor 406c may be employed. Still alternatively, the semiconductor 406 may have a n-layer structure (n is an integer of 5 or more) in which any one of the semiconductors described as examples of the semiconductors 406a, 406, and 406c is provided at two or more of the following positions: over the semiconductor 406a, below the semiconductor 406a, over the semiconductor 406c, and below the semiconductor 406c.

Note that the insulator 402 is preferably an insulator containing excess oxygen.

The insulator containing excess oxygen is an insulator having a function of releasing oxygen by heat treatment, for example. Silicon oxide containing excess oxygen is silicon oxide that can release oxygen by heat treatment or the like, for example. Therefore, the insulator 402 is an insulator in which oxygen can move in the film. In other words, the insulator 402 may be an insulator having an oxygen-transmitting property. For example, the insulator 402 may be an insulator having a higher oxygen-transmitting property than the semiconductor 406a.

The insulator containing excess oxygen has a function of reducing oxygen vacancies in the semiconductor 406b in some cases. Such oxygen vacancies form DOS in the semiconductor 406b and serve as hole traps or the like. In addition, hydrogen comes into the site of such an oxygen vacancy and forms an electron serving as a carrier. Therefore, by reducing the oxygen vacancies in the semiconductor 406b, the transistor 490 can have stable electrical characteristics.

The insulator 442 illustrated in FIG. 4 and the like is provided between the transistor 491 and the transistor 490. As the insulator 442, an oxide containing aluminum, e.g., aluminum oxide, is used. The insulator 442 is an insulator that blocks oxygen and hydrogen, and aluminum oxide whose density is lower than 3.2 g/cm$^3$ is preferred because it has a particularly high function of blocking hydrogen. Alternatively, aluminum oxide with low crystallinity is preferred because its function of blocking hydrogen is particularly high.

For example, in the case where the transistor 491 is transistors using silicon, the electrical characteristics of the transistor may be improved because dangling bonds of silicon can be reduced by supplying hydrogen from the outside. The supply of hydrogen may be performed by heat treatment under an atmosphere containing hydrogen, for example. Alternatively, for example, an insulator containing hydrogen is provided in the vicinity of the transistor 491 and heat treatment is performed, so that the hydrogen may be diffused and supplied to the transistor 491. Specifically, an insulator 464 over the transistor 491 is preferably an insulator containing hydrogen. Note that the insulator 464 may have a single-layer structure or a stacked-layer structure. For example, a stacked-layer structure including silicon oxynitride or silicon oxide, and silicon nitride oxide or silicon nitride, and the like should be used for the insulator 464.

An insulator containing hydrogen may release hydrogen the amount of which is larger than or equal to $1\times10^{18}$ atoms/cm$^3$, larger than or equal to $1\times10^{19}$ atoms/cm$^3$, or larger than or equal to $1\times10^{20}$ atoms/cm$^3$ in TDS analysis (converted into the number of hydrogen atoms) in the range of a surface temperature of 100° C. to 700° C. or 100° C. to 500° C.

Incidentally, hydrogen diffused from the insulator 464 may reach the vicinity of the transistor 490 through a conductor 471 provided in an opening of the insulator 464, a conductor 480 over the insulator 464, a conductor 482 over the conductor 480, or the like; however, since the insulator 442 has a function of blocking hydrogen, the amount of hydrogen which reaches the transistor 490 is small. Hydrogen serves as a carrier trap or a carrier generation source in an oxide semiconductor and causes deterioration of electrical characteristics of the transistor 490 in some cases. Therefore, blocking hydrogen by the insulator 442 is important to improve performance and reliability of the semiconductor device.

On the other hand, for example, by supplying oxygen to the transistor 490 from the outside, oxygen vacancies in the oxide semiconductor can be reduced; thus, the electrical characteristics of the transistor are improved in some cases. The supply of oxygen may be performed by heat treatment under an atmosphere containing oxygen, for example. Alternatively, for example, an insulator containing excess oxygen (oxygen) is provided in the vicinity of the transistor 490 and heat treatment is performed, so that the oxygen may be diffused and supplied to the transistor 490. Here, as the insulator 402 of the transistor 490, an insulator containing excess oxygen is used.

Diffused oxygen may reach the transistor 491 through layers; however, since the insulator 442 has a function of blocking oxygen, the amount of oxygen which reaches the transistor 491 is small. In the case where the transistor 491 is a transistor using silicon, entry of oxygen into silicon may be a factor of decreasing the crystallinity of silicon or inhibiting carrier movement. Therefore, blocking oxygen by the insulator 442 is important to improve performance and reliability of the semiconductor device.

Furthermore, in FIG. 4 and the like, the semiconductor device preferably includes an insulator 408 over the transistor 490. The insulator 408 has a function of blocking oxygen and hydrogen. For the insulator 408, the description of the insulator 442 is referred to, for example. Alternatively, the insulator 408 has, for example, a higher function of blocking oxygen and hydrogen than the semiconductor 406a and/or the semiconductor 406c.

When the semiconductor device includes the insulator 408, outward diffusion of oxygen from the transistor 490 can be suppressed. Consequently, oxygen with respect to the amount of excess oxygen (oxygen) contained in the insulator 402 and the like can be effectively supplied to the transistor 490. Furtheimore, since the insulator 408 blocks entry of impurities containing hydrogen from layers above the insulator 408 or the outside of the semiconductor device, degradation of the electrical characteristics of the transistor 490 due to the entry of impurities can be suppressed.

Note that although in the description, the insulator 442 and/or the insulator 408 is distinguished from the transistor 490 for convenience, the insulator 442 and/or the insulator 408 may be part of the transistor 490.

Note that in the cross-sectional view illustrated in FIG. 4, the semiconductor device 501 (cell) includes conductors for wirings in a plurality of layers that are connected to the transistor 490 and the transistor 491. A conductor in a first layer is located over the insulator 464 provided over the transistor 491 and includes the high power supply wiring (conductor 480). The transistor 491 and the conductor in the first layer may be connected through the conductor 471 (also called a via) provided in an opening provided in the insulator 464. A conductor in a second layer is located over an insulator 465 provided over the conductor in the first layer and includes the low power supply wiring (conductor 482). The conductor in the first layer and the conductor in the second layer may be connected through the conductor 472 (also called a via) provided in an opening provided in the insulator 465. A conductor in a third layer is located over the insulator 466 provided over the conductor in the second layer and includes the wiring (conductor 484) that supplies a gate voltage. The conductor in the second layer and the conductor in the third layer may be connected through a conductor 473 (also called a via) provided in an opening provided in the insulator 466. The insulator 442 is located over the insulator 467 provided over the conductor in the third layer, and the conductor 413 and the transistor 490 are located over the insulator 442. A conductor in a fourth layer is located over the insulator 408 and an insulator 468 provided over the transistor 490 and includes the conductors 424*a* and 424*b*. The conductor in the third layer and the conductor in the fourth layer may be connected through the conductor 475 (also called a via) provided in an opening provided in the insulators 408 and 468 and the drain electrode (conductor 416*b*) of the transistor 490. Another insulator may be further provided over the conductor in the fourth layer. A conductor or conductors in one or more layers and an insulator or insulators in one or more layers may further be provided over the insulator. The conductors can be used as wirings for connection among the plurality of semiconductor devices (cells), or the like. In the structural example illustrated in FIG. 4, conductors in three layers are provided between the transistor 490 and the transistor 491; however, the structure of the semiconductor device (cell) of one embodiment of the present invention is not limited to this. A conductor or conductors in one to ten layers may be provided between the transistor 490 and the transistor 491.

Note that the structure of the transistor 491 is not limited to the structure illustrated in FIG. 4. For example, it may be a structure where the semiconductor substrate 400 has a projected portion (also referred to as a protrusion, a fin, and the like), like the transistor 491 illustrated in FIG. 5. In the structure of the transistor 491 illustrated in FIG. 5, an effective channel width with respect to the same occupation area can be increased as compared with the structure of the transistor 491 illustrated in FIG. 4. Thus, the current of the transistor 491 in a conduction state can be increased. Furthermore, the conductor 454 surrounds a projected portion of the semiconductor substrate 400 in the channel width direction, facilitating the control of the channel formation region by a gate electric field. Consequently, a short channel effect can be suppressed, and it is found that this structure is suitable for miniaturization.

Figure 6:
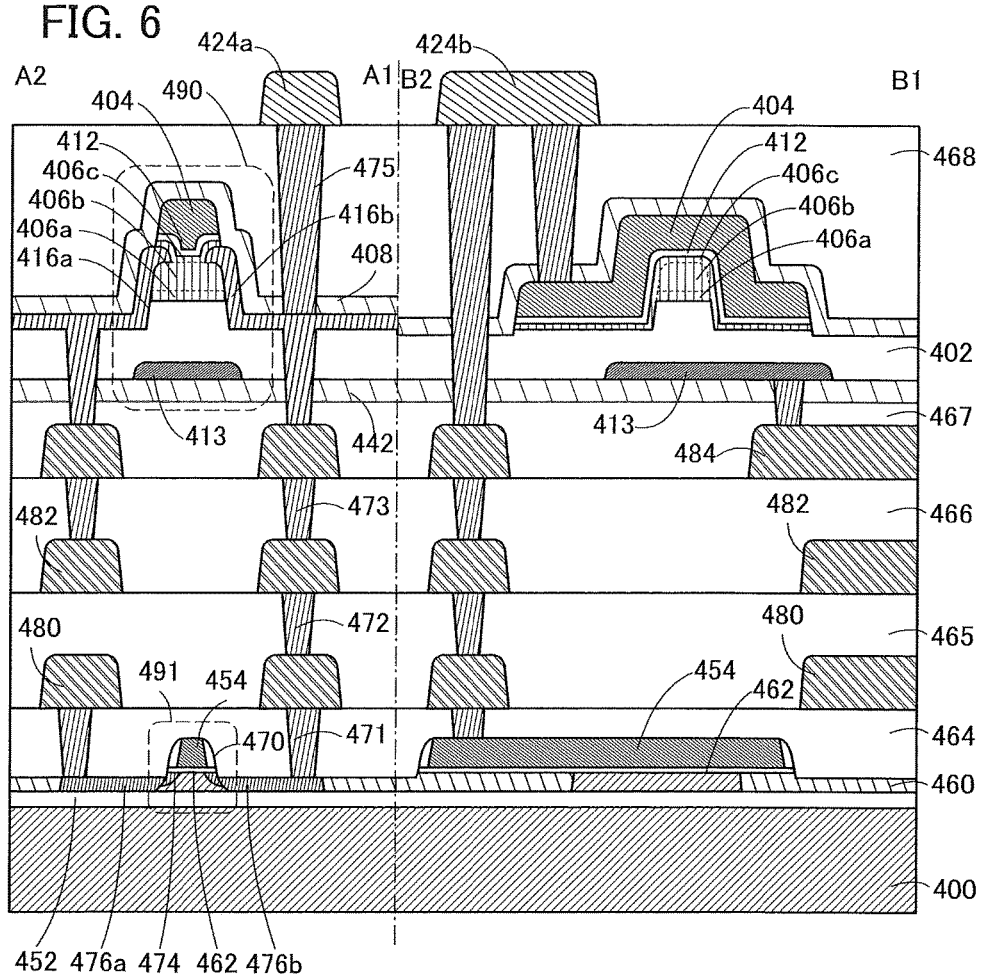
FIG. 6 is a cross-sectional view illustrating a semiconductor device relating to one embodiment of the present invention.

Alternatively, for example, a structure where an insulator region 452 is provided in the semiconductor substrate 400, like the transistor 491 illustrated in FIG. 6, may be used. With the structure of the transistor 491 illustrated in FIG. 6, transistors which independently operate can be separated from each other more reliably and thus, a leakage current can be suppressed. Furthermore, formation of parasitic capacitance between the transistor 491 and the substrate and a leakage current to the substrate can be suppressed. Consequently, the leakage current of the transistor 491 can be reduced. Moreover, the transistor 491 can operate at high speed and with low power.

The above-described p-channel Si transistor has a favorable switching speed. For example, the switching speed of the transistor is less than 10 ns, preferably less than 1 ns, more preferably less than 0.1 ns. A transistor including the above-described oxide semiconductor in a channel formation region also has a favorable switching speed. For example, the switching speed of the transistor is less than 10 ns, preferably less than 1 ns, more preferably less than 0.1 ns. The use of the above-described p-channel Si transistor as the transistor 491 and the transistor including the above-described oxide semiconductor in a channel formation region as the transistor 490 can increase the operating speed of the semiconductor device (cell) of one embodiment of the present invention. For example, the delay time of an inverter or a 2-input NAND circuit which is the semiconductor device (cell) of one embodiment of the present invention is less than 10 ns, preferably less than 1 ns, more preferably less than 0.1 ns.

Furthermore, the transistor using an oxide semiconductor has an extremely low off-state current; thus, a semiconductor device with a low static leakage current (or DC leakage current) can be provided. Particularly in a period when the input signal is Low or is a low power supply voltage, the transistor using an oxide semiconductor is off even though the input signal is input to a gate electrode of the transistor using an oxide semiconductor; and the leakage current through the transistor using an oxide semiconductor can be significantly small. Thus, a semiconductor device that can have reduced power consumption can be provided.

Furthermore, only p-channel Si transistors are preferably used as the transistor 491 or transistors formed at the same time as the transistor 491. Consequently, an n-channel Si transistor does not need to be manufactured in the manufacturing process of Si transistors, which can reduce the manufacturing cost. Particularly in the case of miniature transistors, optimized manufacturing processes are different between an n-channel Si transistor and a p-channel Si transistor; therefore, a significant effect can be obtained by reduction of the manufacturing cost when an n-channel Si transistor is not manufactured. Moreover, when only a p-channel Si transistor is manufactured, for example, the plane orientation in which high mobility can be achieved, which is convenient for the p-channel transistor, can be selected as the plane orientation of a surface of a silicon substrate. For example, the plane orientation of the silicon substrate can be a Si (110) plane.

Embodiment 2

Figure 5:
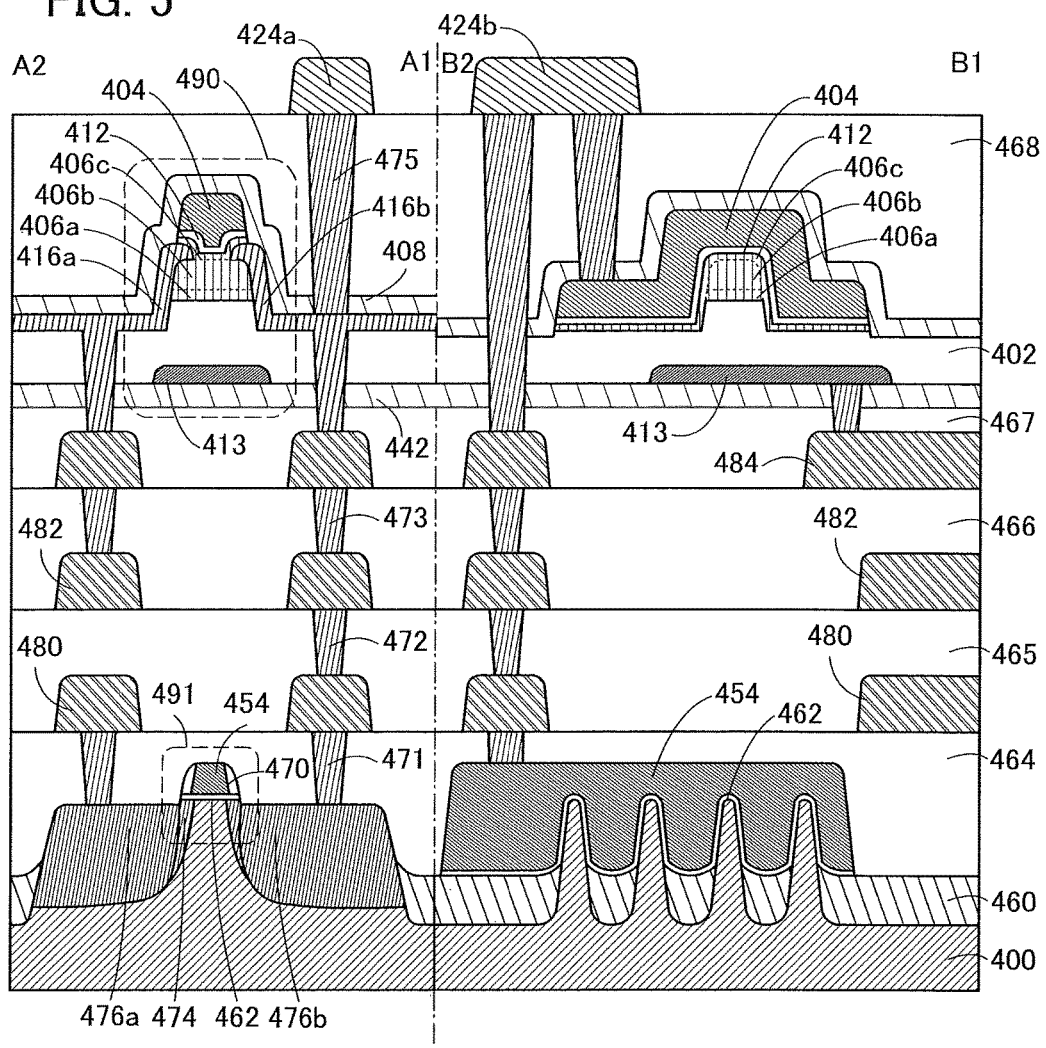
FIG. 5 is a cross-sectional view illustrating a semiconductor device relating to one embodiment of the present invention.

A semiconductor device that is one embodiment of the present invention is not limited to the structures illustrated in FIG. 4 to FIG. 6. In this embodiment, another example of a semiconductor device that is one embodiment of the present invention will be described with reference to FIG. 7 to FIG. 9. The semiconductor device 502 (cell) illustrated in FIG. 7 corresponds to the semiconductor device 500 (cell) illustrated in FIG. 1 and is a cell in which the transistor 490 and the transistor 491 are arranged and wired.

Figure 7:
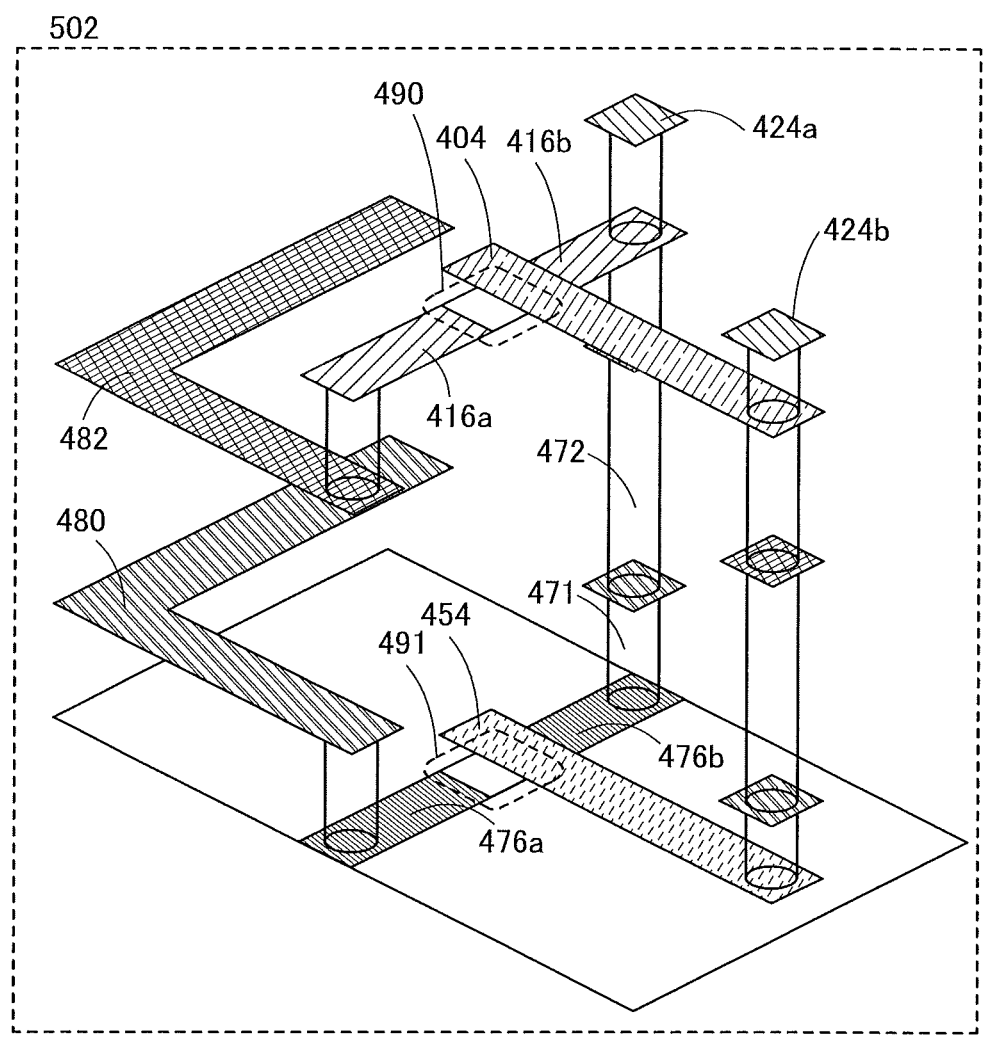
FIG. 7 is a schematic view illustrating a semiconductor device relating to one embodiment of the present invention.

FIG. 7 is a schematic view illustrating an example of the structure of the semiconductor device 502 (cell). Note that in FIG. 7 and FIG. 8, a portion such as an insulator is omitted and the same hatch pattern is used for conductors or the like formed in the same layer for easy understanding.

Figure 8A:
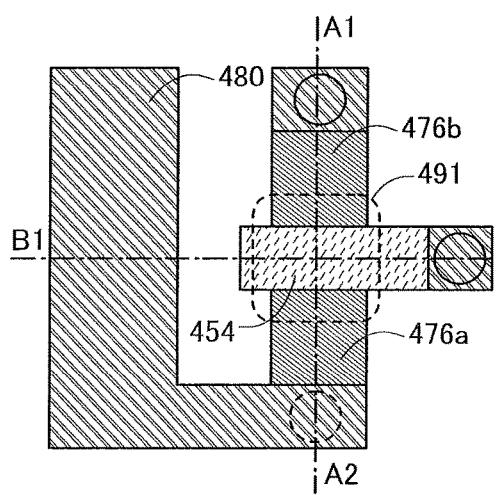
FIGS. 8A-8B are top views illustrating a semiconductor device relating to one embodiment of the present invention.
Figure 8B:
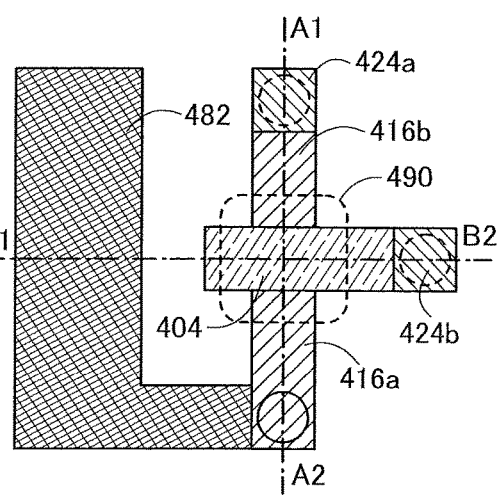

FIG. 8 is a top view illustrating a structural example of the semiconductor device 502 (cell). FIG. 8(A) shows a top view of a region of the semiconductor device 502 (cell) that includes the transistor 491 and the conductor 480. FIG. 8(B) shows a top view of a region of the semiconductor device 502 that includes the transistor 490 and the conductor 482.

Figure 9:
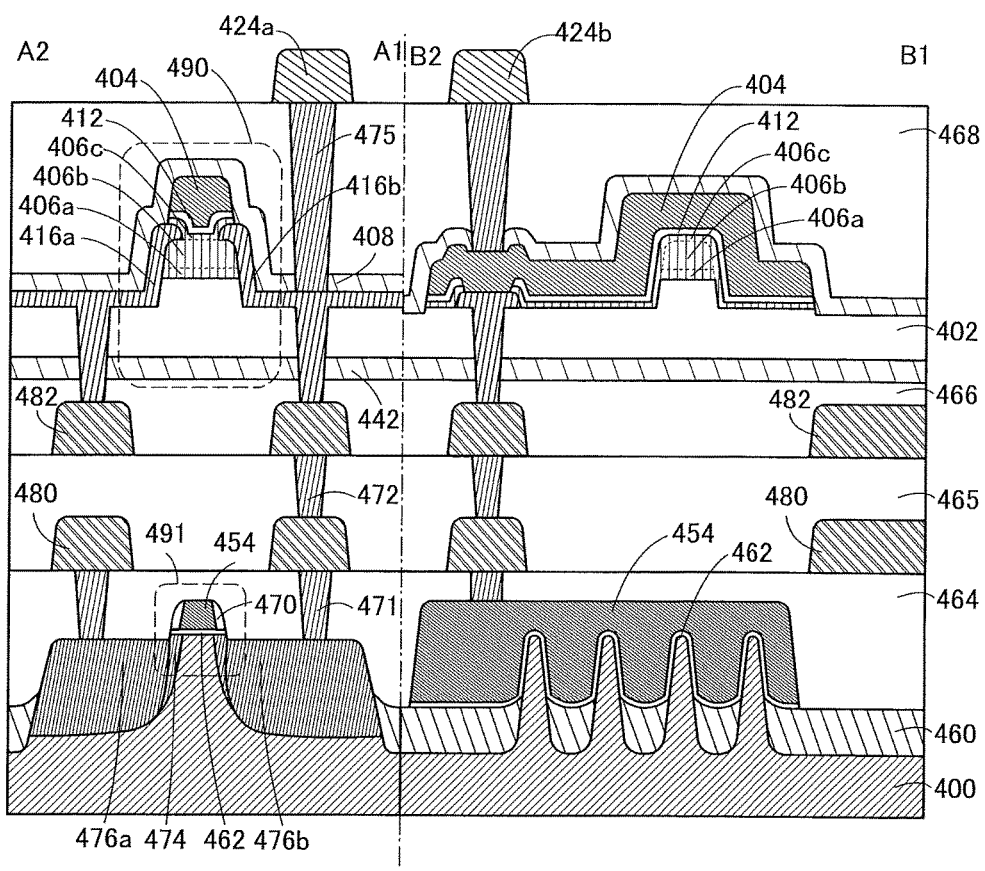
FIG. 9 is a cross-sectional view illustrating a semiconductor device relating to one embodiment of the present invention.

FIG. 9 is a cross-sectional view illustrating an example of the structure of the semiconductor device 502 (cell). A cross-sectional view taken along dashed dotted line A1-A2 in FIGS. 8(A) and 8(B) is illustrated on the left side of FIG. 9, and a cross-sectional view taken along dashed dotted line B1-B2 in FIGS. 8(A) and 8(B) is illustrated on the right side of FIG. 9.

In the semiconductor device 502 (cell) in FIG. 7, the transistor 491, the high power supply wiring (conductor 480), the low power supply wiring (conductor 482), and the transistor 490 are stacked in this order. In other words, the high power supply wiring (conductor 480) is positioned above the transistor 491, the low power supply wiring (conductor 482) is positioned above and overlaps with the high power supply wiring (conductor 480), and the transistor 490 is positioned above the low power supply wiring (conductor 482).

The source electrode (or the source region) of the transistor 491 is connected to the high power supply wiring (conductor 480); thus, the connection is easy compared with the case where the source electrode (or the source region) of the transistor 491 is connected to the low power supply wiring (conductor 482) positioned above the high power supply wiring (conductor 480), which is preferred. The source electrode (or the source region) of the transistor 490 is connected to the low power supply wiring (conductor 482); thus, the connection is easy compared with the case where the source electrode (or the source region) of the transistor 490 is connected to the high power supply wiring (conductor 480) positioned below the low power supply wiring (conductor 482), which is preferred.

Furthermore, in the semiconductor device 502 (cell), the wiring widths of the high power supply wiring (conductor 480) and the low power supply wiring (conductor 482) are each preferably larger than the wiring width of the gate electrode (conductor 454) of the transistor 491, the gate electrode (conductor 404) of the transistor 490, or a signal wiring that transmits input/output signals. Alternatively, the wiring widths of the high power supply wiring (conductor 480) and the low power supply wiring (conductor 482) are each preferably larger than the width of the wiring (conductor) connected to an input terminal and the width of the wiring (conductor) connected to an output terminal. This is because the power supply wiring supplies a larger amount of current than the signal wiring in many cases and preferably has lower wiring resistance than the signal wiring.

Although an example where the transistor 490 includes the conductor 413 having a function as a gate electrode is illustrated in FIG. 2 to FIG. 6, the structure of the semiconductor device related to one embodiment of the present invention is not limited to this. As illustrated in FIG. 7 to FIG. 9, the transistor 490 does not necessarily include the conductor 413. The semiconductor device 502 (cell) does not necessarily include the conductor 484 that supplies a voltage to the conductor 413. With such a structure, a conductor layer for forming the conductor 484 is unnecessary, leading to a reduction in the manufacturing cost.

An example where the gate electrode (conductor 404) of the transistor 490 and the gate electrode (conductor 454) of the transistor 491 are connected through the conductor 424b located above the conductor 404 is illustrated in FIG. 2 to FIG. 6; however, the structure of the semiconductor device (cell) of one embodiment of the present invention is not limited to this. As illustrated in FIG. 7 to FIG. 9, the conductor 404 and the conductor 454 may be connected through only a conductor located between the conductor 404 and the conductor 454 and not through the conductor 424b. With such a structure, a region where the gate electrode of the transistor 490 and the gate electrode of the transistor 491 are connected can be small; thus, the semiconductor device 502 (cell) can be small.

Embodiment 3

A semiconductor device that is one embodiment of the present invention is not limited to those illustrated in FIG. 4 to FIG. 6. In this embodiment, an example of a semiconductor device that is one embodiment of the present invention will be described with reference to FIG. 10 to FIG. 12. A semiconductor device 503 (cell) illustrated in FIG. 10 corresponds to the semiconductor device 500 (cell) illustrated in FIG. 1 and is a cell in which the transistor 490 and the transistor 491 are arranged and wired.

Figure 10:
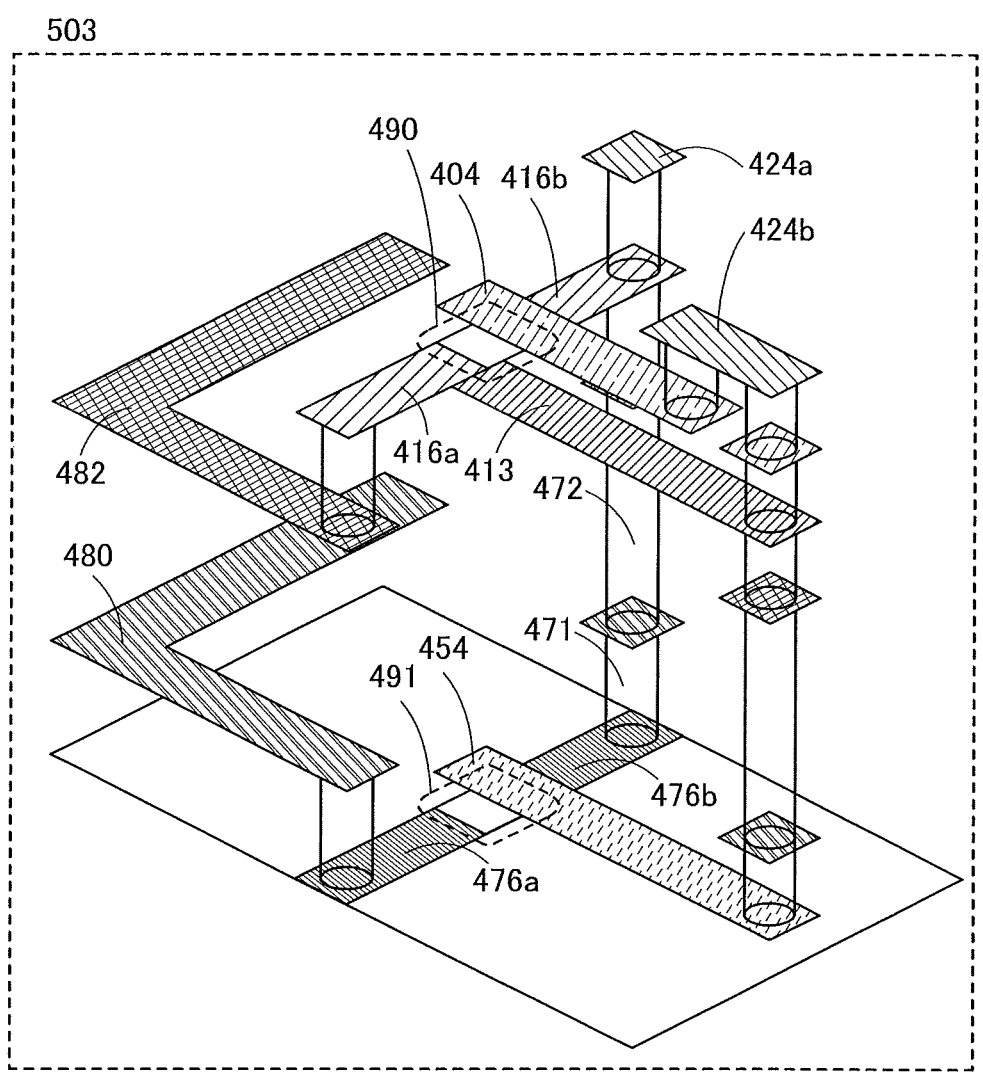
FIG. 10 is a schematic view illustrating a semiconductor device relating to one embodiment of the present invention.

FIG. 10 is a schematic view illustrating an example of the structure of the semiconductor device 503 (cell). Note that in FIG. 10 and FIG. 11, a portion such as an insulator is omitted and the same hatch pattern is used for conductors or the like formed in the same layer for easy understanding.

Figure 11A:
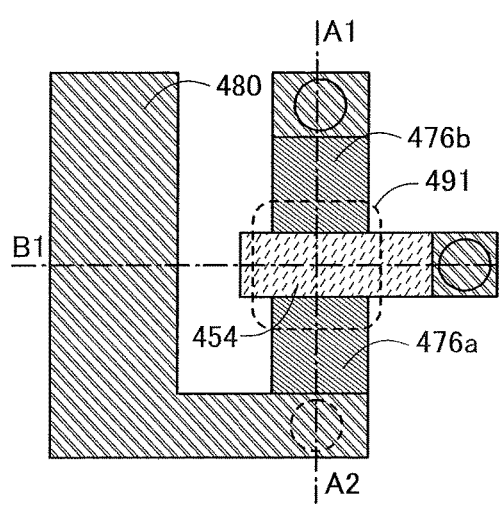
FIGS. 11A-11B are top views illustrating a semiconductor device relating to one embodiment of the present invention.
Figure 11B:
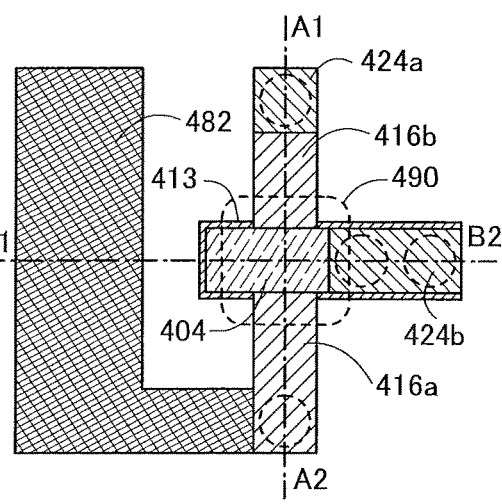

FIG. 11 is a top view illustrating a structural example of the semiconductor device 503 (cell). FIG. 11(A) shows a top view of a region of the semiconductor device 503 (cell) that includes the transistor 491 and the conductor 480. FIG. 11(B) shows a top view of a region of the semiconductor device 503 (cell) that includes the transistor 490 and the conductor 482.

Figure 12:
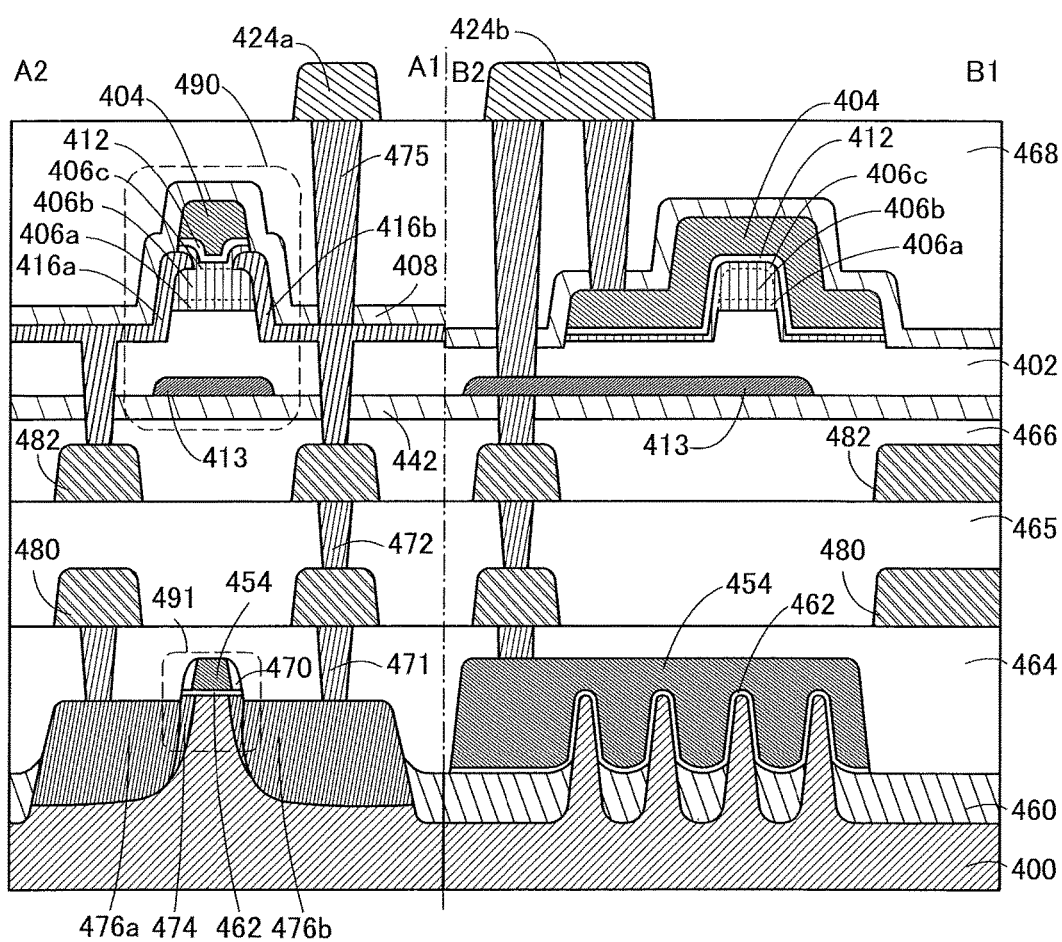
FIG. 12 is a cross-sectional view illustrating a semiconductor device relating to one embodiment of the present invention.

FIG. 12 is a cross-sectional view illustrating an example of the structure of the semiconductor device 503 (cell). A cross-sectional view taken along dashed dotted line A1-A2 in FIGS. 11(A) and 11(B) is illustrated on the left side of FIG. 12, and a cross-sectional view taken along dashed dotted line B1-B2 in FIGS. 11(A) and 11(B) is illustrated on the right side of FIG. 12.

In the semiconductor device 503 (cell) in FIG. 10, the transistor 491, the high power supply wiring (conductor 480), the low power supply wiring (conductor 482), and the transistor 490 are stacked in this order. In other words, the high power supply wiring (conductor 480) is positioned above the transistor 491, the low power supply wiring (conductor 482) is positioned above and overlaps with the high power supply wiring (conductor 480), and the transistor 490 is positioned above the low power supply wiring (conductor 482).

The source electrode (or the source region) of the transistor 491 is connected to the high power supply wiring (conductor 480); thus, the connection is easy compared with the case where the source electrode (or the source region) of the transistor 491 is connected to the low power supply wiring (conductor 482) positioned above the high power supply wiring (conductor 480), which is preferred. The source electrode (or the source region) of the transistor 490 is connected to the low power supply wiring (conductor 482); thus, the connection is easy compared with the case where the source electrode (or the source region) of the transistor 490 is connected to the high power supply wiring (conductor 480) positioned below the low power supply wiring (conductor 482), which is preferred.

Furthermore, in the semiconductor device 503 (cell), the wiring widths of the high power supply wiring (conductor 480) and the low power supply wiring (conductor 482) are each preferably larger than the wiring width of the gate electrode (conductor 454) of the transistor 491, the gate electrode (conductor 404) of the transistor 490, or a signal wiring that transmits input/output signals. Alternatively, the wiring widths of the high power supply wiring (conductor 480) and the low power supply wiring (conductor 482) are each preferably larger than the width of the wiring (conductor) connected to the input terminal and the width of the wiring (conductor) connected to the output terminal. This is because the power supply wiring supplies a larger amount of current than the signal wiring in many cases and preferably has lower wiring resistance than the signal wiring.

An example where the transistor 490 includes the gate electrode (conductor 413) to which a gate voltage can be applied independently of the gate electrode (conductor 404) is illustrated in FIG. 2 to FIG. 6; however, the structure of the semiconductor device (cell) related to one embodiment of the present invention is not limited to this. As illustrated in FIG. 10 to FIG. 12, the gate electrode (conductor 413) and the gate electrode (conductor 404) may be electrically connected to apply the same potential. In that case, the current of the transistor 490 in a conduction state can be increased because the effective channel width can be increased. By the gate electrode (conductor 413), an electric field reaches also a region which an electric field is difficult to reach; thus, the subthreshold swing (also referred to as an S value) of the transistor 490 can be small, and the off-state current of the transistor 490 can be reduced.

Embodiment 4

A cross-sectional structure of a semiconductor device that is one embodiment of the present invention is not limited to the structures illustrated in FIG. 4 to FIG. 6. In this embodiment, an example of a semiconductor device that is one embodiment of the present invention will be described with reference to FIG. 13 to FIG. 15. A semiconductor device 504 (cell) illustrated in FIG. 13 corresponds to the semiconductor device 500 (cell) illustrated in FIG. 1 and is a cell in which the transistor 490 and the transistor 491 are arranged and wired.

Figure 13:
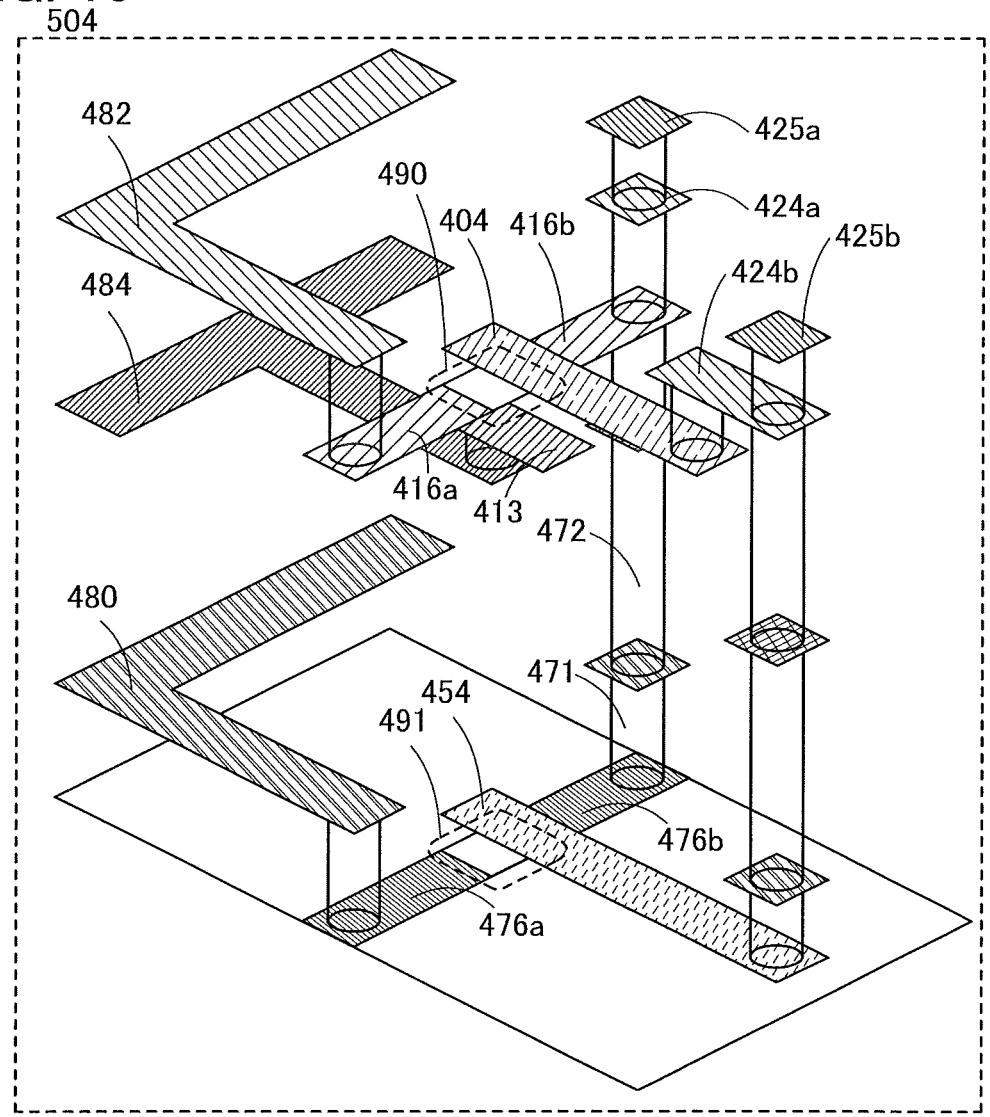
FIG. 13 is a schematic view illustrating a semiconductor device relating to one embodiment of the present invention.

FIG. 13 is a schematic view illustrating an example of the structure of the semiconductor device 504 (cell). Note that in FIG. 13 and FIG. 14, a portion such as an insulator is omitted and the same hatch pattern is used for conductors or the like formed in the same layer for easy understanding.

Figure 14A:
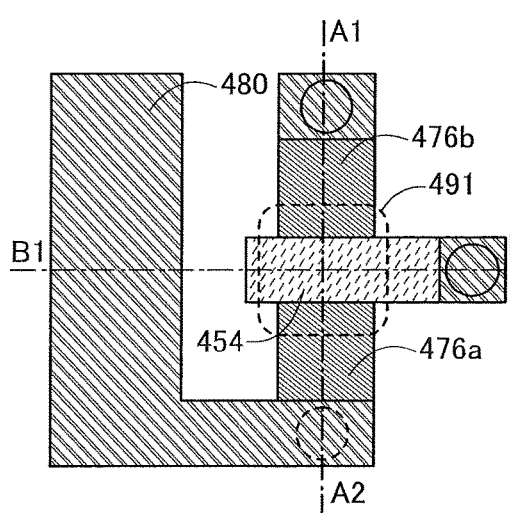
FIGS. 14A-14B are top views illustrating a semiconductor device relating to one embodiment of the present invention.
Figure 14B:
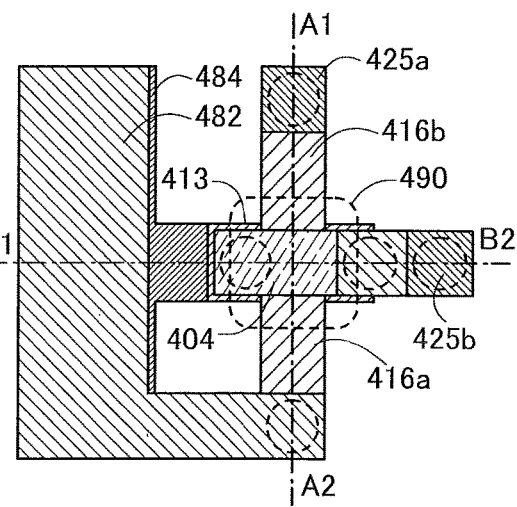

FIG. 14 is a top view illustrating a structural example of the semiconductor device 504 (cell). FIG. 14(A) is a top view of a region of the semiconductor device 504 (cell) that includes the transistor 491 and the conductor 480. FIG. 14(B) is the top view of a region of the semiconductor device 504 that includes the transistor 490, the conductor 482, and the conductor 484.

Figure 15:
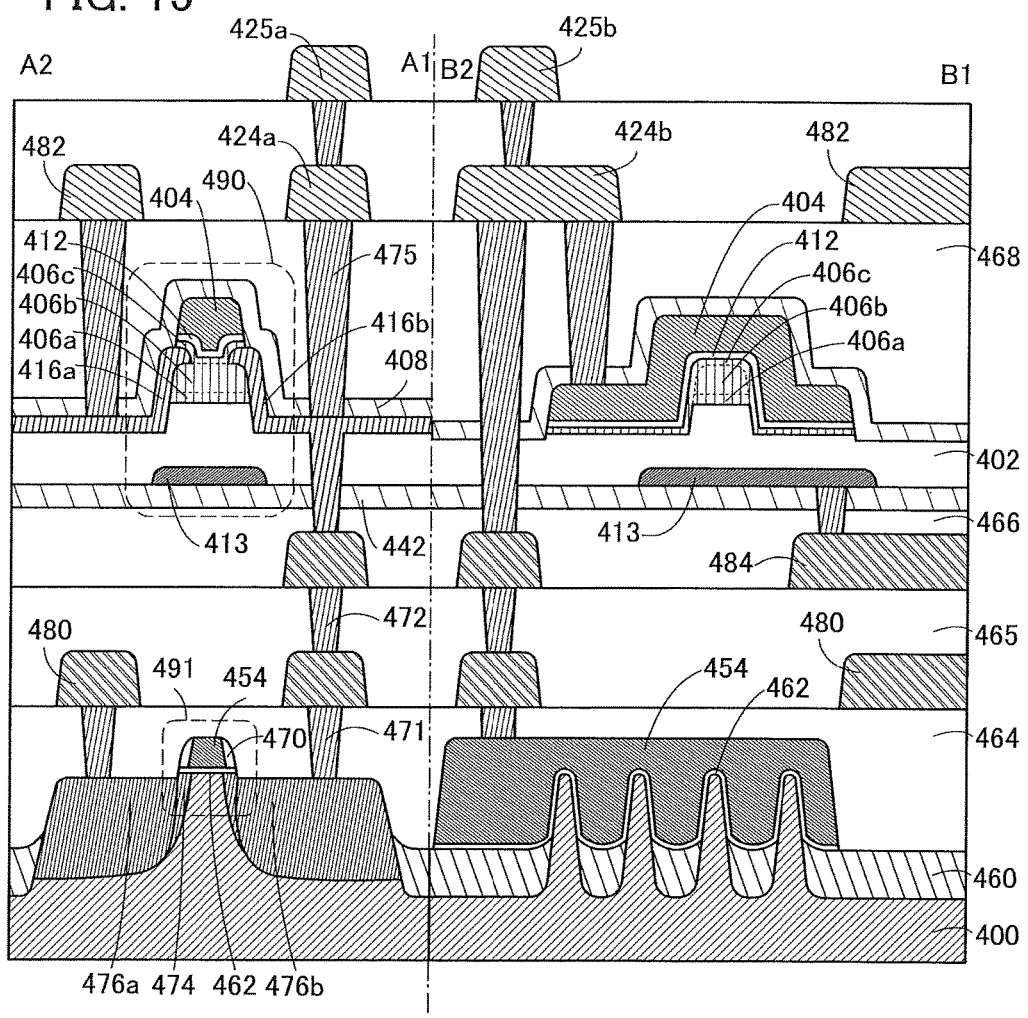
FIG. 15 is a cross-sectional view illustrating a semiconductor device relating to one embodiment of the present invention.

FIG. 15 is a cross-sectional view illustrating an example of the structure of the semiconductor device 504 (cell). A cross-sectional view taken along dashed dotted line A1-A2 in FIGS. 14(A) and 14(B) is illustrated on the left side of FIG. 15, and a cross-sectional view taken along dashed dotted line B1-B2 in FIGS. 14(A) and 14(B) is illustrated on the right side of FIG. 15.

In the semiconductor device 504 (cell) in FIG. 13, the transistor 491, the high power supply wiring (conductor 480), the conductor 484, the transistor 490, and the low power supply wiring (conductor 482) are stacked in this order. In other words, the high power supply wiring (conductor 480) is positioned above the transistor 491, the conductor 484 is positioned above and overlaps with the high power supply wiring (conductor 480), the transistor 490 is positioned above the conductor 484, and the low power supply wiring (conductor 482) is positioned above the transistor 490.

The source electrode (or the source region) of the transistor 491 is connected to the high power supply wiring (conductor 480); thus, the connection is easy compared with the case where the source electrode (or the source region) of the transistor 491 is connected to the low power supply wiring (conductor 482) positioned above the high power supply wiring (conductor 480), which is preferred. The source electrode (or the source region) of the transistor 490 is connected to the low power supply wiring (conductor 482); thus, the connection is easy compared with the case where the source electrode (or the source region) of the transistor 490 is connected to the high power supply wiring (conductor 480) positioned below the low power supply wiring (conductor 482).

Furthermore, in the semiconductor device 504 (cell), the wiring widths of the high power supply wiring (conductor 480) and the low power supply wiring (conductor 482) are each preferably larger than the wiring width of the gate electrode (conductor 454) of the transistor 491, the gate electrode (conductor 404) of the transistor 490, or a signal wiring that transmits input/output signals. Alternatively, the wiring widths of the high power supply wiring (conductor 480) and the low power supply wiring (conductor 482) are each preferably larger than the width of the wiring (conductor) connected to an input terminal and the width of the wiring (conductor) connected to an output terminal. This is because the power supply wiring supplies a larger amount of current than the signal wiring in many cases and preferably has lower wiring resistance than the signal wiring.

Although an example where adjacent conductors are used for the low power supply wiring (conductor 482) and the high power supply wiring (conductor 480) in FIG. 2 to FIG. 6; however, the structure of the semiconductor device (cell) related to one embodiment of the present invention is not limited to this. As illustrated in FIG. 13 to FIG. 15, the conductor 484 may be provided between the low power supply wiring (conductor 482) and the high power supply wiring (conductor 480) so as to overlap with the low power supply wiring (conductor 482). When the conductor 482 and the conductor 484 are positioned so as to overlap with each other, parasitic capacitance is formed between the wirings. Alternatively, the conductor 484 may be provided between the low power supply wiring (conductor 482) and the high power supply wiring (conductor 480) so as to overlap with the high power supply wiring (conductor 480). When the conductor 480 and the conductor 484 are positioned so as to overlap with each other, parasitic capacitance is formed between the wirings. With the parasitic capacitance, a circuit that is resistant to power source noise and capable of reducing a power supply voltage variation can be obtained. Note that it is preferred that the potential of the conductor 484 not frequently vary. Alternatively, the conductor 484 preferably has a function as a power supply wiring. With such a structure, phenomena in which the potentials of the conductor 480 and the conductor 482 are changed due to a variation in the conductor 484 can be reduced.

In the structural example illustrated in FIG. 13 to FIG. 15, the conductor 484 has a function as a wiring that applies a gate voltage. The gate voltage can be utilized to control the threshold voltage of the transistor 490. The gate voltage may be constant, in which case the conductor 484 has a function as a power supply wiring. Furthermore, the gate voltage value may be changed between a period when the semiconductor device 504 (cell) operates and a period when the semiconductor device 504 (cell) does not operate. The change is not frequently performed, so that the conductor 484 is a wiring whose potential does not frequently vary.

In addition, although the low power supply wiring (conductor 482) and the conductors 424a and 424b are provided as conductors in different layers in FIG. 2 to FIG. 6, the structure of the semiconductor device (cell) of one embodiment of the present invention is not limited to this. As illustrated in FIG. 13 to FIG. 15, conductors in the same layer may be used as the conductor 482 and the conductors 424a and 424b. Consequently, the manufacturing cost may be reduced by a reduction in the area and a reduction in the number of layers of the conductors.

Note that the output signal OUT is output to the outside from a conductor 425a that is located above the conductor 416b and connected to the drain electrode (conductor 416b) of the transistor 490 and the drain region (region 476b) of the transistor 491. The conductor 425a is connected to the conductor 424a through a conductor 477. The input signal IN is input from the outside to a conductor 425b that is located above the conductor 404 and connected to the gate electrode (conductor 404) of the transistor 490 and the gate electrode (conductor 454) of the transistor 491. The conductor 425b is connected to the conductor 424b through a conductor 478. The conductors 477 and 478 are provided in an opening formed in an insulator 469.

Embodiment 5

One structural example of a semiconductor device (cell) related to one embodiment of the present invention will be described with reference to FIG. 16 to FIG. 18, FIG. 20, and FIG. 32.

FIG. 32 is a schematic view of the semiconductor device where a transistor 490a, a transistor 490b, a transistor 491a, and a transistor 491b are arranged and wired.

Figure 20:
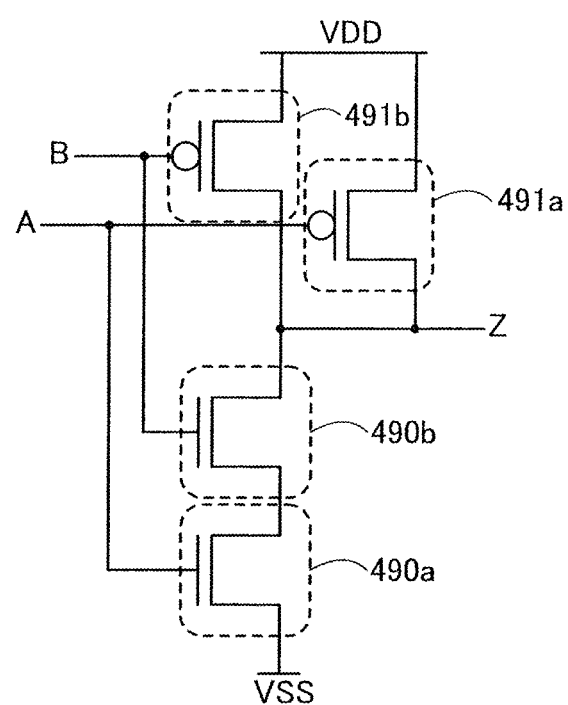
FIG. 20 is a circuit diagram illustrating a semiconductor device relating to one embodiment of the present invention.

A semiconductor device 510 (cell) includes the transistor 491a, the transistor 491b, the transistor 490a, the transistor 490b, the conductor 480 serving as a wiring, and the conductor 482 serving as a wiring and forms a 2-input NAND circuit having a CMOS structure illustrated in FIG. 20. In the 2-input NAND circuit having a CMOS structure, only when both input signals A and B are high, an output signal Z is low. The transistors 490a, 490b and the transistors 491a, 491b are stacked. The conductor 482 has a function of supplying the low power supply voltage (VSS). The conductor 480 has a function of supplying the high power supply voltage (VDD). The conductor 482 and the conductor 480 are stacked. The output signal Z is output from a drain electrode of the transistor 490b, a drain electrode of the transistor 491a, and a drain electrode of the transistor 491b. One input signal A is input to a gate electrode of the transistor 490a and a gate electrode of the transistor 491a. The other input signal B is input to a gate electrode of the transistor 490b and a gate electrode of the transistor 491b.

As the transistor 491a and the transistor 491b, high-switching-speed p-channel transistors can be used, for example. The switching speed of the transistors is, for example, less than 10 ns, preferably less than 1 ns, more preferably less than 0.1 ns. For example, p-channel Si transistors can be used as the transistor 491a and the transistor 491b. As the transistor 490a and the transistor 490b, high-switching-speed n-channel transistors can be used, for example. The switching speed of the transistors is, for example, less than 10 ns, preferably less than 1 ns, more preferably less than 0.1 ns. For example, transistors including an oxide semiconductor (preferably an oxide containing In, Ga, and Zn) in a channel formation region can be used as the transistor 490a and the transistor 490b.

The low power supply wiring (conductor 482) is electrically connected to a source electrode of the transistor 490a. The low power supply wiring (conductor 482) is electrically connected to a source electrode of the transistor 490b through the transistor 490a. The high power supply wiring (conductor 480) is electrically connected to a source electrode of the transistor 491a and a source electrode of the transistor 491b. The gate electrode of the transistor 490a and the gate electrode of the transistor 491a are electrically connected. The gate electrode of the transistor 490b and the gate electrode of the transistor 491b are electrically connected. The drain electrode of the transistor 490b is electrically connected to the drain electrode of the transistor 491a and the drain electrode of the transistor 491b. The drain electrode of the transistor 490a and the source electrode of the transistor 490b are electrically connected. The drain electrode of the transistor 491a and the drain electrode of the transistor 491b are electrically connected. The low power supply wiring (conductor 482) and the high power supply wiring (conductor 480) are arranged substantially parallel to each other and arranged to overlap with each other.

The low power supply wiring (conductor 482) and the high power supply wiring (conductor 480) are arranged substantially parallel to each other so as to overlap with each other, whereby the wirings have large parasitic capacitance (also referred to as wiring capacitance). Thus, the use of the wirings as power supply wirings can reduce a voltage variation due to power source noise, and a circuit that is resistant to power source noise and capable of reducing a power supply voltage variation can be obtained. Furthermore, to reduce a power supply voltage variation, a capacitor may be intentionally provided for a power supply wiring in a semiconductor device using the semiconductor device 510 (cell). When the low power supply wiring (conductor 482) and the high power supply wiring (conductor 480) have large parasitic capacitance, such a capacitor can be small. Therefore, the semiconductor device to which the semiconductor device 510 (cell) is applied can be downsized. Furthetmore, when the low power supply wiring (conductor 482) and the high power supply wiring (conductor 480) are arranged so as to overlap with each other, the area occupied by the wirings can be reduced which can reduce the area of the semiconductor device 510 (cell).

For the low power supply wiring (conductor 482) and the high power supply wiring (conductor 480), conductors for wirings adjacent to each other in the vertical direction are preferably used. The use of conductors for wirings adjacent to each other in the vertical direction reduces the distance between the wirings, and the wirings have large wiring capacitance. As a result, a circuit that is resistant to power source noise and capable of reducing a power supply voltage variation can be obtained. Furthermore, a semiconductor device to which the semiconductor device 510 (cell) is applied can be downsized.

Alternatively, for the low power supply wiring (conductor 482) and the high power supply wiring (conductor 480), conductors in adjacent layers are preferably used. Alternatively, it is preferred that a conductor not be provided between the low power supply wiring (conductor 482) and the high power supply wiring (conductor 480).

The transistor 490a and the transistor 491a are arranged so as to overlap with each other. The transistor 490b and the transistor 491b are arranged so as to overlap with each other. As a result, the area of the semiconductor device 510 (cell) can be reduced.

The transistor 490a and the transistor 491a are arranged so as to overlap with each other, and the direction in which a current flows in the transistor 490a is substantially parallel or antiparallel to the direction in which a current flows in the transistor 491a. Alternatively, the direction in which the source electrode, the gate electrode, and the drain electrode of the transistor 490a are arranged is substantially parallel to the direction in which the source electrode, the gate electrode, and the drain electrode of the transistor 491a are arranged. The transistor 490b and the transistor 491b are arranged so as to overlap with each other, and the direction in which a current flows in the transistor 490b is substantially parallel or antiparallel to the direction in which a current flows in the transistor 491b. Alternatively, the direction in which the source electrode, the gate electrode, and the drain electrode of the transistor 490b are arranged is substantially parallel to the direction in which the source electrode, the gate electrode, and the drain electrode of the transistor 491b are arranged. Thus, the transistor 490a and the transistor 491a and a connection portion of the gate electrodes can be connected in a small region and the transistor 490b and the transistor 491b and a connection portion of the gate electrodes can be connected in a small region, and the area of the semiconductor device 510 (cell) can be reduced.

Figure 32A:
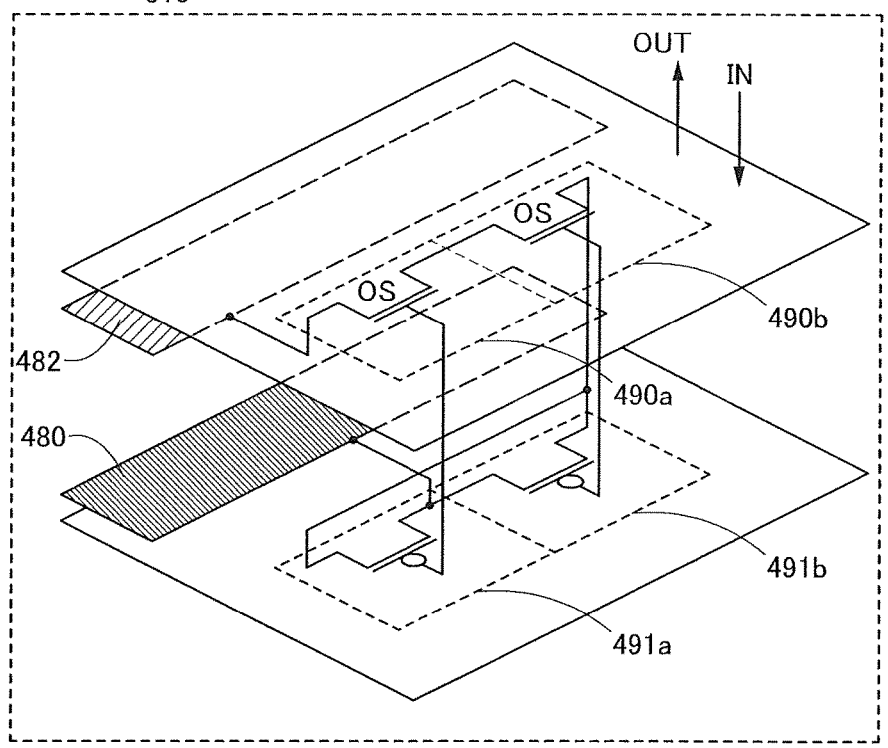
FIGS. 32A-32B are schematic views illustrating a semiconductor device relating to one embodiment of the present invention.

In the semiconductor device 510 (cell) in FIG. 32A, the transistors 491a and 491b, the high power supply wiring (conductor 480), the low power supply wiring (conductor 482), and the transistors 490a and 490b are stacked in this order. In other words, the high power supply wiring (conductor 480) is positioned above the transistors 491a and 491b, the low power supply wiring (conductor 482) is positioned above and overlaps with the high power supply wiring (conductor 480), and the transistors 490a and 490b are positioned above the low power supply wiring (conductor 482).

With such a structure, the low power supply wiring (conductor 482) and the high power supply wiring (conductor 480) are located close to each other in the vertical direction, leading to large wiring capacitance. Thus, a circuit that is resistant to power source noise and capable of reducing a power supply voltage variation can be obtained. Furthermore, a semiconductor device to which the semiconductor device 510 (cell) is applied can be downsized.

Figure 32B:
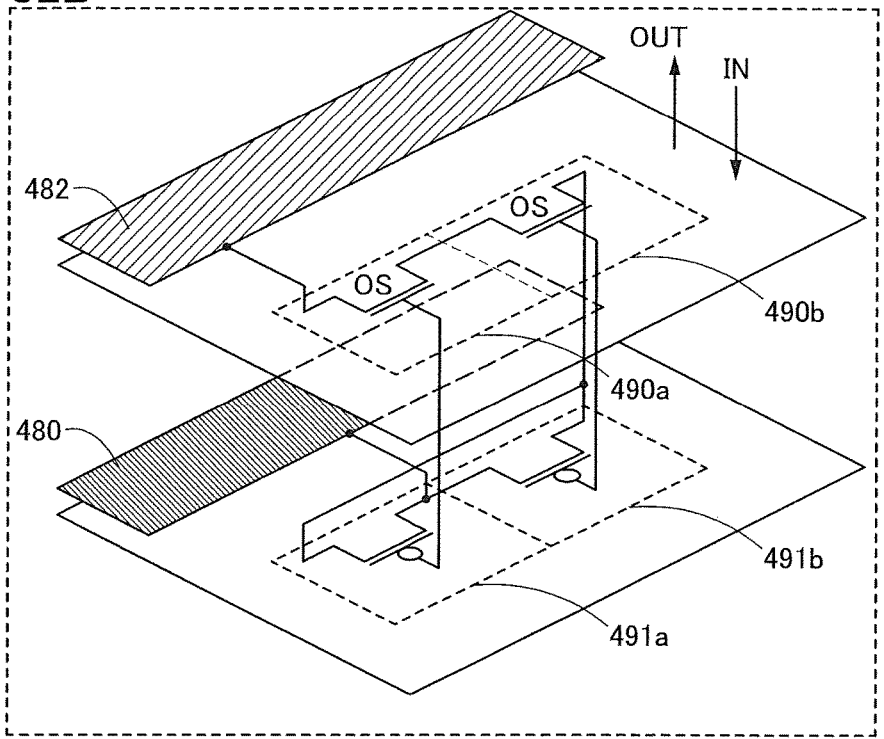

In FIG. 32B, the semiconductor device 510 (cell) is provided over the semiconductor substrate and includes the transistors 491a and 491b, the high power supply wiring (conductor 480), the transistors 490a and 490b, and the low power supply wiring (conductor 482) in this order over the semiconductor substrate. In other words, the high power supply wiring (conductor 480) is positioned above the transistors 491a and 491b, the transistors 490a and 490b are positioned above the high power supply wiring (conductor 480), and the low power supply wiring (conductor 482) is positioned above the transistors 490a and 490b.

In the semiconductor device 510 (cell), the source electrodes or the drain electrodes of the transistors 490a and 490b may be connected to other transistors in the semiconductor device 510 (cell) through conductors above the transistors 490a and 490b. In that case, when the conductor and a conductor used as a connection wiring among the plurality of cells are formed in the same layer, the area needed for wirings may increase. This is because wiring positions are irregular in connection among the plurality of cells, and thus when unusable regions are scattered, the number of wirings that need to be diverted increases. Even in such a case, when the conductor and a conductor used as the power supply wirings are formed in the same layer, there may be almost no increase in the area. This is because the power supply wirings are regularly arranged in an end portion of the cell region. In that case, the manufacturing cost may be reduced by a reduction in the area and a reduction in the number of layers of the conductors.

The cell area of the semiconductor device 510 (cell) described above can be small. For example, the height of a 2-input NAND circuit cell can be preferably WW+WT+7*Py or less, more preferably WW+WT+5*Py or less. Furthermore, the width of the cell can be preferably 5*Px or less, more preferably 4*Px or less. Here, WW is the width of a power supply line, and WT is the maximum channel width of the channel widths of a plurality of transistors in the semiconductor device 510 (cell).

Furthermore, the heights of the plurality of cells are preferably the same. In that case, the height of the cells is set to the height of a row and the cells are arranged in a plurality of rows, whereby they can be arranged and wired efficiently.

In the case where the source electrode of the transistor 490a and/or the source electrode of the transistor 490b is electrically connected to the conductor (482) serving as a power supply wiring in order that the transistors and the power supply wirings in the semiconductor device 510 (cell) are closely arranged, the electrode and the conductor are preferably directly connected to through a conductor (also referred to as a via) provided in an opening provided in an insulator. Alternatively, the source electrode of the transistor 490a and/or the source electrode of the transistor 490b and the conductor (482) serving as a power supply wiring are preferably connected to the conductor through vias and a conductor between the vias. In the case where the source electrode of the transistor 491a and/or the source electrode of the transistor 491b and the conductor (480) serving as a power supply wiring are electrically connected, the electrode and the conductor are preferably directly connected through a conductor provided in an opening provided in an insulator. Alternatively, the source electrode of the transistor 491a and/or the source electrode of the transistor 491b and the conductor (480) serving as a power supply wiring are preferably connected through vias and a conductor between the vias.

To closely arrange the transistors and the power supply wirings included in the semiconductor device 510 (cell), no transistor is preferably provided between the transistor 490a and the transistor 490b and the conductor 480 serving as a power supply wiring and between the transistor 491a and the transistor 491b and the conductor 482 serving as a power supply wiring in the semiconductor device 510 (cell).

To closely arrange the transistors and the power supply wirings included in the semiconductor device 510 (cell) and efficiently arrange the plurality of cells, the power supply wirings are preferably arranged regularly in an end portion of the cell area. Particularly in the semiconductor device (cell) relating to one embodiment of the present invention, the power supply wirings may be arranged only in an end portion of one side of the cell area. The cell area can be small in some cases compared with the case where the power supply wirings are arranged in end portions of both sides of the cell area.

Figure 16:
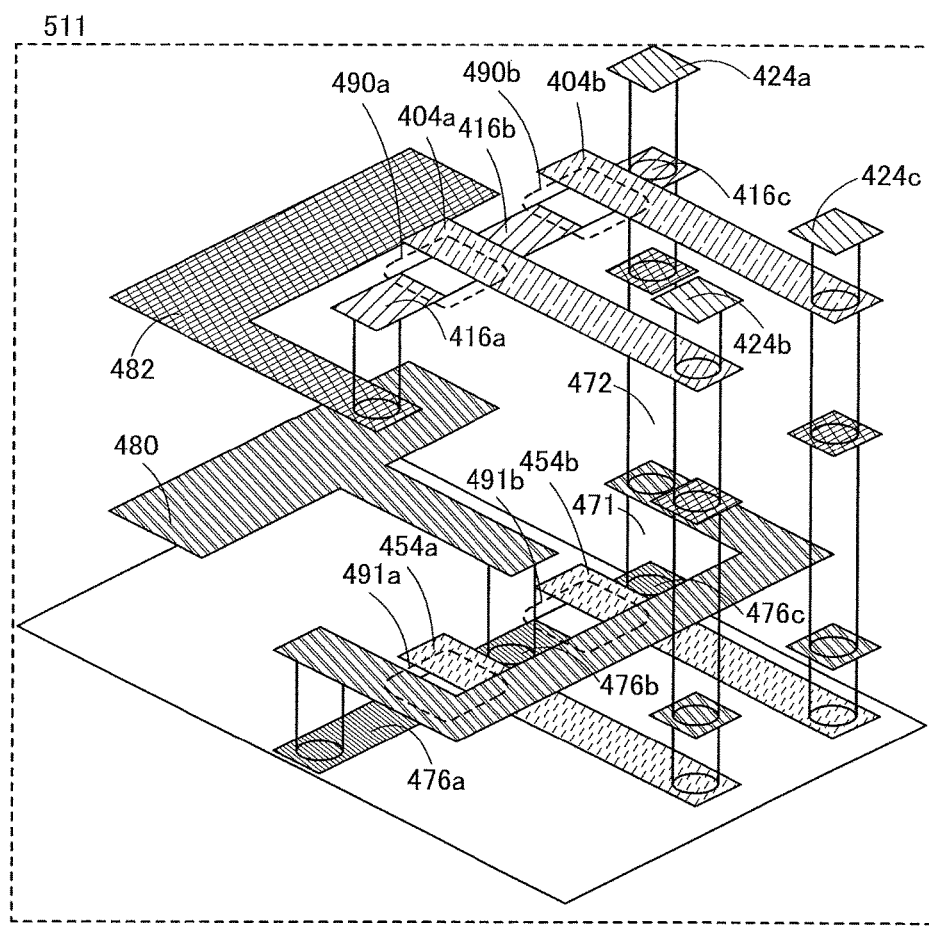
FIG. 16 is a schematic view illustrating a semiconductor device relating to one embodiment of the present invention.

FIG. 16 is a schematic view illustrating an example of the structure of a semiconductor device 511 (cell). The semiconductor device 511 (cell) illustrated in FIG. 16 corresponds to the semiconductor device 510 (cell) illustrated in FIG. 32 and is a cell in which the transistor 490a, the transistor 490b, the transistor 491a, and the transistor 491b are arranged and wired. Note that in FIG. 16 and FIG. 17, a portion such as an insulator is omitted and the same hatch pattern is used for conductors or the like formed in the same layer for easy understanding.

Figure 17A:
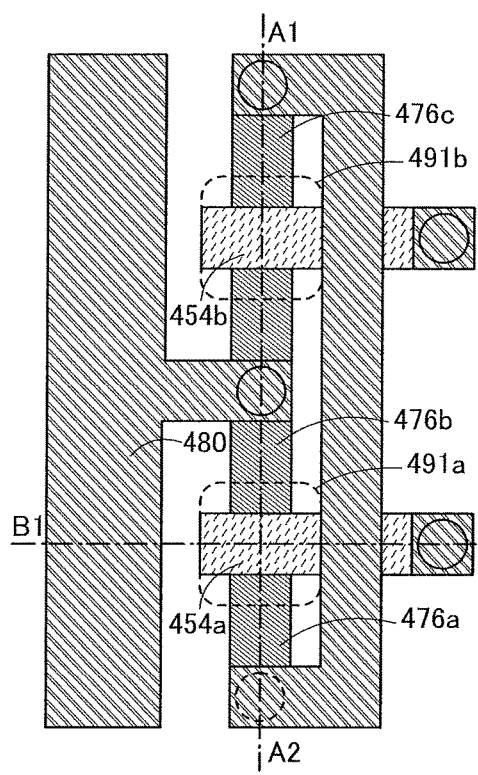
FIGS. 17A-17B are top views illustrating a semiconductor device relating to one embodiment of the present invention.
Figure 17B:
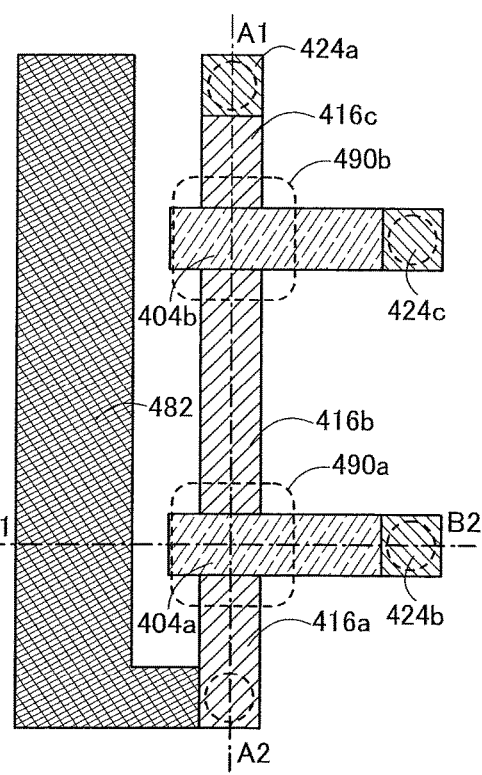

FIG. 17 is a top view illustrating a structural example of the semiconductor device 511 (cell). FIG. 17(A) illustrates the top view of a region of the semiconductor device 511 that includes the transistors 491a and 491b and the conductor 480. FIG. 17(B) illustrates the top view of a region of the semiconductor device 511 (cell) that includes the transistors 490a and 490b and the conductor 482.

Figure 18:
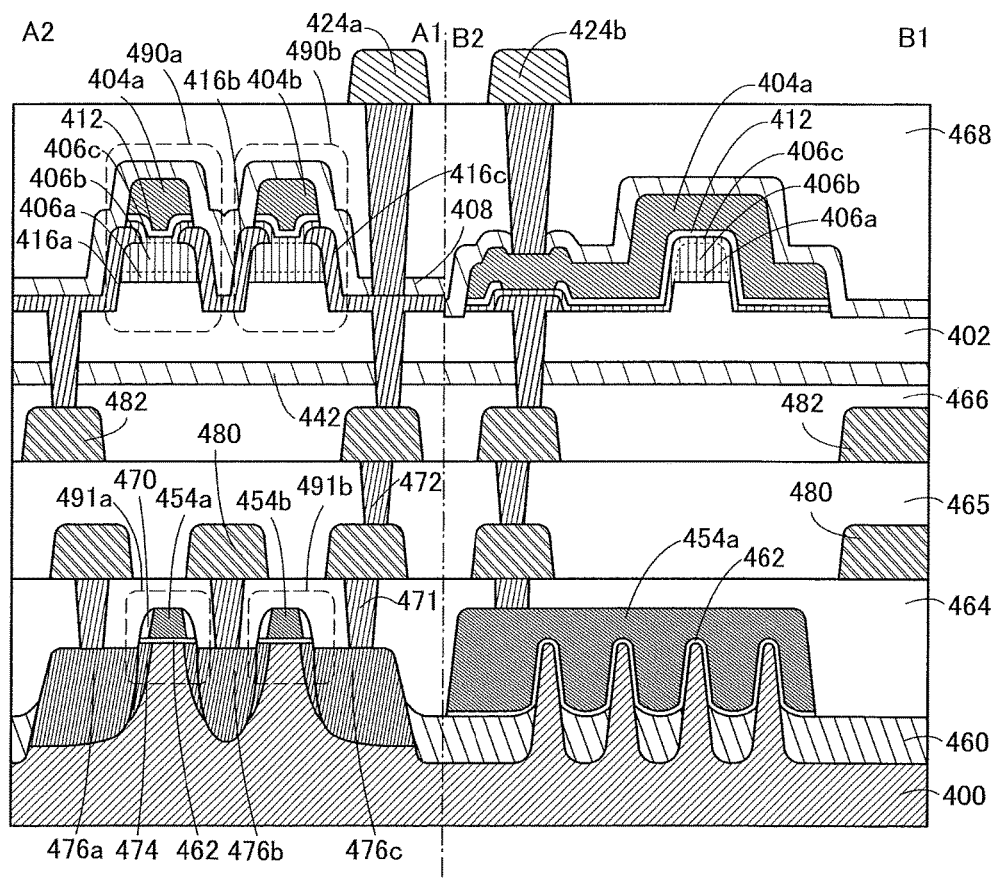
FIG. 18 is a cross-sectional view illustrating a semiconductor device relating to one embodiment of the present invention.

FIG. 18 is a cross-sectional view illustrating an example of the structure of the semiconductor device 511 (cell). A cross-sectional view taken along dashed dotted line A1-A2 in FIG. 17(A) and FIG. 17(B) is illustrated on the left side of FIG. 18, and a cross-sectional view taken along dashed dotted line B1-B2 in FIG. 17(A) and FIG. 17(B) is illustrated on the right side of FIG. 18.

The semiconductor device 511 (cell) illustrated in FIG. 16 includes the transistor 491a and the transistor 491b, the conductor 480, the transistor 490a and the transistor 490b, and the conductor 482. The transistors 490a, 490b and the transistor 491a, 491b are stacked. The conductor 482 and the conductor 480 are stacked. The transistor 491a includes the regions 476a and 476b and a conductor 454a. The transistor 491b includes the regions 476b and 476c and a conductor 454b. The transistor 490a includes the conductors 416a and 416b and a conductor 404a. The transistor 490b includes the conductors 416b, 416c, and 404b.

The regions 476a and 476b have functions as one and the other of the source electrode (or the source region) and the drain electrode (or the drain region) of the transistor 491a. The conductor 454a has a function as the gate electrode of the transistor 491a. The regions 476b and 476c have functions as one and the other of the source (or the source region) and the drain electrode (or the drain region) of the transistor 491b. The conductor 454b has a function as the gate electrode of the transistor 491b. The conductors 416a and 416b have functions as one and the other of the source electrode (or the source region) and the drain electrode (or the drain region) of the transistor 490a. The conductor 404a has a function as the gate electrode of the transistor 490a. The conductors 416b and 416c have functions as one and the other of the source electrode (or the source region) and the drain electrode (or the drain region) of the transistor 490b. The conductor 404b has a function as the gate electrode of the transistor 490b.

The high power supply wiring (conductor 480) and the low power supply wiring (conductor 482) are arranged substantially parallel to each other so as to overlap with each other. An output signal is output to the outside from the conductor 424a that is located above the conductor 416c and connected to the drain electrode (conductor 416c) of the transistor 490b, the drain region (region 476a) of the transistor 491a, and the drain region (region 476c) of the transistor 491b. One of input signals is input from the outside to the conductor 424b that is located above the conductor 404a and connected to the gate electrode (conductor 404a) of the transistor 490a and the gate electrode (conductor 454a) of the transistor 491a. The other input signal is input from the outside to the conductor 424c that is located above the conductor 404b and connected to the gate electrode (conductor 404b) of the transistor 490b and the gate electrode (conductor 454b) of the transistor 491b.

The low power supply wiring (conductor 482) and the high power supply wiring (conductor 480) are arranged substantially parallel to each other so as to overlap with each other, whereby the wirings have large parasitic capacitance (also referred to as wiring capacitance). Thus, the use of the wirings as power supply wirings can reduce a voltage variation due to power source noise, so that a circuit that is resistant to power source noise and capable of reducing a power supply voltage variation can be obtained. Furthermore, to reduce a power supply voltage variation, a capacitor may be intentionally provided for a power supply wiring in a semiconductor device to which the semiconductor device 511 (cell) is applied. When the low power supply wiring (conductor 482) and the high power supply wiring (conductor 480) have large parasitic capacitance, such a capacitor can be small. Therefore, the semiconductor device to which the semiconductor device 511 (cell) is applied can be downsized. Furthermore, when the low power supply wiring (conductor 482) and the high power supply wiring (conductor 480) are arranged so as to overlap with each other, the area occupied by the wirings can be reduced, and the area of the semiconductor device 511 (cell) can be reduced.

For the low power supply wiring (conductor 482) and the high power supply wiring (conductor 480), conductors for wirings adjacent to each other in the vertical direction are preferably used. The use of conductors for wirings adjacent to each other in the vertical direction reduces the distance between the wirings, so that the wirings have large wiring capacitance. As a result, a circuit that is resistant to power source noise and capable of reducing a power supply voltage variation can be obtained. Furthermore, a semiconductor device to which the semiconductor device 511 (cell) is applied can be downsized.

Alternatively, for the low power supply wiring (conductor 482) and the high power supply wiring (conductor 480), conductors in adjacent layers are preferably used. Alternatively, no conductor is preferably provided between the low power supply wiring (conductor 482) and the high power supply wiring (conductor 480).

The transistor 490a and the transistor 491a are arranged so as to overlap with each other. The transistor 490b and the transistor 491b are arranged so as to overlap with each other. As a result, the area occupied by the semiconductor device 510 (cell) can be reduced.

The transistor 490a and the transistor 491a are arranged so as to overlap with each other, and the direction in which a current flows in the transistor 490a is substantially parallel or antiparallel to the direction in which a current flows in the transistor 491a. Alternatively, the direction in which the source electrode, the gate electrode, and the drain electrode of the transistor 490a are arranged is substantially parallel to the direction in which the source electrode, the gate electrode, and the drain electrode of the transistor 491a are arranged. The transistor 490b and the transistor 491b are arranged so as to overlap with each other, and the direction in which a current flows in the transistor 490b is substantially parallel or antiparallel to the direction in which a current flows in the transistor 491*b*. Alternatively, the direction in which the source electrode, the gate electrode, and the drain electrode of the transistor 490*a* are arranged is substantially parallel to the direction in which the source electrode, the gate electrode, and the drain electrode of the transistor 491*b* are arranged. With such arrangement, the drain electrode of the transistor 490*a* and the drain electrode of the transistor 491*a* can be arranged in close proximity to each other, and the gate electrode of the transistor 490*a* and the gate electrode of the transistor 491*a* can be arranged in close proximity to each other. Furthermore, the drain electrode of the transistor 490*b* and the drain electrode of the transistor 491*b* can be arranged in close proximity to each other, and the gate electrode of the transistor 490*b* and the gate electrode of the transistor 491*b* can be arranged in close proximity to each other. Consequently, in the case where the gate electrode of the transistor 490*a* is connected to the gate electrode of the transistor 491*a*, the drain electrode of the transistor 490*b* is connected to the drain electrode of the transistor 491*b*, and the gate electrode of the transistor 490*b* is connected to the gate electrode of the transistor 491*b*, the area of connection regions can be small, and the area of the semiconductor device 510 (cell) can be reduced.

The direction in which a current flows in the transistor 490*a* (or the direction in which the source electrode, the gate electrode, and the drain electrode of the transistor 490*a* are arranged) is substantially parallel to the extending direction of the low power supply wiring (conductor 482). In this case, the source electrode of the transistor 490*a* positioned on either side of the gate electrode can be connected to the low power supply wiring (conductor 482) using a short wiring, which is preferred. The direction in which a current flows in the transistor 491*a* (or the direction in which the source electrode, the gate electrode, and the drain electrode of the transistor 491*a* are arranged) is substantially parallel to the extending direction of the high power supply wiring (conductor 480). In this case, the source electrode of the transistor 491*a* positioned on either side of the gate electrode can be connected to the high power supply wiring (conductor 480) using a short wiring, which is preferred. The direction in which a current flows in the transistor 490*b* (or the direction in which the source electrode, the gate electrode, and the drain electrode of the transistor 490*b* are arranged) is substantially parallel to the extending direction of the low power supply wiring (conductor 482). In this case, the source electrode of the transistor 490*b* positioned on either side of the gate electrode can be connected to the low power supply wiring (conductor 482) using a short wiring, which is preferred. The direction in which a current flows in the transistor 491*b* (or the direction in which the source electrode, the gate electrode, and the drain electrode of the transistor 491*b* are arranged) is substantially parallel to the extending direction of the high power supply wiring (conductor 480). In this case, the source electrode of the transistor 491*b* positioned on either side of the gate electrode can be connected to the high power supply wiring (conductor 480) using a short wiring, which is preferred.

The direction in which a current flows in the transistor 490*a* (or the direction in which the source electrode, the gate electrode, and the drain electrode of the transistor 490*a* are arranged) may be substantially perpendicular to the extending direction of the low power supply wiring (conductor 482). In the case where the source electrode of the transistor 490*a* is connected to the low power supply wiring (conductor 482), the source electrode can be positioned so as to overlap with the low power supply wiring, and the area can be reduced, which is preferred. Note that the direction in which a current flows in the transistor 491*a* (or the direction in which the source electrode, the gate electrode, and the drain electrode of the transistor 491*a* are arranged) may be substantially perpendicular to the extending direction of the high power supply wiring (conductor 480). In the case where the source electrode of the transistor 491*a* is connected to the high power supply wiring (conductor 480), the source electrode can be positioned so as to overlap with the high power supply wiring, and the area can be reduced, which is preferred. The direction in which a current flows in the transistor 490*b* (or the direction in which the source electrode, the gate electrode, and the drain electrode of the transistor 490*b* are arranged) may be substantially perpendicular to the extending direction of the low power supply wiring (conductor 482). In the case where the source electrode of the transistor 490*b* is connected to the low power supply wiring (conductor 482), the source electrode can be positioned so as to overlap with the low power supply wiring, and the area can be reduced, which is preferred. The direction in which a current flows in the transistor 491*b* (or the direction in which the source electrode, the gate electrode, and the drain electrode of the transistor 491*b* are arranged) may be substantially perpendicular to the extending direction of the high power supply wiring (conductor 480). In the case where the source electrode of the transistor 491*b* is connected to the high power supply wiring (conductor 480), the source electrode can be positioned so as to overlap with the high power supply wiring, and the area can be reduced, which is preferred.

The direction in which a current flows in the transistor 490*a* (or the direction in which the source electrode, the gate electrode, and the drain electrode of the transistor 490*a* are arranged) may be substantially parallel or antiparallel to the direction in which a current flows in the transistor 490*b* (or the direction in which the source electrode, the gate electrode, and the drain electrode of the transistor 490*b* are arranged). When the orientations of the transistors are the same, regular arrangement of the transistors is possible in arranging and wiring the transistors to form a circuit. With such regular arrangement, for example, the height directions of the semiconductor devices (cells) can be the same, and the plurality of cells can be arranged efficiently. Furthermore, when the orientations of the transistors are the same, variations of the electric characteristics of the transistors are small in some cases.

Note that in the case where cells adjacent to or close to each other are connected to input/output terminals, an output terminal for outputting the output signal OUT may directly connect the drain electrode (conductor 416*c*) of the transistor 490*b*, the drain electrode or drain region (region 476*a*) of the transistor 491*a*, or the drain electrode or drain region (region 476*c*) of the transistor 491*b* to input/output terminals of the cells adjacent to or close to each other, not through the conductor 424*a*. One input terminal for inputting the input signal IN may directly connect the gate electrode (conductor 404*a*) of the transistor 490*a* or the gate electrode (conductor 454*a*) of the transistor 491*a* to input/output terminals of the cells adjacent to or close to each other, not through the conductor 424*b*. The other input terminal for inputting the input signal IN may directly connect the gate electrode (conductor 404*b*) of the transistor 490*b* or the gate electrode (conductor 454*b*) of the transistor 491*b* to input/output terminals of the cells adjacent to or close to each other, not through a conductor 424*c*.

In the semiconductor device 511 (cell) in FIG. 16, the transistors 491*a* and 491*b*, the high power supply wiring (conductor 480), the low power supply wiring (conductor 482), and the transistors 490*a* and 490*b* are stacked in this order. In other words, the high power supply wiring (conductor 480) is positioned above the transistors 491*a* and 491*b*, the low power supply wiring (conductor 482) is positioned above and overlaps with the high power supply wiring (conductor 480), and the transistors 490*a* and 490*b* are positioned above the low power supply wiring (conductor 482).

The source electrodes (or the source regions) of the transistors 491*a* and 491*b* are connected to the high power supply wiring (conductor 480); thus, the connection is easy compared with the case where the source electrodes (or the source regions) of the transistors 491*a* and 491*b* are connected to the low power supply wiring (conductor 482) positioned above the high power supply wiring (conductor 480), which is preferred. The source electrode (or the source region) of the transistor 490*a* is connected to the low power supply wiring (conductor 482); thus, the connection is easy compared with the case where the source electrode (or the source region) of the transistor 490*a* is connected to the high power supply wiring (conductor 480) positioned below the low power supply wiring (conductor 482), which is preferred.

Furthermore, in the semiconductor device 511 (cell), the wiring widths of the high power supply wiring (conductor 480) and the low power supply wiring (conductor 482) are each preferably larger than the wiring width of the gate electrode (conductor 454) of the transistor 491, the gate electrode (conductor 404) of the transistor 490, or a signal wiring that transmits input/output signals. Alternatively, the wiring widths of the high power supply wiring (conductor 480) and the low power supply wiring (conductor 482) are each preferably larger than the width of the wiring (conductor) connected to an input terminal and the width of the wiring (conductor) connected to an output terminal. This is because the power supply wiring supplies a larger amount of current than the signal wiring in many cases and preferably has lower wiring resistance than the signal wiring.

Note that the semiconductor device illustrated in FIG. 18 has a cross-sectional structure similar to that of the semiconductor device illustrated in FIG. 5. Thus, for the semiconductor device illustrated in FIG. 18, the description of the transistor illustrated in FIG. 5 can be referred to as appropriate.

Note that this embodiment can be combined as appropriate with the other embodiments described in this specification.

Embodiment 6

The transistor 490 can have a variety of structures. In this embodiment, for easy understanding, only the transistor 490 and a region in the vicinity thereof are extracted and illustrated in FIG. 33 and FIG. 34.

Figure 33A:
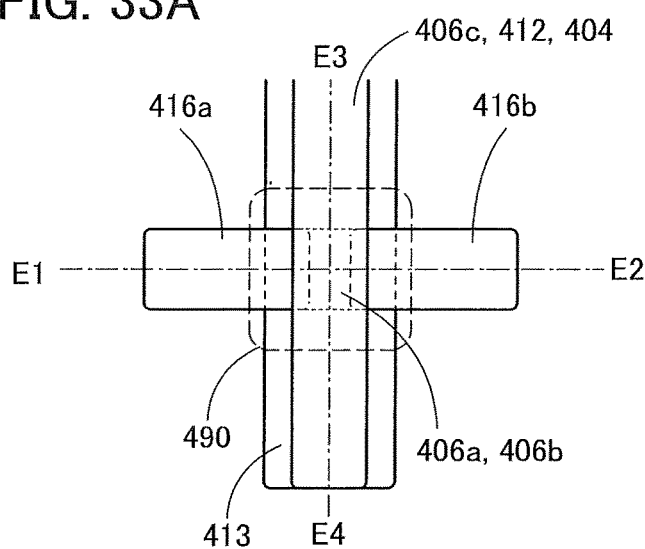
FIGS. 33A-33B are cross-sectional views illustrating a transistor.
Figure 33B:
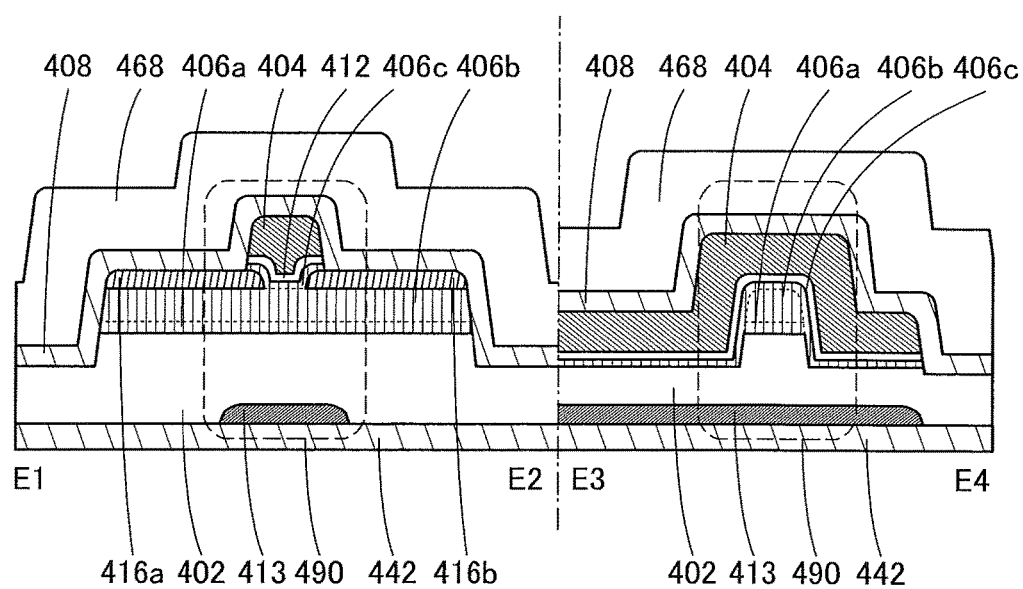

FIG. 33(A) is an example of the top view of the transistor 490. FIG. 33(B) shows an example of a cross-sectional view taken along dashed-dotted line E1-E2 and dashed-dotted line E3-E4 in FIG. 33(A). Note that a portion such as an insulator is omitted in FIG. 33(A) for easy understanding.

Although FIG. 4 and the like illustrate an example where the conductor 416*a* and the conductor 416*b* which serve as a source electrode and a drain electrode are in contact with a top surface and a side surface of the semiconductor 406*b*, a top surface of the insulator 402, and the like, a transistor structure relating to one embodiment of the present invention is not limited to this. For example, as illustrated in FIG. 33, the conductor 416*a* and the conductor 416*b* may be in contact with only the top surface of the semiconductor 406*b*.

In the transistor illustrated in FIG. 33, the conductor 416*a* and the conductor 416*b* are not in contact with side surfaces of the semiconductor 406*b*. Thus, it is a structure where an electric field applied from the conductor 404 having a function as a gate electrode to the side surfaces of the semiconductor 406*b* is less likely to be blocked by the conductor 416*a* and the conductor 416*b*. Furthermore, the conductor 416*a* and the conductor 416*b* are not in contact with a top surface of the insulator 402. Thus, excess oxygen (oxygen) released from the insulator 402 is not consumed to oxidize 416*a* and the conductor 416*b*. Accordingly, it is a structure where excess oxygen (oxygen) released from the insulator 402 can be efficiently used to reduce oxygen vacancies in the semiconductor 406*b*. In other words, the transistor having the structure illustrated in FIG. 33 has excellent electrical characteristics such as a high on-state current, high field-effect mobility, a low subthreshold swing value, and high reliability.

Figure 34A:
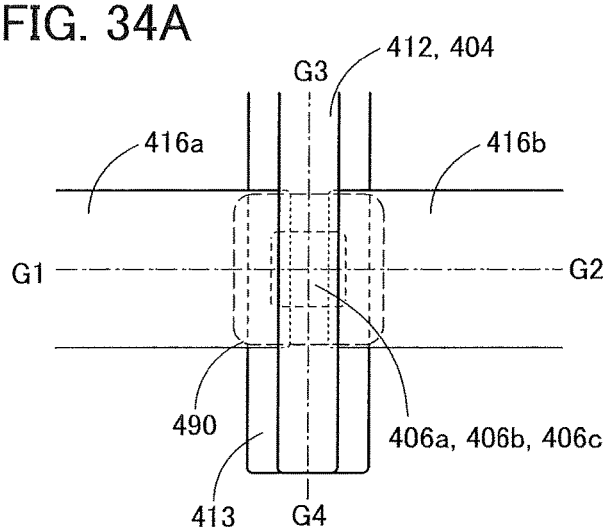
FIGS. 34A-34B are cross-sectional views illustrating a transistor.
Figure 34B:
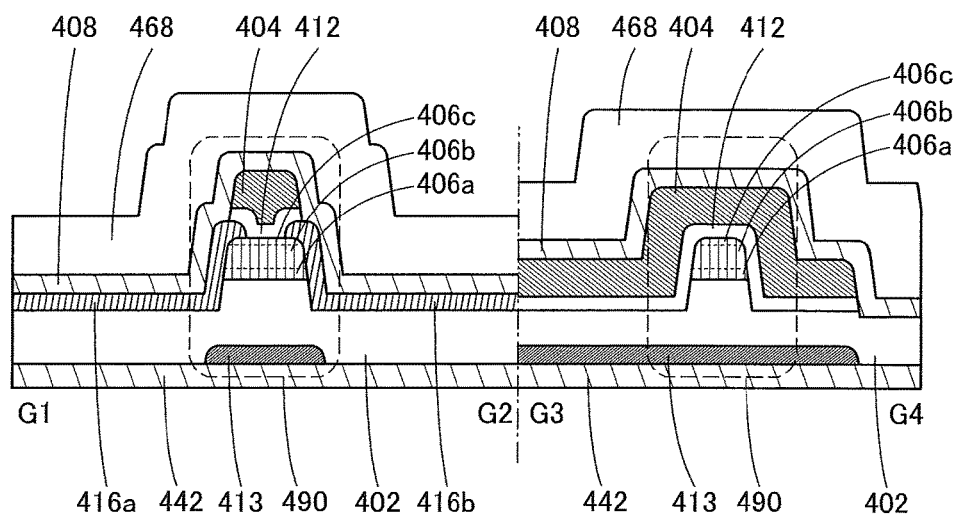

FIG. 34(A) is an example of the top view of the transistor 490. FIG. 34(B) illustrates an example of a cross-sectional view taken along dashed-dotted line G1-G2 and dashed-dotted line G3-G4 in FIG. 34(A). Note that a portion such as an insulator is omitted in FIG. 34(A) for easy understanding.

The transistor 490 illustrated in FIG. 34(A) and FIG. 34(B) includes the conductor 413 over the insulator 442; the insulator 402 having a projection over the insulator 442 and the conductor 413; the semiconductor 406*a* over the projection of the insulator 402; the semiconductor 406*b* over the semiconductor 406*a*; the semiconductor 406*c* over the semiconductor 406*b*; the conductor 416*a* and the conductor 416*b* which are in contact with the semiconductor 406*a*, the semiconductor 406*b*, and the semiconductor 406*c* and which are arranged at intervals; the insulator 412 over the semiconductor 406*c*, the conductor 416*a*, and the conductor 416*b*; the conductor 404 over the insulator 412; the insulator 408 over the conductor 416*a*, the conductor 416*b*, the insulator 412, and the conductor 404; and the insulator 468 over the insulator 408.

Note that the insulator 412 is in contact with at least side surfaces of the semiconductor 406*b* in the cross section along G3-G4. In addition, the conductor 404 faces the top surface and the side surfaces of the semiconductor 406*b* with at least the insulator 412 therebetween in the cross section along G3-G4. Furthermore, the conductor 413 faces the bottom surface of the semiconductor 406*b* with the insulator 402 therebetween. Furthermore, the insulator 402 does not necessarily include a projection. Furthermore, the semiconductor 406*c* is not necessarily included. Furthermore, the insulator 408 is not necessarily included. Furthermore, the insulator 468 is not necessarily included.

The transistor 490 illustrated in FIG. 34 is different from the transistor 490 in FIG. 4 only in a part of the structure. Specifically, the structures of the semiconductor 406*a*, the semiconductor 406*b*, and the semiconductor 406*c* of the transistor 490 illustrated in FIG. 4 are different from the structures of the semiconductor 406*a*, the semiconductor 406*b*, and the semiconductor 406*c* of the transistor 490 in FIG. 34. Thus, for the transistor illustrated in FIG. 34, the description of the transistor illustrated in FIG. 4 can be referred to as appropriate.

Although an oxide semiconductor can be used for, for example, a channel or the like of the transistor 490 in this embodiment, one embodiment of the present invention is not limited thereto. For example, depending on cases or conditions, a channel, the vicinity thereof, a source region, a drain region, or the like of the transistor 490 may be formed using a material containing Si (silicon), Ge (germanium), SiGe (silicon germanium), GaAs (gallium arsenide), or the like.

For example, in this specification and the like, transistors such as the transistor 490 and the transistor 491 can be formed using any of a variety of substrates. The type of a substrate is not limited to a certain type. An example of the substrate is a semiconductor substrate (e.g., a single crystal substrate or a silicon substrate), an SOI (Silicon on insulator) substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like. An example of a glass substrate is barium borosilicate glass, aluminoborosilicate glass, soda lime glass, or the like. Examples of a flexible substrate, an attachment film, a base material film, and the like are as follows. For example, there is plastic typified by polyethylene terephthalate (PET), polyethylene naphthalate (PEN), and polyether sulfone (PES). Another example is a synthetic resin such as acrylic. Another example is polypropylene, polyester, polyvinyl fluoride, polyvinyl chloride, or the like. Another example is polyamide, polyimide, aramid, epoxy, an inorganic vapor deposition film, paper, or the like. In particular, the use of semiconductor substrates, single crystal substrates, SOI substrates, or the like enables the manufacture of small-sized transistors with a small variation in characteristics, size, shape, or the like and with high current capability. A circuit foimed using such transistors can achieve lower power consumption of the circuit or higher integration of the circuit.

Alternatively, a flexible substrate may be used as the substrate, and the transistor may be formed directly on the flexible substrate. Alternatively, a separation layer may be provided between the substrate and the transistor. The separation layer can be used when part or the whole of a semiconductor device folioed thereover is separated from the substrate and transferred onto another substrate. In such a case, the transistor can be transferred to a substrate having low heat resistance or a flexible substrate as well. Note that for the above separation layer, a structure of a stack of inorganic films, a tungsten film and a silicon oxide film, a structure in which an organic resin film of polyimide or the like is formed over a substrate, or the like can be used, for example.

In other words, a transistor may be formed using one substrate, and then transferred another substrate to be positioned on the another substrate. An example of a substrate to which a transistor is transferred is, in addition to the above substrate over which the transistor can be formed, a paper substrate, a cellophane substrate, an aramid film substrate, a polyimide film substrate, a stone substrate, a wood substrate, a cloth substrate (including a natural fiber (silk, cotton, or hemp), a synthetic fiber (nylon, polyurethane, or polyester), a regenerated fiber (acetate, cupra, rayon, or regenerated polyester), and the like), a leather substrate, a rubber substrate, or the like. When such a substrate is used, a transistor with excellent properties or a transistor with low power consumption can be formed, a device that is less likely to be broken can be manufactured, high heat resistance can be provided, or reduction in weight or thickness can be achieved.

Embodiment 7

A structure of an oxide semiconductor that can be applied to the semiconductor 406a, the semiconductor 406b, the semiconductor 406c, or the like will be described below. Note that in this specification, a crystal that is trigonal or rhombohedral is represented as the hexagonal system.

Oxide semiconductors are classified roughly into a non-single-crystal oxide semiconductor and a single-crystal oxide semiconductor. The non-single-crystal oxide semiconductor refers to a CAAC-OS (C Axis Aligned Crystalline Oxide Semiconductor), a polycrystalline oxide semiconductor, a microcrystalline oxide semiconductor, an amorphous oxide semiconductor, and the like.

First, a CAAC-OS will be described.

A CAAC-OS is an oxide semiconductor having a plurality of c-axis aligned crystal parts.

When the CAAC-OS is observed with a transmission electron microscope (TEM), a boundary between crystal parts, that is, a crystal grain boundary (also referred to as a grain boundary) is not clearly observed. Thus, it can be said that a reduction in electron mobility due to the crystal grain boundary is less likely to occur in the CAAC-OS.

When the CAAC-OS is observed in the direction substantially parallel to a sample surface with a TEM (cross-sectional TEM observation), it can be found that metal atoms are arranged in a layered manner in the crystal parts. Each metal atom layer has a shape reflecting unevenness of a surface over which the CAAC-OS is formed (also referred to as a formation surface) or the top surface, and is arranged parallel to the formation surface or the top surface of the CAAC-OS.

On the other hand, when the CAAC-OS is observed with TEM in the direction substantially perpendicular to the sample surface (plan TEM observation), it can be found that metal atoms are arranged in a triangular or hexagonal arrangement in the crystal parts. However, metal atoms are not necessarily arranged regularly between different crystal parts.

Figure 35A:
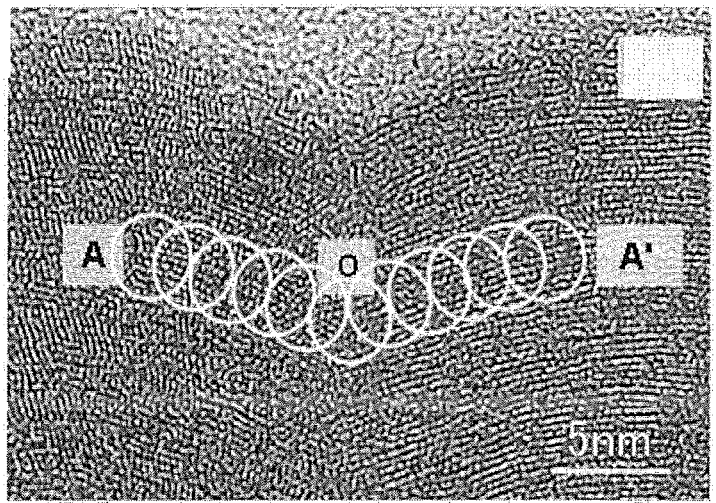
FIGS. 35A-35C are cross-sectional TEM images and a local Fourier transform image of an oxide semiconductor.
Figure 35B:
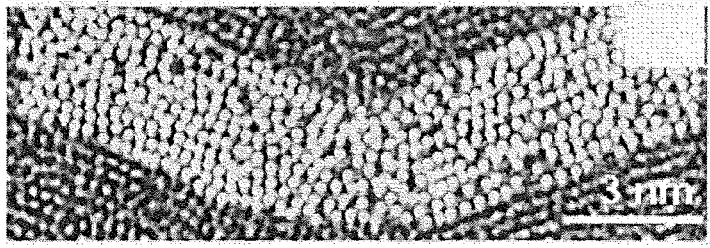
Figure 35C:
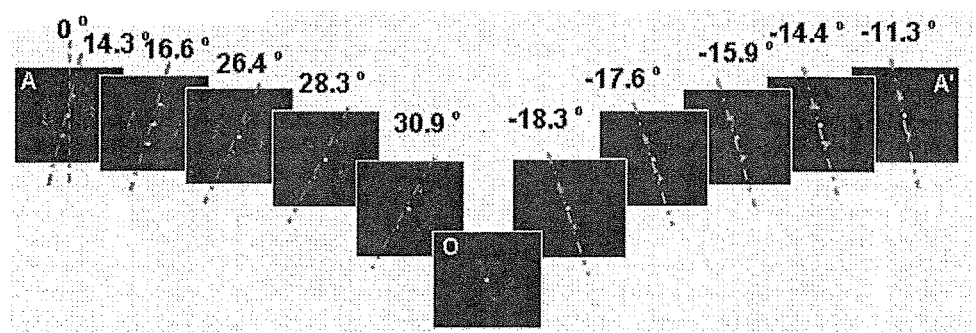

FIG. 35(*a*) is a cross-sectional TEM image of a CAAC-OS. In addition, FIG. 35(*b*) is a cross-sectional TEM image obtained by further enlarging FIG. 35(*a*), and atomic arrangement is highlighted for easy understanding.

FIG. 35(*c*) is local Fourier transform images of regions each surrounded by a circle (the diameter is approximately 4 nm) between A-O-A' in FIG. 35(*a*). Further, c-axis alignment can be observed in each region in FIG. 35(*c*). Furthermore, the c-axis direction between A-O is different from that between O-A', which indicates that they are different grains. In addition, it is found that between A-O, the angle of the c-axis continuously and gradually changes from 14.3°, 16.6° to 26.4°. Similarly, it is found that between O-A', the angle of the c-axis continuously and gradually changes from −18.3°, −17.6°, to −15.9°.

Note that when the CAAC-OS film is subjected electron diffraction, spots (bright spots) having alignment are observed. For example, spots are observed when the top surface of the CAAC-OS film is subjected to electron diffraction (also referred to as nanobeam electron diffraction) using an electron beam of, for example, larger than or equal to 1 nm and smaller than or equal to 30 nm (see FIG. 36(A)).

By the cross-sectional TEM observation and the plan TEM observation, the crystal parts in the CAAC-OS film are found to have alignment.

Note that most of the crystal parts included in the CAAC-OS have a size such that each fits inside a cube whose one side is less than 100 nm. Thus, there is a case where a crystal part included in the CAAC-OS has a size such that it fits inside a cube whose one side is less than 10 nm, less than 5 nm, or less than 3 nm. Note that when a plurality of crystal parts included in the CAAC-OS are connected to each other, one large crystal region is formed in some cases. For example, a crystal region of 2500 nm$^2$ or more, 5 μm$^2$ or more, or 1000 μm$^2$ or more is observed in some cases in the plan TEM image.

A CAAC-OS is subjected to structural analysis with an X-ray diffraction (XRD: X-Ray Diffraction) apparatus. For example, when the CAAC-OS including an InGaZnO$_4$ crystal is analyzed by an out-of-plane method, a peak appears when the diffraction angle (2θ) is around 31°. This peak is derived from the (009) plane of the InGaZnO$_4$ crystal; thus, it can be found that crystals in the CAAC-OS have c-axis alignment, and that the c-axes are aligned in the direction substantially perpendicular to the formation surface or the top surface.

On the other hand, when the CAAC-OS is analyzed by an in-plane method in which an X-ray enters in the direction substantially perpendicular to the c-axis, a peak appears when 2θ is around 56°. This peak is derived from the (110) plane of the InGaZnO$_4$ crystal. In the case of a single-crystal oxide semiconductor film of InGaZnO$_4$, when analysis (φ scan) is performed under conditions where the sample is rotated around a normal vector of a sample surface as an axis (φ axis) with 2θ fixed at around 56°, six peaks derived from crystal planes equivalent to the (110) plane are observed. On the other hand, in the case of a CAAC-OS, a clear peak does not appear even when φ scan is performed with 2θ fixed at around 56°.

According to the above, it is found that in the CAAC-OS, while the directions of a-axes and b-axes are irregular between different crystal parts, it has c-axis alignment and the c-axes are aligned in the direction parallel to a normal vector of the formation surface or a normal vector of the top surface. Thus, each metal atom layer arranged in a layered manner observed by the cross-sectional TEM observation is a plane parallel to the a-b plane of the crystal.

Note that the crystal part is formed when the CAAC-OS film is formed or crystallization treatment such as heat treatment is performed. As described above, the c-axis of the crystal is aligned in the direction parallel to a normal vector of the formation surface or the top surface of the CAAC-OS. Thus, for example, in the case where a shape of the CAAC-OS is changed by etching or the like, the c-axis of the crystal may not be necessarily parallel to a normal vector of the formation surface or the top surface of the CAAC-OS.

Furthermore, the distribution of c-axis aligned crystal parts in the CAAC-OS is not necessarily uniform. For example, in the case where crystal growth occurs from the vicinity of the top surface of the CAAC-OS, the proportion of the c-axis aligned crystal parts in the vicinity of the top surface is higher than that of a region in the vicinity of the formation surface in some cases. Furthermore, in the CAAC-OS to which an impurity is added, an impurity-added region is altered, and a region with a different proportion of the c-axis aligned crystal parts may be partly formed.

Note that when the CAAC-OS with an InGaZnO$_4$ crystal is analyzed by an out-of-plane method, a peak of 2θ may also appear at around 36°, in addition to the peak of 2θ at around 31°. The peak of 2θ at around 36° indicates that a crystal having no c-axis alignment is included in part of the CAAC-OS. It is preferred that in the CAAC-OS, a peak of 2θ be shown at around 31° and a peak of 2θ not be shown at around 36°.

The CAAC-OS is an oxide semiconductor film having a low impurity concentration. The impurity is an element other than the main components of the oxide semiconductor, such as hydrogen, carbon, silicon, and a transition metal element. In particular, an element that has higher bonding strength to oxygen than a metal element included in the oxide semiconductor film, such as silicon, disturbs the atomic arrangement of the oxide semiconductor by depriving the oxide semiconductor of oxygen and causes a decrease in crystallinity. Furthermore, heavy metals such as iron and nickel, argon, carbon dioxide, and the like have a large atomic radius (or molecular radius), and thus disturb the atomic arrangement of the oxide semiconductor and causes a decrease in crystallinity when they are contained in the oxide semiconductor. Note that the impurity contained in the oxide semiconductor may serve as a carrier trap or a carrier generation source.

Furthermore, the CAAC-OS is an oxide semiconductor film having a low density of defect states. For example, oxygen vacancies in the oxide semiconductor serve as carrier traps or serve as carrier generation sources in some cases when hydrogen is captured therein.

The state in which the impurity concentration is low and the density of defect states is low (the number of oxygen vacancies is small) is referred to as being highly purified intrinsic or substantially highly purified intrinsic. A highly purified intrinsic or substantially highly purified intrinsic oxide semiconductor has few carrier generation sources, and thus can have a low carrier density. Thus, a transistor using the oxide semiconductor rarely has electric characteristics of negative threshold voltage (also referred to as normally-on). Furthermore, the highly purified intrinsic or substantially highly purified intrinsic oxide semiconductor has few carrier traps. Accordingly, the transistor using the oxide semiconductor has small variations in electric characteristics and high reliability. Note that electric charge trapped by the carrier traps in the oxide semiconductor film takes a long time to be released, and may behave like fixed electric charge. Thus, a transistor using an oxide semiconductor film having a high impurity concentration and a high density of defect states has unstable electric characteristics in some cases.

Furthermore, in a transistor using the CAAC-OS, a change in electric characteristics due to irradiation with visible light or ultraviolet light is small.

Next, a microcrystalline oxide semiconductor will be described.

A crystal part may not be clearly observed in a TEM observation image of a microcrystalline oxide semiconductor. In most cases, the size of a crystal part in the microcrystalline oxide semiconductor is greater than or equal to 1 nm and less than or equal to 100 nm, or greater than or equal to 1 nm and less than or equal to 10 nm. A microcrystal of greater than or equal to 1 nm and less than or equal to 10 nm or greater than or equal to 1 nm and less than or equal to 3 nm is specifically referred to as nanocrystal (nc: nanocrystal). An oxide semiconductor including a nanocrystal is referred to as a nc-OS (nanocrystalline Oxide Semiconductor). In a TEM observation image of nc-OS, for example, a crystal grain boundary cannot be found clearly in some cases.

In the nc-OS, a microscopic region (for example, a region of greater than or equal to 1 nm and less than or equal to 10 nm, in particular, a region of greater than or equal to 1 nm and less than or equal to 3 nm) has a periodic atomic order. Furthermore, no regularity of crystal orientation between different crystal parts is observed in the nc-OS; thus, the orientation of the whole layer is not observed. Accordingly, in some cases, the nc-OS cannot be distinguished from an amorphous oxide semiconductor depending on an analysis method. For example, when the nc-OS is subjected to structural analysis by an out-of-plane method with an XRD apparatus using an X-ray having a diameter larger than a crystal part, a peak which shows a crystal plane is not detected. Furthermore, a diffraction pattern such as a halo pattern is observed when the nc-OS is subjected to electron diffraction using an electron beam having a probe diameter (e.g., larger than or equal to 50 nm) larger than a crystal part (also referred to as in selected-area electron diffraction). In contrast, spots are observed when the nc-OS is subjected to nanobeam electron diffraction using an electron beam having a probe diameter close to, or smaller than or equal to the size of a crystal part. Furthermore, when the nc-OS is subjected to a nanobeam electron diffraction, regions with high luminance in a circular pattern (ring pattern) are observed in some cases. Also when the nc-OS is subjected to nanobeam electron diffraction, a plurality of spots are observed in a ring-like region in some cases (see FIG. 36(B)).

The nc-OS is an oxide semiconductor that has higher regularity than an amorphous oxide semiconductor. Therefore, the nc-OS has a lower density of defect states than an amorphous oxide semiconductor. Note that no regularity of crystal orientation between different crystal parts is observed in the nc-OS; hence, the nc-OS has a higher density of defect states than the CAAC-OS.

Accordingly, the nc-OS has higher carrier density than the CAAC-OS in some cases. An oxide semiconductor with a high carrier density may have high electron mobility. Thus, a transistor using the nc-OS may have high field-effect mobility. Furthermore, the nc-OS has higher density of defect states than the CAAC-OS, and thus may have a lot of carrier traps. Consequently, a transistor using the nc-OS has larger variation in electrical characteristics and lower reliability than a transistor using the CAAC-OS. Note that the nc-OS can be obtained even when the amount of impurity contained therein is relatively large; thus, the nc-OS is easier to form than the CAAC-OS and may preferably be used depending on the application. Therefore, a semiconductor device including the transistor using the nc-OS can be manufactured with high productivity in some cases.

Note that an oxide semiconductor may be a stacked film including two or more of an amorphous oxide semiconductor, a microcrystalline oxide semiconductor, and a CAAC-OS, for example.

As described above, a CAAC-OS has an advantage that a reduction in carrier mobility is less likely to occur because carrier scattering due to a grain boundary is smaller in a CAAC-OS than in a polycrystal or a microcrystal. Furthermore, a CAAC-OS is an oxide semiconductor with a low density of defect states and less carrier traps; therefore, a transistor using a CAAC-OS has small variation in electrical characteristics and thus has high reliability.

In the case where the oxide semiconductor has a plurality of structures, the structures can be analyzed using nanobeam electron diffraction in some cases.

Figure 36A:
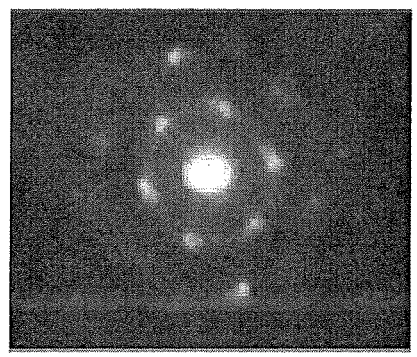
FIGS. 36A-36D are views illustrating a nanobeam electron diffraction pattern of an oxide semiconductor and views illustrating an example of a transmission electron diffraction measurement apparatus.
Figure 36B:
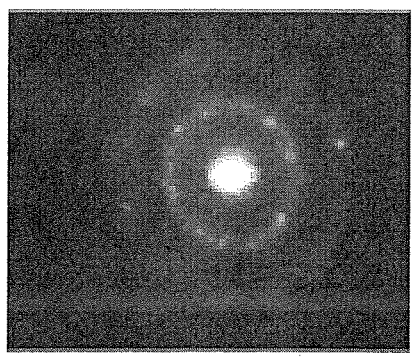
Figure 36C:
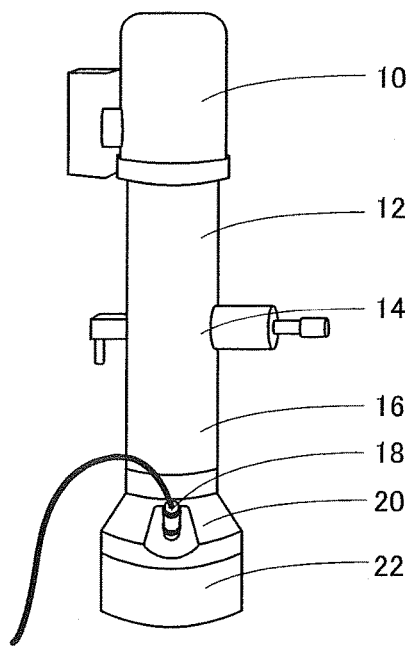

FIG. 36(C) illustrates a transmission electron diffraction measurement apparatus that includes an electron gun chamber 10, an optical system 12 below the electron gun chamber 10, a sample chamber 14 below the optical system 12, an optical system 16 below the sample chamber 14, an observation chamber 20 below the optical system 16, a camera 18 installed in the observation chamber 20, and a film chamber 22 below the observation chamber 20. The camera 18 is provided to face the inside of the observation chamber 20. Note that the film chamber 22 is not necessarily provided.

Figure 36D:
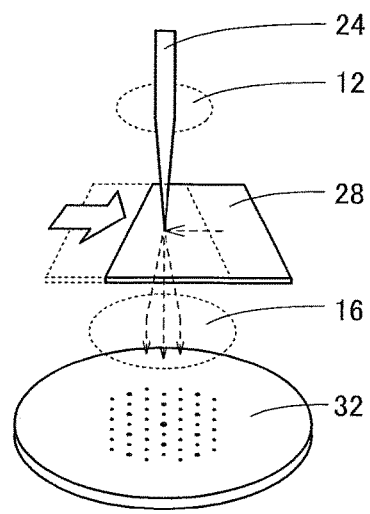

Furthermore, FIG. 36(D) illustrates an internal structure of the transmission electron diffraction measurement apparatus illustrated in FIG. 36(C). In the transmission electron diffraction measurement apparatus, a substance 28 positioned in the sample chamber 14 is irradiated with electrons 24 ejected from an electron gun placed in the electron gun chamber 10 through the optical system 12. The electrons that have passed through the substance 28 enter a fluorescent plate 32 placed in the observation chamber 20 through the optical system 16. On the fluorescent plate 32, a pattern corresponding to the intensity of electron that has entered appears, which allows measurement of a transmission electron diffraction pattern.

The camera 18 is placed toward the fluorescent plate 32 so that a pattern that appears on the fluorescent plate 32 can be taken. An angle formed by a straight line that passes through the center of a lens of the camera 18 and the center of the fluorescent plate 32 and an upper surface of the fluorescent plate 32 is, for example, 15° or more and 80° or less, 30° or more and 75° or less, or 45° or more and 70° or less. As the angle is reduced, distortion of the transmission electron diffraction pattern taken by the camera 18 becomes larger. Note that if the angle is known in advance, the distortion of an obtained transmission electron diffraction pattern can be corrected. Note that the camera 18 may be placed in the film chamber 22. For example, the camera 18 may be placed in the film chamber 22 so as to be opposite to the incident direction of electrons 24. In this case, a transmission electron diffraction pattern with less distortion can be taken from the rear surface of the fluorescent plate 32.

A holder for fixing the substance 28, which is a sample, is placed in the sample chamber 14. The holder is configured to transmit electrons passing through the substance 28. The holder may have, for example, a function of moving the substance 28 to the X axis, the Y axis, the Z axis, and the like. The movement function of the holder may have an accuracy of moving it, for example, in the range from 1 nm to 10 nm, from 5 nm to 50 nm, from 10 nm to 100 nm, from 50 nm to 500 nm, or from 100 nm to 1 μm. These ranges should be determined to be optimal ranges for the structure of the substance 28.

Next, a method for measuring a transmission electron diffraction pattern of a substance by the transmission electron diffraction measurement apparatus described above will be described.

For example, the state where the structure of a substance is changed can be checked by changing (scanning) the irradiation position of the electrons 24, which are a nanobeam in the substance, as illustrated in FIG. 36(D). At this time, when the substance 28 is a CAAC-OS, such a diffraction pattern as is shown in FIG. 36(A) is observed. Alternatively, when the substance 28 is an nc-OS, a ring-like diffraction pattern with bright spots shown in FIG. 36(B) is observed.

A diffraction pattern typically observed in a CAAC-OS, i.e., a diffraction pattern indicating c-axis alignment that is shown in FIG. 36(A) is referred to as a CAAC-structure diffraction pattern. As shown in FIG. 36(A), for example, spots located at the vertices of a hexagon are found in a diffraction pattern of the CAAC-OS. By scanning the irradiation position in the CAAC-OS, the state where the orientation of the hexagon is varied and rotated gradually is observed. In addition, the angle of the rotation has a certain range.

Alternatively, by scanning the irradiation position, the state where the diffraction pattern of the CAAC-OS is gradually rotated around the c-axis is observed. In other words, a plane formed by the a-axis and the b-axis is rotated, for example.

Incidentally, even when the substance 28 is a CAAC-OS, a diffraction pattern similar to that of an nc-OS or the like is partly observed in some cases. Therefore, whether or not a CAAC-OS film is favorable may be able to be represented by the proportion of a region where a diffraction pattern of a CAAC-OS is observed in a certain area (also referred to as the proportion of CAAC or the proportion of change to CAAC). In the case of a high-quality CAAC-OS, for example, the proportion of change to CAAC is higher than or equal to 50%, preferably higher than or equal to 80%, more preferably higher than or equal to 90%, still more preferably higher than or equal to 95% and lower than or equal to 100%. Note that the proportion of an area where a diffraction pattern different from that of a CAAC-OS is observed is referred to as the proportion of non-CAAC or the proportion of change to non-CAAC.

A method for evaluating the CAAC proportion of a CAAC-OS will be described below. Measurement points are randomly selected, transmission electron diffraction patterns are obtained, and the percentage of the number of measurement points where a diffraction pattern of a CAAC structure is observed in the total measurement points is calculated. Here, the number of measurement points is preferably larger than or equal to 50, more preferably larger than or equal to 100.

As a way to randomly select measurement points, for example, the irradiation position may be scanned linearly to obtain diffraction patterns at even time intervals. By scanning the irradiation position, the boundary between a region having a CAAC structure and another region, or the like can be found, which is preferred.

For example, a sample including a CAAC-OS just after deposition (represented as as-sputtered) and a sample including a CAAC-OS after heat treatment at 450° C. in an atmosphere containing oxygen were formed, and transmission electron diffraction patterns were obtained by scanning top surfaces of the samples. Here, the proportion of CAAC was obtained in such a manner that diffraction patterns were observed by performing scanning for 60 seconds at a rate of 5 nm/second and the observed diffraction patterns were converted into still images every 0.5 seconds. Note that as an electron beam, a nanobeam electron beam with a probe diameter of 1 inn was used. Note that similar measurement was performed on six samples. Furthermore, the proportion of CAAC was calculated using the average value of the six samples.

Figure 37A:
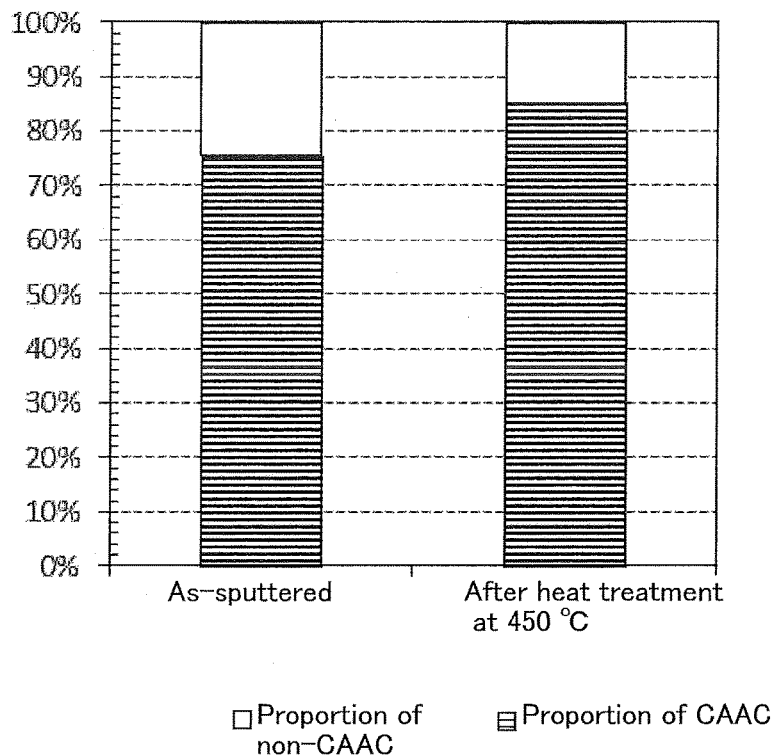
FIGS. 37A-37C are views illustrating an example of structural analysis by transmission electron diffraction measurement and a planar TEM image.

FIG. 37(A) shows the proportion of CAAC in each sample. The proportion of CAAC of the CAAC-OS just after the deposition was 75.7% (the proportion of non-CAAC was 24.3%). In addition, the proportion of CAAC of the CAAC-OS after the heat treatment at 450° C. was 85.3% (the proportion of non-CAAC was 14.7%). It is found that the proportion of CAAC after the heat treatment at 450° C. is higher than that just after the deposition. That is, it is found that heat treatment at a high temperature (e.g., higher than or equal to 400° C.) reduces the proportion of non-CAAC (increases the proportion of CAAC). It is also found that even by heat treatment at lower than 500° C., the CAAC-OS having a high proportion of CAAC is obtained.

Here, most of diffraction patterns different from that of a CAAC-OS were diffraction patterns similar to that of an nc-OS. In addition, an amorphous oxide semiconductor was not able to be observed in the measurement area. Therefore, it is suggested that the region having a structure similar to that of an nc-OS is rearranged by the heat treatment owing to the influence of the structure of the adjacent area, whereby the area becomes CAAC.

Figure 37B:
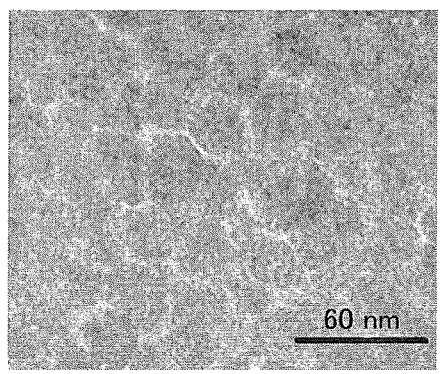
Figure 37C:
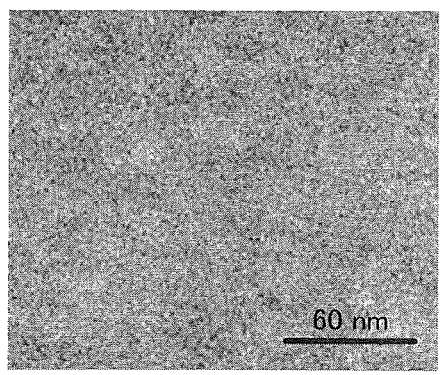

FIG. 37(B) and FIG. 37(C) are planar TEM images of the CAAC-OSs just after the deposition and after the heat treatment at 450° C. Comparison between FIG. 37(B) and FIG. 37(C) shows that the CAAC-OS film after the heat treatment at 450° C. has more uniform film quality. That is, it is found that the heat treatment at a high temperature improves the film quality of the CAAC-OS.

With such a measurement method, the structure of an oxide semiconductor having a plurality of structures can be analyzed in some cases.

Here, the case where the CAAC-OS partly has a region having a structure other than the CAAC structure, such as a region where an nc-structure diffraction pattern is observed or a region where a spinel-type crystal structure diffraction pattern is observed by performing nanobeam electron diffraction, is considered. In such a case, at the boundary between a region where a CAAC-structure diffraction pattern is observed and a region where a diffraction pattern of another structure is observed, for example, carrier scattering may be increased, and the carrier mobility may be reduced. Furthermore, the boundary portion tends to serve as a movement path of impurities and capture impurities easily; thus, there is a concern that the impurity concentration of the CAAC-OS may be increased.

In particular, in the case where the region with a structure other than a CAAC structure is a region with a spinel-type crystal structure, a clear boundary may be observed between a region with a CAAC structure and the region with the structure other than the CAAC structure. Furthermore, the electron mobility at the boundary portion may be reduced owing to carrier scattering or the like. Furthermore, in the case where a conductive film is formed over the CAAC-OS, an element contained in the conductive film, such as a metal element, may diffuse into the boundary between the region with the CAAC structure and the region with the spinel-type crystal structure. In addition, the impurity concentration such as a hydrogen concentration in a film having a spinel-type crystal structure may be increased, and for example, impurities such as hydrogen may be captured in a grain boundary portion. Therefore, it is particularly preferred that a CAAC-OS include no or a small amount of spinel-type crystal structures.

The case where an oxide semiconductor contains an indium oxide semiconductor, an element M, and zinc is considered. Here, the element M is preferably aluminum, gallium, yttrium, tin, or the like. Other elements which can be applied as the element M are boron, silicon, titanium, iron, nickel, germanium, yttrium, zirconium, molybdenum, lanthanum, cerium, neodymium, hafnium, tantalum, tungsten, and the like. Note that a plurality of the above elements may be combined as the element M. A favorable range of the atomic ratio of indium to the element M and zinc, x:y:z, of the oxide semiconductor is described.

It is known that there is a homologous phase (homologous series) represented by $InMO_3(ZnO)_m$ (m is a natural number) as an oxide containing indium, the element M, and zinc. Here, for example, the case where the element M is Ga is considered.

For example, a compound represented by $ZnM_2O_4$, such as $ZnGa_2O_4$, is known as a compound having a spinel-type crystal structure. Furthermore, when a composition is in the neighborhood of $ZnGa_2O_4$, that is, x, y, and z in $Zn_xGa_yO_z$ have values close to (x, y, z)=(0, 1, 2), a spinel-type crystal structure is likely to be formed or mixed. Here, the oxide semiconductor is preferably a CAAC-OS. Furthermore, it is particularly preferred that the CAAC-OS include no spinel-type crystal structure. In addition, to increase carrier mobility, the content of In is preferably increased. In an oxide semiconductor containing indium, the element M, and zinc, the s orbital of heavy metal mainly contributes to carrier transfer. When the indium content is increased, more s orbitals overlap. Therefore, an oxide having a high content of indium has higher mobility than an oxide having a low content of indium. Therefore, an oxide having a high content of indium is used as an oxide semiconductor, whereby carrier mobility can be increased.

For example, the proportion of indium atoms is increased compared with other metal elements, whereby carrier mobility can be increased, which is preferred. For example, in the case where the atomic ratio of indium, the element M, and zinc is represented by x:y:z, x is preferably 1.75 times or more of y.

Furthermore, to further increase the CAAC proportion of the oxide semiconductor, the proportion of zinc atoms is preferably increased compared with other metal elements. For example, when the atomic ratio of an In—Ga—Zn oxide is within the range which allows a solid solution range, the CAAC proportion can be further increased in some cases. The range which allows a solid solution range tends to be widened when the ratio of the number of zinc atoms to the total number of indium and gallium atoms is increased. Therefore, when the ratio of the number of zinc atoms to the total number of indium and gallium atoms is increased, the CAAC proportion of the oxide semiconductor can be increased in some cases. For example, in the case where the atomic ratio of indium, the element M, and zinc contained in an oxide semiconductor is represented by x:y:z, z is preferably 0.5 times or more of x+y. On the other hand, to increase the proportion of indium atoms and increase carrier mobility, z is preferably two times or less of x+y.

As a result, the proportion of observation of a spinel-type crystal structure by nanobeam electron diffraction can be eliminated or significantly lowered. Thus, an excellent CAAC-OS can be obtained. Furthermore, carrier scattering or the like at the boundary between a CAAC structure and a spinel-type crystal structure can be reduced; therefore, when the oxide semiconductor is used for a transistor, the transistor with high field-effect mobility can be obtained. In addition, the transistor with high reliability can be obtained.

As a result, an oxide semiconductor having a high CAAC proportion can be obtained. That is, a good-quality CAAC-OS can be obtained. Furthermore, a CAAC-OS having no or a very small region in which a spinel-type crystal structure is observed can be obtained. For example, the CAAC proportion of a good-quality CAAC-OS is higher than or equal to 50%, preferably higher than or equal to 80%, more preferably higher than or equal to 90%, still more preferably higher than or equal to 95% and lower than or equal to 100%.

Furthermore, in the case where the oxide semiconductor is formed by a sputtering method, a film having an atomic ratio deviated from the atomic ratio of the target may be formed. Especially as for zinc, the proportion of zinc atoms of a film is smaller than the proportion of zinc atoms of the target in some cases. Specifically, it may be 40 atomic % or more and approximately 90 atomic % or less of the proportion of zinc atoms contained in the target.

Thus, the proportion of zinc atoms of the target is preferably higher than that of an oxide semiconductor obtained by a sputtering method.

Note that the oxide semiconductor may be a stack of a plurality of films. Furthermore, the CAAC proportions of the respective plurality of films may be different from each other. Furthermore, in at least one-layer film of the stacked plurality of films, for example, the CAAC proportion is preferably as high as 90%, more preferably higher than or equal to 95%, still more preferably higher than or equal to 97% and lower than or equal to 100%.

The above is the structure of an oxide semiconductor that can be applied to the semiconductor 406a, the semiconductor 406b, the semiconductor 406c, or the like.

Next, the other components of a semiconductor that can be applied to the semiconductor 406a, the semiconductor 406b, the semiconductor 406c, or the like will be described.

The oxide semiconductor that can be applied to the semiconductor 406b is, for example, an oxide semiconductor containing indium. The semiconductor 406b can have high carrier mobility (electron mobility) by containing indium, for example. Furthermore, the semiconductor 406b preferably contains an element M. The element M is preferably aluminum, gallium, yttrium, tin, or the like. Other elements that can be applied to the element M are boron, silicon, titanium, iron, nickel, germanium, yttrium, zirconium, molybdenum, lanthanum, cerium, neodymium, hafnium, tantalum, tungsten, and the like. Note that a plurality of the above elements may be combined as the element M. The element M is an element having a high bonding energy with oxygen, for example. For example, it is an element whose bonding energy with oxygen is higher than that of indium. Alternatively, the element M is an element that can increase the energy gap of the oxide semiconductor, for example. Furthermore, the semiconductor 406b preferably contains zinc. When containing zinc, the oxide semiconductor is easily to be crystallized in some cases.

For the semiconductor 406b, an oxide with a wide energy gap is used, for example. For example, the energy gap of the semiconductor 406b is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

The semiconductor 406a, the semiconductor 406b, and the semiconductor 406c preferably include at least indium. Note that when the semiconductor 406a is an In-M-Zn oxide and a summation of In and M is assumed to be 100 atomic %, In and M are preferably set to be less than 50 atomic % and greater than or equal to 50 atomic %, respectively, or more preferably less than 25 atomic % and greater than or equal to 75 atomic %, respectively. In addition, when the semiconductor 406b is an In-M-Zn oxide and a summation of In and M is assumed to be 100 atomic %, In and M are preferably set to be greater than or equal to 25 atomic % and less than 75 atomic %, respectively, or more preferably greater than or equal to 34 atomic % and less than 66 atomic %, respectively. In addition, when the semiconductor 406c is an In-M-Zn oxide and a summation of In and M is assumed to be 100 atomic %, In and M are preferably set to be less than 50 atomic % and greater than or equal to 50 atomic %, respectively, or more preferably less than 25 atomic % and greater than 75 atomic %, respectively. Note that an oxide that is a type the same as that of the semiconductor 406a may be used as the semiconductor 406c.

As the semiconductor 406b, an oxide having an electron affinity higher than those of the semiconductor 406a and the semiconductor 406c is used. For example, as the semiconductor 406b, an oxide having an electron affinity higher than those of the semiconductor 406a and the semiconductor 406c by 0.07 eV or higher and 1.3 eV or lower, preferably 0.1 eV or higher and 0.7 eV or lower, more preferably 0.15 eV or higher and 0.4 eV or lower is used. Note that the electron affinity refers to an energy gap between the vacuum level and the bottom of the conduction band.

Note that an indium gallium oxide has a low electron affinity and a high oxygen-blocking property. Therefore, the semiconductor 406c preferably includes an indium gallium oxide. The gallium atomic ratio [Ga/(In+Ga)] is, for example, higher than or equal to 70%, preferably higher than or equal to 80%, or more preferably higher than or equal to 90%.

At this time, when an electric field is applied to a gate electrode, a channel is formed in the oxide semiconductor 406b having the highest electron affinity among the oxide semiconductor 406a, the oxide semiconductor 406b, and the oxide semiconductor 406c. Thus, the field effect mobility of the transistor can be increased. Here, the semiconductor 406b and the semiconductor 406c have the common constituent elements and thus interface scattering hardly occurs.

Figure 38A:
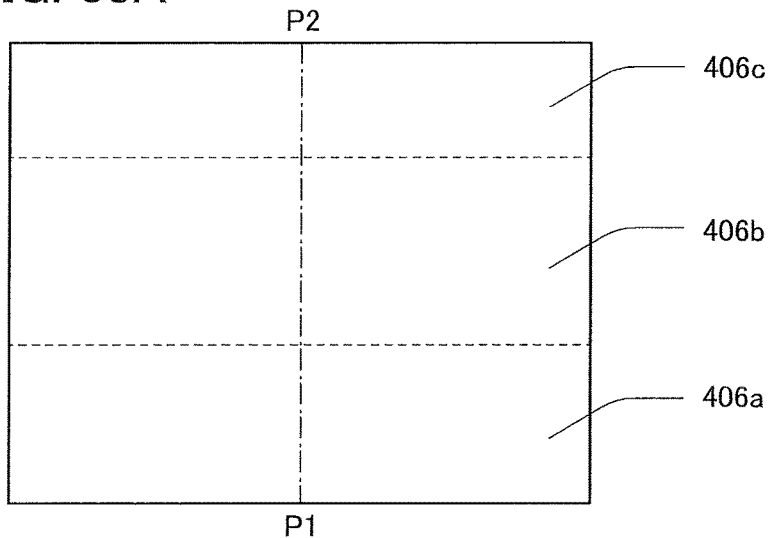
FIGS. 38A-38C are cross-sectional views illustrating a stack of semiconductors and views illustrating a band structure.
Figure 38B:
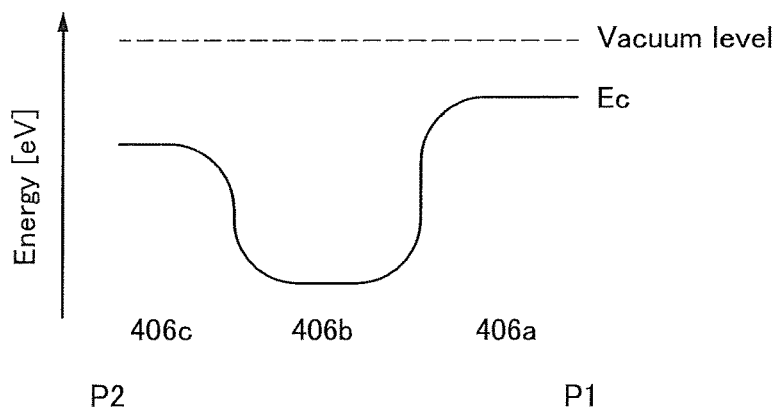
Figure 38C:
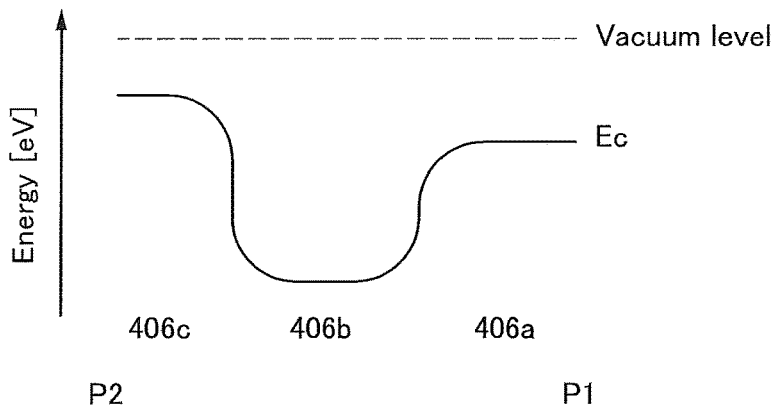

Here, in some cases, there is a mixed region of the semiconductor 406a and the semiconductor 406b between the semiconductor 406a and the semiconductor 406b. Furthermore, in some cases, there is a mixed region of the semiconductor 406b and the semiconductor 406c between the semiconductor 406b and the semiconductor 406c. The mixed region has a low interface state density. For this reason, the stack of the semiconductor 406a, the semiconductor 406b, and the semiconductor 406c has a band structure where energy in the vicinity of each interface is changed continuously (also referred to as continuous junction). Note that FIG. 38(A) is a cross-sectional view in which the semiconductor 406a, the semiconductor 406b, and the semiconductor 406c are stacked in this order. FIG. 38(B) is energy (Ec) at the bottom of the conduction band corresponding to the dashed-dotted line P1-P2 in FIG. 38(A), and shows the case where the semiconductor 406c has a higher electron affinity than the semiconductor 406a. In addition, FIG. 38(C) shows the case where the semiconductor 406c has a lower electron affinity than the semiconductor 406a.

At this time, electrons move mainly in the semiconductor 406b, not in the semiconductor 406a and the semiconductor 406c. As described above, when the interface state density at the interface between the semiconductor 406a and the semiconductor 406b and the interface state density at the interface between the semiconductor 406b and the semiconductor 406c are decreased, electron movement in the semiconductor 406b is less likely to be inhibited and the on-state current of the transistor 490 can be increased.

For example, the semiconductor 406a and the semiconductor 406c are oxide semiconductors including one or more kinds of elements other than oxygen included in the semiconductor 406b. Since the semiconductor 406a and the semiconductor 406c with one or more kinds of elements other than oxygen included in the semiconductor 406b are included, an interface state is less likely to be formed at the interface between the semiconductor 406a and the semiconductor 406b and the interface between the semiconductor 406b and the semiconductor 406c.

Furthermore, the semiconductor 406a, the semiconductor 406b, and the semiconductor 406c preferably include no or a small amount of spinel crystal structures. Moreover, the semiconductor 406a, the semiconductor 406b, and the semiconductor 406c are preferably CAAC-OSs.

For example, when a CAAC-OS having a plurality of c-axis aligned crystal parts is used as the semiconductor 406a, the semiconductor 406b formed thereover can have a region with favorable c-axis alignment even in the vicinity of the interface with the semiconductor 406a.

In addition, by increasing the CAAC proportion of the CAAC-OS, defects can be further reduced, for example. Furthermore, for example, an area having a spinel structure can be reduced. Moreover, for example, carrier scattering can be reduced. In addition, it can be a film having a high blocking property against impurities. Accordingly, when the CAAC proportion of the semiconductor 406a and the semiconductor 406c is increased, a favorable interface with the semiconductor 406b where the channel is formed can be formed, so that carrier scattering can be suppressed to be low. Furthermore, mixing of impurities to the semiconductor 406b can be suppressed, and the impurity concentration of the semiconductor 406b can be reduced.

Note that the electron movement is also inhibited, for example, in the case where the defect state density is high in a region where a channel is formed.

For example, in the case where the semiconductor 406b contains oxygen vacancies (also denoted by $V_O$), donor levels are formed by entry of hydrogen into sites of oxygen vacancies in some cases. A state in which hydrogen enters sites of oxygen vacancies are denoted by $V_O$H below in some cases. $V_O$H is a factor of decreasing the on-state current of the transistor 490 because $V_O$H scatters electrons. Note that sites of oxygen vacancies become more stable by entry of oxygen than by entry of hydrogen. Thus, by decreasing oxygen vacancies in the semiconductor 406b, the on-state current of the transistor 490 can be increased in some cases.

To decrease oxygen vacancies in the semiconductor 406b, for example, there are a method in which excess oxygen in the insulator 402 is moved to the semiconductor 406b through the semiconductor 406a and the like. In this case, the semiconductor 406a is preferably a layer having an oxygen-transmitting property (a layer through which oxygen passes or is transmitted).

Oxygen is released from the insulator 402 and taken into the semiconductor 406a by heat treatment or the like. Note that in some cases, oxygen exists and is apart from atoms in the semiconductor 406a, or exists and is bonded to another oxygen or the like. As the density is lower, i.e., the number of spaces between the atoms is larger, the semiconductor 406a has a higher oxygen-transmitting property. For example, in the case where the semiconductor 406a has a layered crystal structure and oxygen movement in which oxygen crosses the layer is less likely to occur, the semiconductor 406a is preferably a layer having low crystallinity as appropriate.

The semiconductor 406a preferably has crystallinity such that excess oxygen (oxygen) is transmitted so that excess oxygen (oxygen) released from the insulator 402 reaches the semiconductor 406b. For example, in the case where the semiconductor 406a is a CAAC-OS, a structure in which a space is partly provided is preferably employed because when the whole layer becomes CAAC, excess oxygen (oxygen) cannot be transmitted. For example, the proportion of CAAC of the semiconductor 406a is lower than 100%, preferably lower than 98%, more preferably lower than 95%, still more preferably lower than 90%. Note that to reduce the interface state density at the interface between the semiconductor 406a and the semiconductor 406b, the proportion of CAAC of the semiconductor 406a is higher than or equal to 10%, preferably higher than or equal to 20%, more preferably higher than or equal to 50%, still more preferably higher than or equal to 70%.

Moreover, the thickness of the semiconductor 406c is preferably as small as possible to increase the on-state current of the transistor 490. The semiconductor 406c should include a region with less than 10 nm, preferably less than or equal to 5 nm, more preferably less than or equal to 3 nm, for example. Meanwhile, the semiconductor 406c has a function of blocking entry of elements other than oxygen (such as hydrogen and silicon) included in the adjacent insulator into the semiconductor 406b where a channel is formed. For this reason, it is preferred that the semiconductor 406c have a certain thickness. The semiconductor 406c should include a region with a thickness of greater than or equal to 0.3 nm, preferably greater than or equal to 1 nm, more preferably greater than or equal to 2 nm, for example. Furthermore, the semiconductor 406c preferably has an oxygen blocking property to suppress outward diffusion of oxygen released from the insulator 402 and the like.

Furthermore, to improve reliability, it is preferred that the semiconductor 406a be thick and the semiconductor 406c be thin. For example, the semiconductor 406a should have a region with a thickness of, for example, greater than or equal to 10 nm, preferably greater than or equal to 20 nm, more preferably greater than or equal to 40 nm, still more preferably greater than or equal to 60 nm. When the thickness of the semiconductor 406a is made large, a distance from an interface between the adjacent insulator and the semiconductor 406a to the semiconductor 406b in which a channel is formed can be large. Since the productivity of the semiconductor device may be decreased, the semiconductor 406a should have a region with a thickness of, for example, less than or equal to 200 nm, preferably less than or equal to 120 nm, more preferably less than or equal to 80 nm.

For example, a region in which the concentration of silicon by, for example, secondary ion mass spectrometry (SIMS: Secondary Ion Mass Spectrometry) is lower than $1\times10^{19}$ atoms/cm$^3$, preferably lower than $5\times10^{18}$ atoms/cm$^3$, or more preferably lower than $2\times10^{18}$ atoms/cm$^3$ is included between the semiconductor 406b and the semiconductor 406a. Furthermore, a region with a silicon concentration of lower than $1\times10^{19}$ atoms/cm$^3$, preferably lower than $5\times10^{18}$ atoms/cm$^3$, more preferably lower than $2\times10^{18}$ atoms/cm$^3$ which is measured by SIMS is included between the semiconductor 406b and the semiconductor 406c.

Furthermore, it is preferred that the concentration of hydrogen in the semiconductor 406a and the semiconductor 406c be reduced in order to reduce the concentration of hydrogen in the semiconductor 406b. The semiconductor 406a and the semiconductor 406c have a region in which the concentration of hydrogen by SIMS is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. Furthermore, it is preferred that the concentration of nitrogen in the semiconductor 406a and the semiconductor 406c be reduced in order to reduce the concentration of nitrogen in the semiconductor 406b. The semiconductor 406a and the semiconductor 406c have a region in which the concentration of nitrogen by SIMS is lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

The above are a structure and other components of an oxide semiconductor that can be applied to the semiconductor 406a, the semiconductor 406b, the semiconductor 406c, or the like. When such an oxide semiconductor as described above is used as the semiconductor 406a, the semiconductor 406b, the semiconductor 406c, or the like, the transistor 490 can have favorable electric characteristics. For example, favorable switching speed can be achieved. The switching speed of the transistor 490 is, for example, less than 10 ns, preferably less than 1 ns, more preferably less than 0.1 ns. Furthermore, the use of a p-channel Si transistor with a favorable switching speed as the transistor 490 can increase the operating speed of the semiconductor device (cell) of one embodiment of the present invention. The switching speed of the p-channel Si transistor is, for example, less than 10 ns, preferably less than 1 ns, more preferably less than 0.1 ns. Furthermore, for example, the delay time of an inverter or a NAND circuit which is the semiconductor device (cell) of one embodiment of the present invention is less than 10 ns, preferably less than 1 ns, more preferably less than 0.1 ns.

Embodiment 8

An example of the structure of a semiconductor device using the semiconductor device (cell) of one embodiment of the present invention will be described using FIG. 21.

Figure 21:
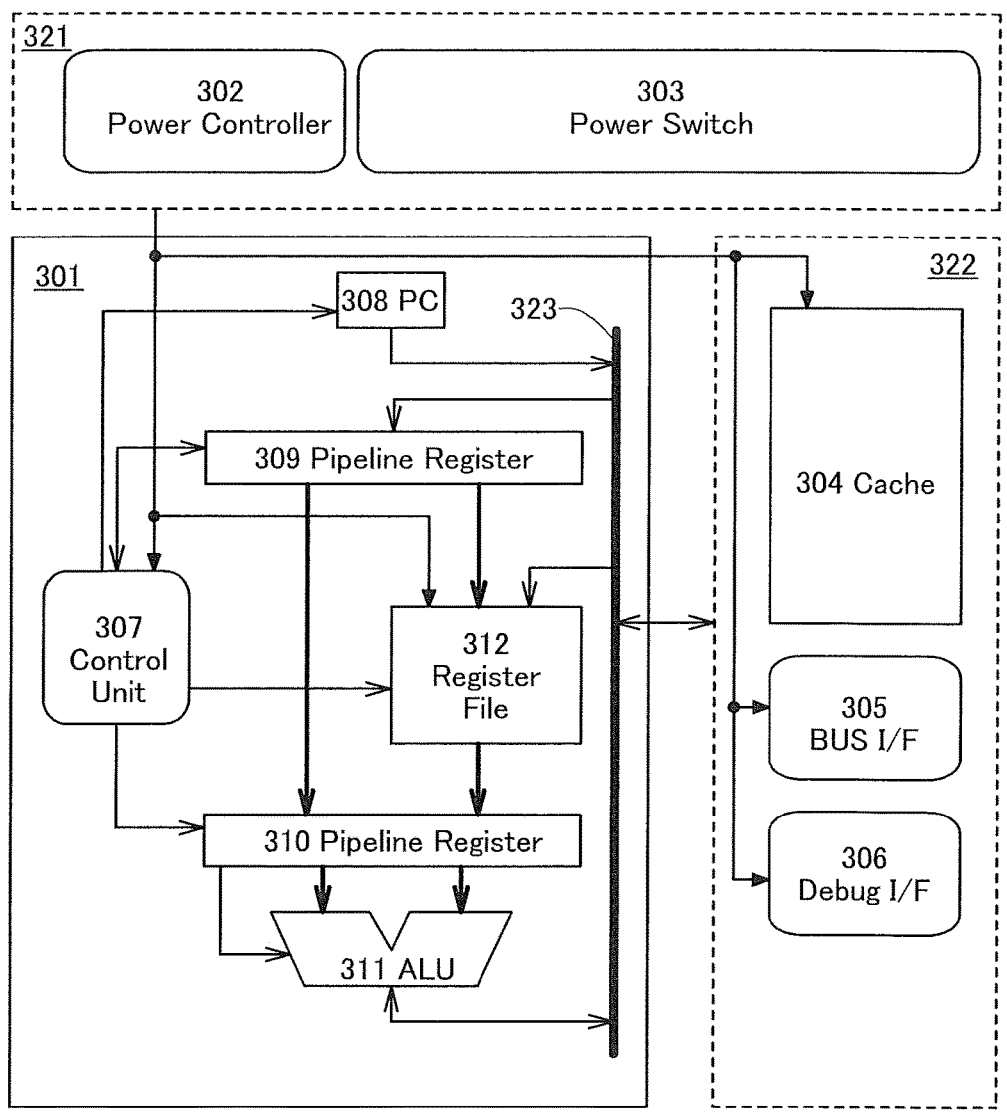
FIG. 21 is a block diagram illustrating a CPU relating to one embodiment of the present invention.

A semiconductor device 300 illustrated in FIG. 21 includes a CPU core 301, a power management unit 321, and a peripheral circuit 322. The power management unit 321 includes a power controller 302 and a power switch 303. The peripheral circuit 322 includes a cache 304 including cache memory, a bus interface (BUS I/F) 305, and a debug interface (Debug I/F) 306. The CPU core 301 includes a data bus 323, a control unit 307, a PC (program counter) 308, a pipeline register 309, a pipeline register 310, an ALU (Arithmetic logic unit) 311, and a register file 312. Data is transmitted between the CPU core 301 and the peripheral circuit 322 such as the cache 304 via the data bus 323.

A semiconductor device (cell) of one embodiment of the present invention can be applied to many logic circuits typified by the power controller 302 and the control device 307. In particular, it can be applied to all logic circuits that can be constituted using standard cells. Accordingly, the semiconductor device 300 that is small can be provided. Furthermore, the semiconductor device 300 that can have reduced power consumption can be provided. Furthermore, the semiconductor device 300 that can have a higher operating speed can be provided. Furthermore, the semiconductor device 300 that can have a smaller power supply voltage variation can be provided.

The small semiconductor device 300 can be provided by using p-channel Si transistors and the transistors including an oxide semiconductor (preferably an oxide containing In, Ga, and Zn) in a channel formation region that is described in the above embodiment for the semiconductor device (cell) relating to one embodiment of the present invention, and applying the semiconductor device (cell) to the semiconductor device 300. Furthermore, the semiconductor device 300 that can have reduced power consumption can be provided. Furthermore, the semiconductor device 300 that can have a higher operating speed can be provided. Particularly when the Si transistors are only p-channel transistors, the manufacturing cost can be reduced.

The control unit 307 has functions of totally controlling operations of the PC 308, the pipeline register 309, the pipeline register 310, the ALU 311, the register file 312, the cache 304, the bus interface 305, the debug interface 306, and the power controller 302 to decode and execute instructions contained in a program such as input applications.

The ALU 311 has a function of performing a variety of arithmetic operations such as four arithmetic operations and logic operations.

The cache 304 has a function of temporarily storing frequently-used data. The PC 308 is a register having a function of storing an address of an instruction to be executed next. Note that although not illustrated in FIG. 21, the cache 304 is provided with a cache controller for controlling the operation of the cache memory.

The pipeline register 309 has a function of temporarily storing instruction data.

The register file 312 includes a plurality of registers including a general purpose register and can store data that is read from the main memory, data obtained as a result of arithmetic operations in the ALU 311, or the like.

The pipeline register 310 has a function of temporarily storing data used for arithmetic operations of the ALU 311, data obtained as a result of arithmetic operations of the ALU 311, or the like.

The bus interface 305 has a function as a path for data between the semiconductor device 300 and various devices outside the semiconductor device 300. The debug interface 306 has a function as a path of a signal for inputting an instruction to control debugging to the semiconductor device 300.

The power switch 303 has a function of controlling supply of a power source voltage to various circuits included in the semiconductor device 300 other than the power controller 302. The above various circuits belong to several different power domains. The power switch 303 controls whether the power supply voltage is supplied to the various circuits in the same power domain. In addition, the power controller 302 has a function of controlling the operation of the power switch 303.

The semiconductor device 300 having the above structure is capable of performing power gating. A description will be given of an example of the power gating operation sequence.

First, by the CPU core 301, timing for stopping the supply of the power supply voltage is set in a register of the power controller 302. Then, an instruction of starting power gating is sent from the CPU core 301 to the power controller 302. Then, various registers and the cache 304 included in the semiconductor device 300 start data saving. Then, the power switch 303 stops the supply of a power supply voltage to the various circuits other than the power controller 302 included in the semiconductor device 300. Then, an interrupt signal is input to the power controller 302, whereby the supply of the power supply voltage to the various circuits included in the semiconductor device 300 is started. Note that a counter may be provided in the power controller 302 to be used to determine the timing of starting the supply of the power supply voltage regardless of input of an interrupt signal. Next, the various registers and the cache 304 start data recovery. Then, the instruction is resumed in the control unit 307.

Such power gating can be performed in the whole processor or one or a plurality of logic circuits forming the processor. Furthermore, power supply can be stopped even for a short time. Consequently, power consumption can be reduced finely in terms of a space or time.

In performing power gating, data held by the CPU core 301 or the peripheral circuit 322 is preferably saved in a short time. In that case, the power can be turned on or off in a short time, and an effect of saving power becomes significant.

In order that the data held by the CPU core 301 or the peripheral circuit 322 be saved in a short time, a flip-flop circuit preferably saves data (it is called a flip-flop circuit capable of backing up). Furthermore, an SRAM cell preferably saves data (it is called an SRAM cell capable of backing up). The flip-flop circuit and the SRAM cell capable of backing up preferably include transistors including an oxide semiconductor (preferably an oxide containing In, Ga, and Zn) in a channel formation region. Consequently, the transistor has a low off-state current; thus, the flip-flop circuit and the SRAM cell capable of backing up can retain data for a long time without power supply. Moreover, the transistor has a high switching speed, so that the flip-flop circuit and the SRAM cell capable of backing up data can save and return data in a short time in some cases.

Examples of the flip-flop circuit capable of backing up data and the SRAM cell capable of backing up data will be described using FIG. 22 and FIG. 23.

Figure 22:
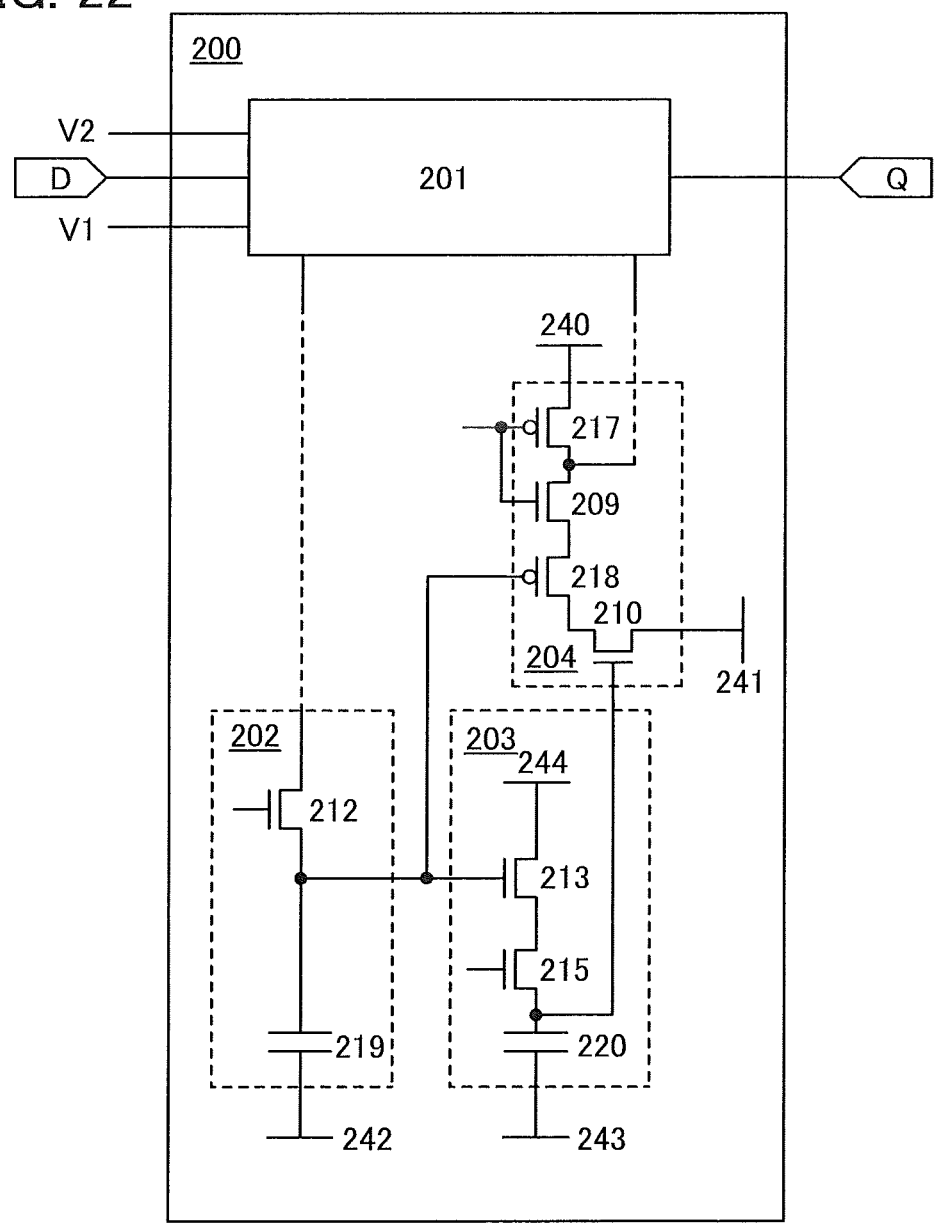
FIG. 22 is a circuit diagram illustrating a semiconductor device relating to one embodiment of the present invention.

A semiconductor device 200 illustrated in FIG. 22 is an example of the flip-flop circuit capable of backing up. The semiconductor device 200 includes a first memory circuit 201, a second memory circuit 202, a third memory circuit 203, and a read circuit 204. As a power supply voltage, a potential difference between a potential V1 and a potential V2 is supplied to the semiconductor device 200. One of the potential V1 and the potential V2 is at a high level, and the other is at a low level. An example of the structure of the semiconductor device 200 when the potential V1 is at a low level and the potential V2 is at a high level will be described below.

The first memory circuit 201 has a function of retaining data when a signal D including the data is input in a period during which the power supply voltage is supplied to the semiconductor device 200. Furthermore, the first memory circuit 201 outputs a signal Q including the retained data in the period during which the power supply voltage is supplied to the semiconductor device 200. On the other hand, the first memory circuit 201 cannot retain data in a period during which the power supply voltage is not supplied to the semiconductor device 200. That is, the first memory circuit 201 can be called a volatile memory circuit.

The second memory circuit 202 has a function of reading the data held in the first memory circuit 201 to store (or save) it. The third memory circuit 203 has a function of reading the data held in the second memory circuit 202 to store (or save) it. The read circuit 204 has a function of reading the data held in the second memory circuit 202 or the third memory circuit 203 to store (or return) it in (to) the first memory circuit 201.

In particular, the third memory circuit 203 has a function of reading the data held in the second memory circuit 202 to store (or save) it even in the period during which the power supply voltage is not supplied to the semiconductor device 200.

As illustrated in FIG. 22, the second memory circuit 202 includes a transistor 212 and a capacitor 219. The third memory circuit 203 includes a transistor 213, a transistor 215, and a capacitor 220. The read circuit 204 includes a transistor 210, a transistor 218, a transistor 209, and a transistor 217.

The transistor 212 has a function of charging and discharging the capacitor 219 in accordance with data held in the first memory circuit 201. The transistor 212 is desirably capable of charging and discharging the capacitor 219 at a high speed in accordance with data held in the first memory circuit 201. Specifically, the transistor 212 desirably contains crystalline silicon (preferably polycrystalline silicon, more preferably single crystal silicon) in a channel formation region.

The conduction state or the non-conduction state of the transistor 213 is determined in accordance with the charge held in the capacitor 219. The transistor 215 has a function of charging and discharging the capacitor 220 in accordance with the potential of a wiring 244 when the transistor 213 is in a conduction state. It is desirable that the off-state current of the transistor 215 be extremely low. Specifically, the transistor 215 desirably contains an oxide semiconductor (preferably an oxide containing In, Ga, and Zn) in a channel formation region.

Specific connection relations between the elements will be described. One of a source and a drain of the transistor 212 is connected to the first memory circuit 201. The other of the source and the drain of the transistor 212 is connected to one electrode of the capacitor 219, a gate of the transistor 213, and a gate of the transistor 218. The other electrode of the capacitor 219 is connected to the wiring 242. One of a source and a drain of the transistor 213 is connected to the wiring 244. The other of the source and the drain of the transistor 213 is connected to one of a source and a drain of the transistor 215. The other of the source and the drain of the transistor 215 is connected to one electrode of the capacitor 220 and a gate of the transistor 210. The other electrode of the capacitor 220 is connected to the wiring 243. One of a source and a drain of the transistor 210 is connected to a wiring 241. The other of the source and the drain of the transistor 210 is connected to one of a source and a drain of the transistor 218. The other of the source and the drain of the transistor 218 is connected to one of a source and a drain of the transistor 209. The other of the source and the drain of the transistor 209 is connected to one of a source and a drain of the transistor 217 and the first memory circuit 201. The other of the source and the drain of the transistor 217 is connected to a wiring 240. Furthermore, although a gate of the transistor 209 is connected to a gate of the transistor 217 in FIG. 22, the gate of the transistor 209 is not necessarily connected to the gate of the transistor 217.

The transistor described in the above embodiment as an example can be applied to the transistor 215. Because of the low off-state current of the transistor 215, the semiconductor device 200 can retain data for a long time without power supply. The favorable switching characteristics of the transistor 215 allows the semiconductor device 200 to perform high-speed backup and recovery.

Figure 23:
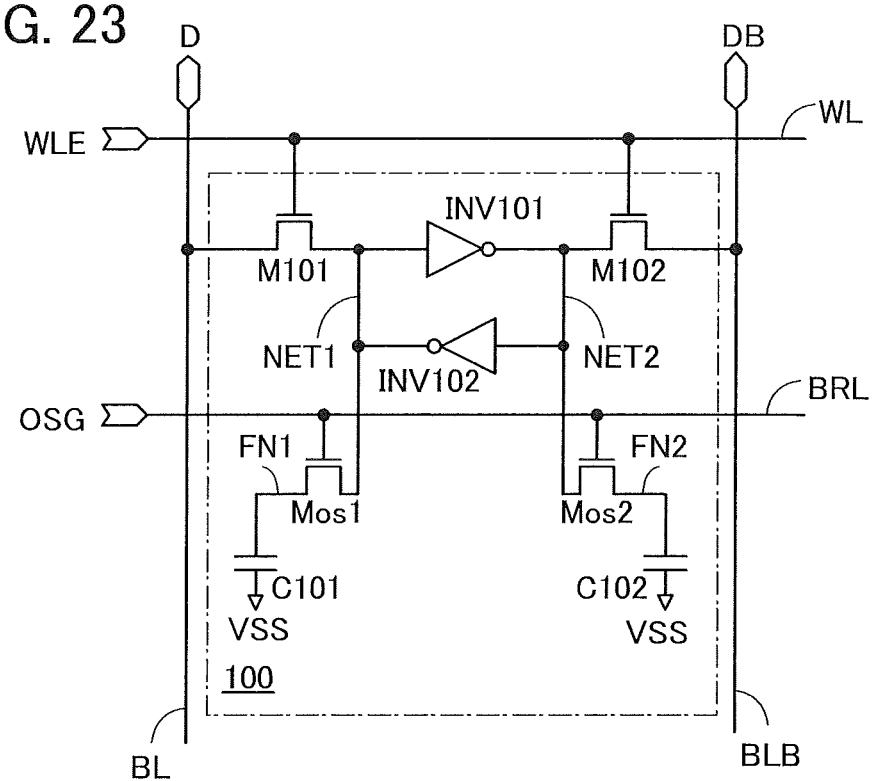
FIG. 23 is a circuit diagram illustrating a semiconductor device relating to one embodiment of the present invention.

The semiconductor device 100 illustrated in FIG. 23 is an example of the SRAM cell capable of backing up. The semiconductor device 100 includes transistors M101, M102, Mos1, and Mos2, inverters INV101 and INV102, and capacitors C101 and C102. The semiconductor device 100 is connected to wirings WL, BL, BLB, and BRL. In addition, the low power supply voltage (VSS) and the like are supplied as power supply voltages to the semiconductor device 100.

An input node and an output node of the inverter INV101 are connected with an output node and an input node of the inverter INV102, respectively, whereby an inverter loop circuit is formed. A gate of the transistor M101 and a gate of the transistor M102 are connected to the wiring WL. The transistor M101 functions as a switch connecting the wiring BL and the input node of the inverter INV101, and the transistor M102 functions as a switch connecting the wiring BLB and the input node of the inverter INV102.

The wiring WL functions as a writing/reading word line, and a signal (WLE) for selecting a memory cell is input from a word line driver circuit. The wirings BL and BLB function as bit lines that send data signals D and DB. The data signal DB is a signal that is obtained by inverting the logic value of the data signal D. The data signals D and DB are supplied from a bit line driver circuit. Furthermore, the wirings BL and BLB are also wirings for transmitting data read from the semiconductor device 100 to an output circuit.

The semiconductor device 100 corresponds to a circuit including a volatile memory circuit that includes the inverter INV101, the inverter INV102, the transistor M101, and the transistor M102 and a pair of memory circuits. Note that the pair of memory circuits comprises a memory circuit including the transistor Mos1 and the capacitor C101 (hereinafter referred to as a memory circuit (Mos1, C101)) and a memory circuit including the transistor Mos2 and the capacitor C102 (hereinafter referred to as a memory circuit (Mos2, C102)). The memory circuit (Mos1, C101) and the memory circuit (Mos2, C102) are circuits to back up data of the volatile memory circuit by storing potentials held in a node NET1 and a node NET2, respectively. These memory circuits turn on the transistors Mos1 and Mos2 to charge or discharge the capacitors C101 and C102 so that data is written, and turns off them to store charge accumulated in the capacitors so that data is retained without power supply.

Data is recovered by turning on the transistors Mos1 and Mos2. The transistors Mos1 and Mos2 are turned on while power supply to the inverters INV101 and INV102 is stopped, whereby a node FN1 and a node NET1 are connected so that charge is shared by the node FN1 and the node NET1, and a node FN2 and a node NET2 are connected so that charge is shared by the node FN2 and the node NET2. Then, power is supplied to the inverters INV101 and INV102, whereby data is returned to an inverter loop circuit, depending on the potentials of the node NET1 and the node NET2. After that, the transistors Mos1 and Mos2 are turned off.

Gates of the transistors Mos1 and Mos2 are connected to the wiring BRL. A signal OSG is input to the wiring BRL. In response to the signal OSG, the pair of memory circuits (the memory circuit (Mos1, C101) and the memory circuit (Mos2, C102)) is driven and backup or recovery is performed.

Configurations and operations of the memory circuit (Mos1, C101) and the memory circuit (Mos2, C102) will be described below.

The memory circuits (Mos1, C101) and (Mos2, C102) store charge in the capacitors C101 and C102, thereby holding the potentials of the nodes FN1 and FN2. When the transistors Mos1 and Mos2 are turned on, the node NET1 and the node FN1 are connected and the potential held in the node NET1 is applied to the node FN1. Furthermore, when the transistor Mos2 is turned on, the node NET2 and the node FN2 are connected and the potential held in the node NET2 is applied to the node FN2. In addition, turning off the transistors Mos1 and Mos2 brings the nodes FN1 and FN2 into an electrically floating state, so that charge stored in the capacitors C101 and C102 is held and the memory circuits are brought into a data holding state.

For example, In the case where the node FN1 is at H level, charge may leak from C101, gradually decreasing the voltage thereof. The transistors Mos1 and Mos2 desirably contain an oxide semiconductor (preferably an oxide containing In, Ga, and Zn) in a channel formation region. Consequently, the leakage current flowing between a source and a drain in an off state (off-state current) is extremely low; thus, a voltage variation of the node FN1 can be suppressed. That is to say, the memory circuit (Mos1, C101) can be operated as a nonvolatile memory circuit or a memory circuit that can retain data for a long time without power supply. Furthermore, in a similar manner, the memory circuit (Mos2, C102)

can be used as a backup memory circuit of a volatile memory circuit which includes the inverter INV101, the inverter INV102, the transistor M101, and the transistor M102.

The transistor described as an example in the above embodiment can be applied to the transistors Mos1 and Mos2. Because of the low off-state current of the transistors Most and Mos2, the semiconductor device 100 can retain data for a long time without power supply. The favorable switching speed of the transistors Mos1 and Mos2 allows the semiconductor device 100 to perform high-speed backup and recovery.

The semiconductor device (cell) relating to one embodiment of the present invention, and the flip-flop circuit and the SRAM cell which are capable of backing up and use the transistor including an oxide semiconductor in a channel formation region that is described as an example in the above embodiment can be applied to the semiconductor device 300. Consequently, it is possible to fabricate the low-power-consumption semiconductor device whose power can be turned on or off in a short time.

Furthermore, the semiconductor device (cell) relating to one embodiment of the present invention, and the flip-flop circuit and the SRAM cell which are capable of backing up and use the transistor including an oxide semiconductor in a channel formation region that is described as an example in the above embodiment can be applied to the semiconductor device 300. Consequently, the manufacturing cost can be suppressed. In particular, n-channel transistors used in the flip-flop circuit and the SRAM cells may each be replaced with the transistors including an oxide semiconductor in channel formation regions that are described as an example in the above embodiment. When Si transistors are only p-channel ones, manufacturing cost can be reduced.

Note that the semiconductor device (cell) of one embodiment of the present invention can be applied to a GPU (Graphics Processing Unit), a PLD (Programmable Logic Device), a DSP (Digital Signal Processor), a MCU (Microcontroller Unit), a RF-ID (Radio Frequency Identification), a custom LSI, and the like as well as a CPU.

Embodiment 9

In this embodiment, application examples of the semiconductor device (cell) relating to one embodiment of the present invention will be described.

Figure 24A:
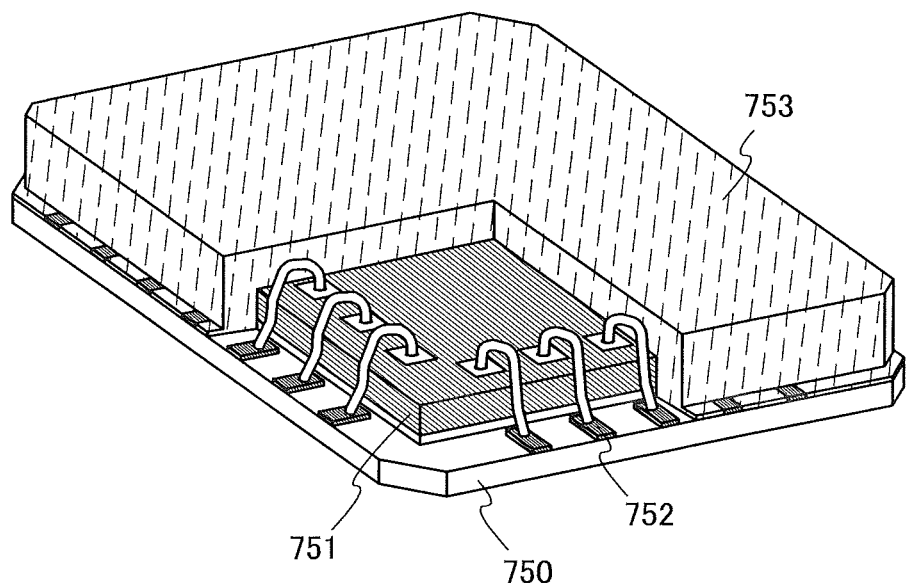
FIGS. 24A-24B are views illustrating the structures of a chip and a module relating to one embodiment of the present invention.

FIG. 24(A) shows a perspective view illustrating a part of the inside of a package including a lead frame type interposer. In the package illustrated in FIG. 24(A), a chip 751 to which the semiconductor device (cell) relating to one embodiment of the present invention is applied is connected to a terminal 752 over an interposer 750 by a wire bonding method. The terminal 752 is placed on a surface of the interposer 750 on which the chip 751 is mounted. In addition, the chip 751 may be sealed by a mold resin 753, in which case it is sealed so that part of each of the terminals 752 is exposed.

Figure 24B:
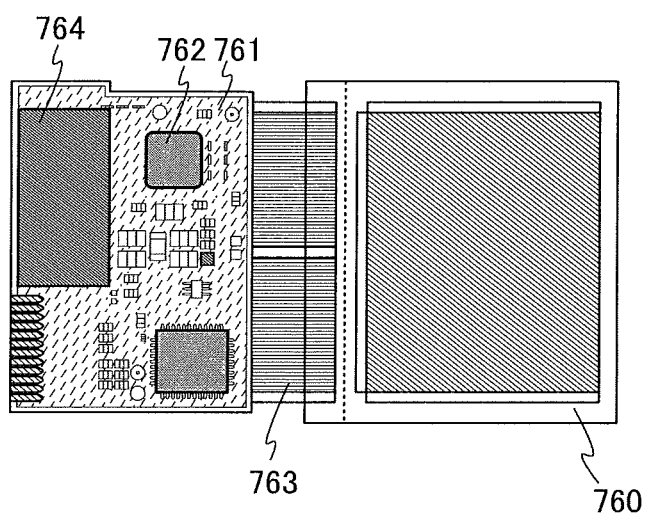

FIG. 24(B) illustrates the structure of a module of an electronic device (mobile phone) in which a package is mounted on a circuit board. In the module of a mobile phone illustrated in FIG. 24(B), a package 762 and a battery 764 are mounted on a printed circuit board 761. In addition, the printed circuit board 761 is mounted on a panel 760 provided with display elements by an FPC 763.

Embodiment 10

An example of the structure of a semiconductor device including the semiconductor device (cell) relating to one embodiment of the present invention will be described using FIG. 26 to FIG. 29.

Figure 26:
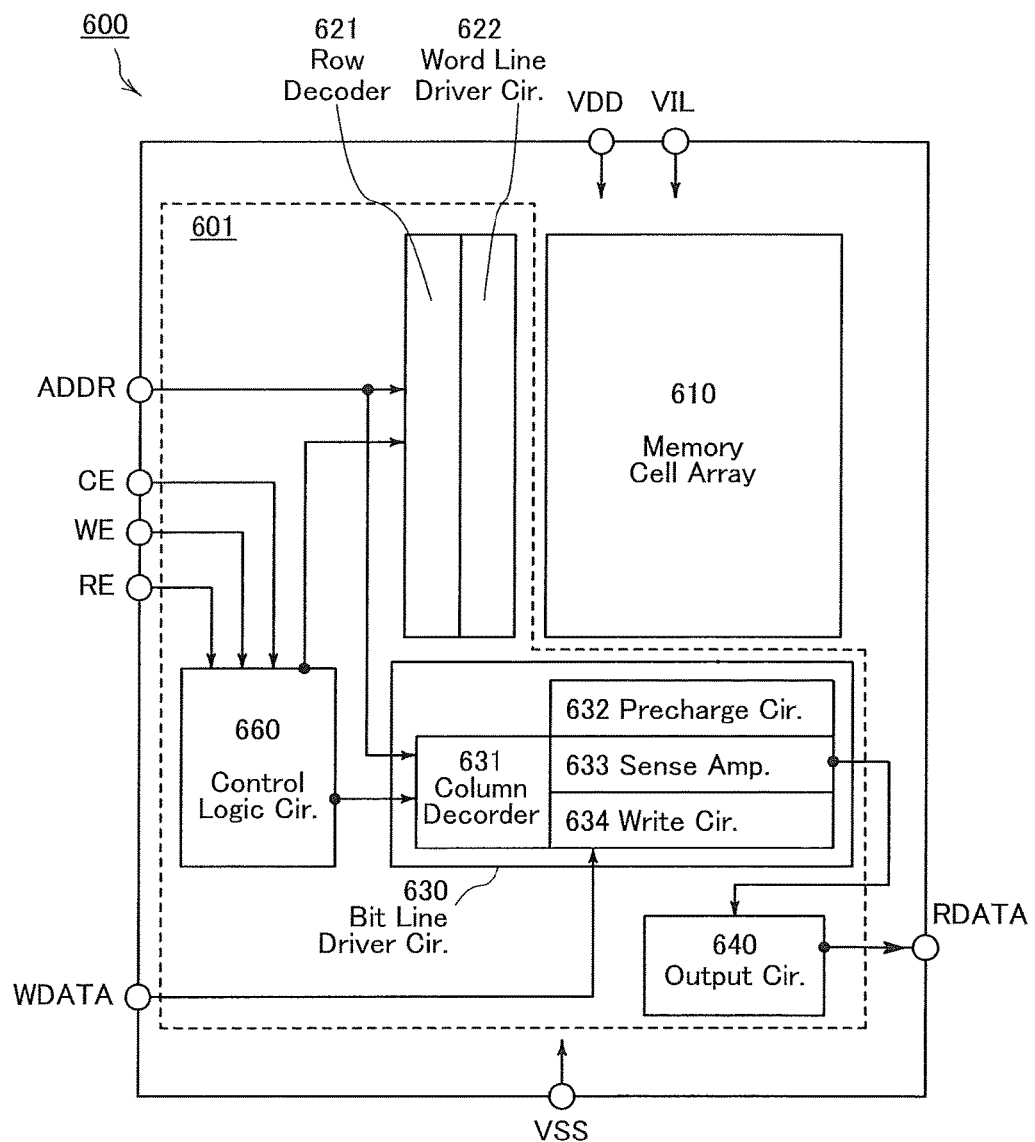
FIG. 26 is a block diagram illustrating a storage device relating to one embodiment of the present invention.

FIG. 26 illustrates an example of a structure of a semiconductor device. A semiconductor device 600 illustrated in FIG. 26 is an example of a semiconductor device that can function as a memory device. The semiconductor device 600 includes a memory cell array 610, a row decoder 621, a word line driver circuit 622, a bit line driver circuit 630, an output circuit 640, and a control logic circuit 660.

The bit line driver circuit 630 includes a column decoder 631, a precharge circuit 632, a sense amplifier 633, and a writing circuit 634. The precharge circuit 632 has a function of precharging wirings BL and BLB and a function of making the voltages of the wiring BL and the wiring BLB in the same column equal. The sense amplifier 633 has a function of amplifying data signals D and DB read from the wirings BL and BLB. The amplified data signals are output to the outside of the semiconductor device 600 as digital data signals RDATA, through the output circuit 640.

Furthermore, to the semiconductor device 600, a low power supply voltage VSS, a high power supply voltage VDD for a circuit portion 601 other than the memory cell array, and a high power supply voltage VIL for the memory cell array 610 are supplied from the outside as power supply voltages.

In addition, to the semiconductor device 600, control signals CE, WE, and RE, an address signal ADDR, and a data signal WDATA are input from the outside. ADDR is input to the row decoder 621 and the column decoder 631, and WDATA is input to the writing circuit 634.

The control logic circuit 660 processes the control signals CE, WE, and RE input from the outside, and generates control signals for the row decoder 621 and the column decoder 631. The control signal CE is a chip enable signal, the control signal WE is a write enable signal, and the control signal RE is a read enable signal. Signals processed by the control logic circuit 660 are not limited thereto, and other control signals may be input as necessary.

Note that whether each circuit or each signal described above is provided or not can be determined as appropriate as needed.

The semiconductor device (cell) relating to one embodiment of the present invention can be applied to the row decoder 621, the word line driver circuit 622, the bit line driver circuit 630, the output circuit 640, and the control logic circuit 660. In particular, it can be applied to all the logic circuits that can be formed using a standard cell. Accordingly, the small semiconductor device 600 can be provided. Furthermore, the semiconductor device 600 that can have reduced power consumption can be provided. Furthermore, the semiconductor device 600 that can have a higher operating speed can be provided.

The small semiconductor device 600 can be provided by using a p-channel Si transistor and the transistor including an oxide semiconductor (preferably an oxide containing In, Ga, and Zn) in a channel formation region that is described in the above embodiment for the semiconductor device (cell) relating to one embodiment of the present invention, and applying it to the semiconductor device 600. Furthermore, the semiconductor device 600 that can have reduced power consumption can be provided. Furthermore, the semiconductor device 600 that can have a higher operating speed can be provided. Particularly when the Si transistors are only p-channel transistors, the manufacturing cost can be reduced.

Note that a transistor including an oxide semiconductor (preferably an oxide containing In, Ga, and Zn) in a channel formation region can be used in the memory cell array 610. An example of such a memory cell will be described below using FIG. 27 to FIG. 29.

Figure 27:
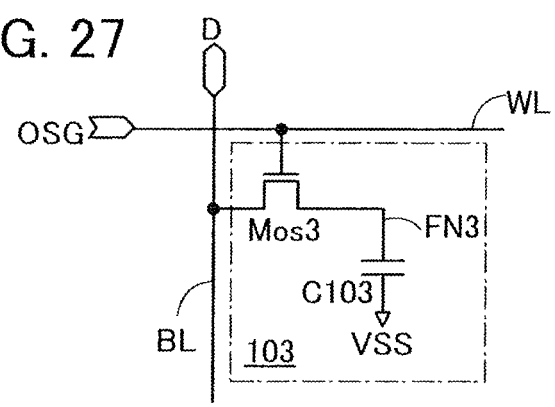
FIG. 27 is a circuit diagram illustrating a memory cell.

FIG. 27 is a circuit diagram illustrating a configuration example of a memory cell. A memory cell 103 includes a transistor Mos3 and a capacitor C103. A node FN3 is a data holding portion, and a terminal of the capacitor C103 is connected thereto. The transistor Mos3 functions as a switch connecting the node FN3 and the wiring BL, and a gate thereof is connected to the wiring WL. As a signal for selecting a memory cell, the signal OSG is input to the wiring WL.

Figure 28:
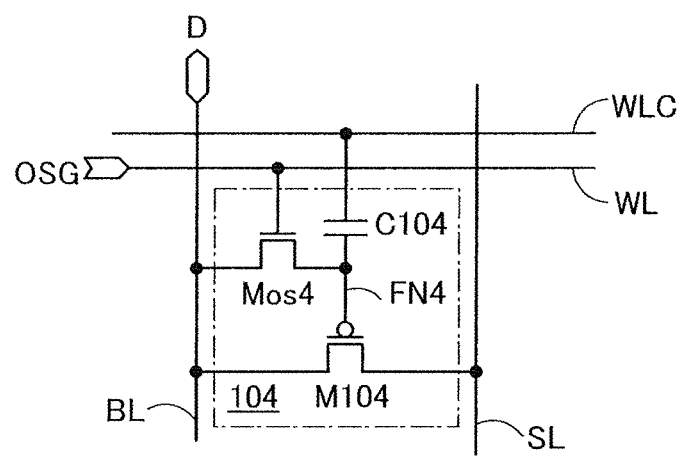
FIG. 28 is a circuit diagram illustrating a memory cell.

FIG. 28 is a circuit diagram showing a configuration example of a memory cell. A memory cell 104 includes a transistor Mos4, a transistor M104, and a capacitor C104. A node FN4 is a data holding portion. The transistor Mos4 functions as a switch connecting the node FN4 and a wiring BL, and a gate thereof is connected to the wiring WL. The signal OSG is input to the wiring WL. The capacitor C104 connects a wiring WLC and the node FN4. The wiring WLC is a wiring for supplying a constant voltage to a terminal of C104 at the time of a writing operation and at the time of a reading operation. The transistor M104 is a p-channel transistor, and a gate, a source, and a drain thereof are connected to the node FN4, a wiring SL, and the wiring BL, respectively.

While a constant voltage is applied to the wirings WLC and SL, data is written by turning on the transistor Mos4 and connecting the node FN4 to the wiring BL. For reading data, a constant voltage is applied to the wirings BL, WLC, and SL. The value of a current flowing between a source and a drain of the transistor M104 changes depending on the voltage of the node FN4. The wiring BL is charged or discharged by the source-drain current of the transistor M104, so that the data value held in the memory cell 104 can be read by detecting the voltage of the wiring BL.

Note that the transistor M104 can be an n-channel transistor. In accordance with the conductivity type of the transistor M104, a voltage applied to the wirings (BL, SL, WLC) is determined.

Figure 29:
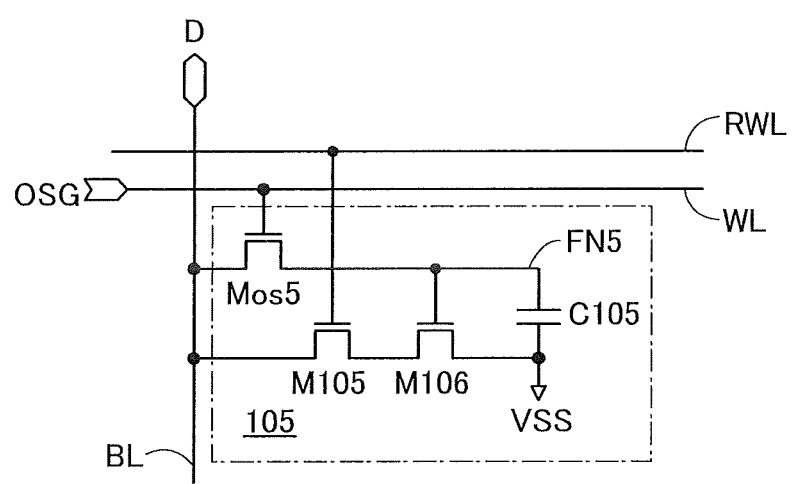
FIG. 29 is a circuit diagram illustrating a memory cell.

FIG. 29 is a circuit diagram showing a configuration example of a memory cell. A memory cell 105 includes a transistor Mos5, a transistor M105, a transistor M106, and a capacitor C105. A node FN5 is a data holding portion. The transistor Mos5 functions as a switch connecting the node FN5 and the wiring BL, and a gate thereof is connected to the wiring WL. The signal OSG is input to the wiring WL. The transistors M105 and M106 connect the wiring BL and one terminal of the capacitor C105. A gate of the transistor M105 is connected to a wiring RWL, and a gate of the transistor M106 is connected to the node FN5. In addition, the other terminal of the capacitor C105 is connected to the node FN5.

Data is written by turning on the transistor Mos5 and connecting the node FN4 to the wiring BL. Data is read by turning on the transistor M105. The value of a current flowing between a source and a drain of the transistor M106 changes depending on the voltage of the node FN5. The wiring BL is charged or discharged by the source-drain current of the transistor M106, so that the data value held in the memory cell 105 can be read by detecting the voltage of the wiring BL.

Note that the transistors M105 and M106 can be p-channel transistors. In accordance with the conductivity type of the transistors M105 and M106, a voltage applied to the wiring RWL and a voltage applied to the capacitor C105 should be determined.

In the configuration examples of the memory cells illustrated in FIG. 27 to FIG. 29, the transistors Mos3, Mos4, and Mos5 desirably include oxide semiconductors (preferably, oxides containing In, Ga, and Zn) in channel formation regions. As a result, since a leakage current (off-state current) that flows between a source and a drain of the transistor in an off-state is extremely low, a fluctuation in the voltage of the nodes FN3, FN4, and FN5 can be suppressed. That is to say, a circuit including Mos3 and the C103, a circuit including Mos4 and C104, and a circuit including Mos3 and the C103 can each be operated as a nonvolatile memory circuit or a memory circuits capable of holding data for a long time without power supply.

The semiconductor device 600 that includes a nonvolatile memory circuit or a memory circuit capable of holding data for a long time without power supply can be provided by applying the semiconductor device (cell) relating to one embodiment of the present invention and a memory cell using the transistor including an oxide semiconductor in a channel formation region that is described in the above embodiment to the semiconductor device 600. Furthermore, the semiconductor device 600 that can have a smaller size, reduced power consumption, a higher operating speed, or a smaller power supply voltage variation can be provided.

Furthermore, the semiconductor device (cell) relating to one embodiment of the present invention and a memory cell using the transistor including an oxide semiconductor in a channel formation region that is described in the above embodiment can be applied to the semiconductor device 600. Thus, the manufacturing cost can be reduced. In particular, all n-channel transistors used in the memory cell may be formed using the transistors including an oxide semiconductor in channel formation regions that are described in the above embodiment. When Si transistors are only p-channel transistors, the manufacturing cost can be reduced.

Note that this embodiment can be combined as appropriate with the other embodiments described in this specification.

Embodiment 11

An example of the structure of a device using the semiconductor device (cell) relating to one embodiment of the present invention will be described using FIG. 25.

Figure 25:
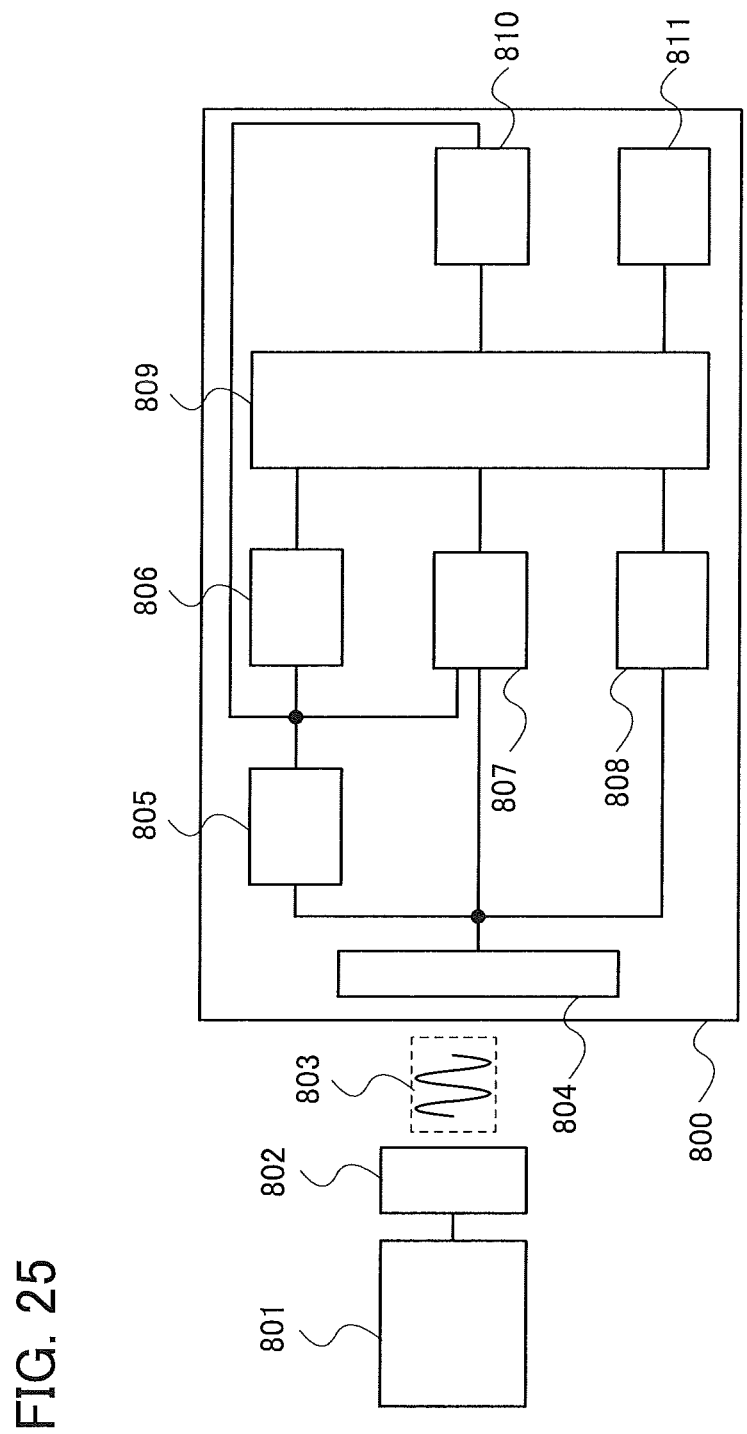
FIG. 25 is a block diagram illustrating an RFID relating to one embodiment of the present invention.

A semiconductor device 800 illustrated in FIG. 25 is an example of the structure of an RFID tag. An RFID tag in this embodiment includes a memory circuit inside, stores necessary data in the memory circuit, and transmits and receives data to/from the outside by using contactless means, for example, wireless communication. With such characteristics, an RFID tag can be used for an individual authentication system in which an object is recognized by reading the individual information of the object or the like, for example.

The semiconductor device 800 shown in FIG. 25 includes an antenna 804, a rectifier circuit 805, a constant voltage circuit 806, a demodulation circuit 807, a modulation circuit 808, a logic circuit 809, a memory circuit 810, and a ROM 811.

The antenna 804 is for sending and receiving a radio signal 803 with the antenna 802 connected to a communication device 801. In addition, the rectifier circuit 805 generates an input potential. Specifically, generating an input alternating signal by receiving a radio signal at the antenna 804; rectifying, for example, half-wave voltage doubler rectification of the input alternating signal; and smoothing of the rectified signal with a capacitor provided in a later stage in the rectifier circuit 805 are performed. Note that a limiter circuit may be provided on the input side or the output side of the rectifier circuit 805. The limiter circuit is a circuit for controlling electric power so that electric power that is higher than or equal to certain electric power is not input to a circuit in a later stage in the case where the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit generates a reset signal of the logic circuit 809 by utilizing the rise of the stable power supply voltage.

The demodulation circuit 807 demodulates the input alternating signal by envelope detection and generates the demodulated signal. Furthermore, the modulation circuit 808 performs modulation in accordance with data to be output from the antenna 804.

The logic circuit 809 decodes and processes the demodulated signal. The memory circuit 810 holds the input data and includes a row decoder, a column decoder, a memory region, and the like. Furthermore, the ROM 811 stores an identification number (ID) or the like and outputs it in accordance with processing.

Note that data transmission formats include an electromagnetic coupling method in which a pair of coils is provided so as to face each other and communicates with each other by mutual induction, an electromagnetic induction method in which communication is performed using an induction field, a radio wave method in which communication is performed using a radio wave, and the like. The semiconductor device 800 described in this embodiment can be used for any of the methods.

Note that whether each circuit described above is provided or not can be determined as appropriate as needed.

The semiconductor device (cell) relating to one embodiment of the present invention can be applied to the logic circuit 809, the memory circuit 810, the ROM 811, and the like. In particular, it can be applied to all logic circuits that can be founed using a standard cell. Accordingly, the small semiconductor device 800 can be provided. Furthermore, the semiconductor device 800 that can have reduced power consumption can be provided. Furthermore, the semiconductor device 800 that can have a higher operating speed can be provided.

The small semiconductor device 800 can be provided by applying the semiconductor device (cell) relating to one embodiment of the present invention using a p-channel Si transistor and the transistor including an oxide semiconductor (preferably an oxide containing In, Ga, and Zn) in a channel formation region that is described in the above embodiment to the semiconductor device 800. Furthermore, the semiconductor device 800 that can have reduced power consumption can be provided. Furthermore, the semiconductor device 800 that can have a higher operating speed can be provided. Particularly when the Si transistors are only p-channel transistors, the manufacturing cost can be reduced.

Note that the memory circuit described in the above embodiment can be used as the memory circuit 810. Furthermore, the transistor including an oxide semiconductor (preferably, an oxide containing In, Ga, and Zn) in a channel formation region that is described in the above embodiment may be used as an element having a rectifying function included in the demodulation circuit 807. Since the transistor has a low off-state current, the reverse current of the element having a rectifying function can be reduced. Consequently, excellent rectification efficiency can be achieved.

Note that this embodiment can be combined as appropriate with the other embodiments described in this specification.

Embodiment 12

The semiconductor device (cell) relating to one embodiment of the present invention can be used for display devices, personal computers, or image reproducing devices provided with recording media (typically, devices that reproduce recording media such as digital versatile discs (DVDs) and have displays for displaying the images). Other electronic devices that can use the semiconductor device (cell) relating to one embodiment of the present invention are mobile phones, game machines including portable ones, portable data terminals, e-book readers, cameras such as video cameras and digital still cameras, goggle-type display devices (head mounted displays), navigation systems, audio reproducing devices (e.g., car audios and digital audio players), copiers, facsimiles, printers, multifunction printers, automated teller machines (ATM), vending machines, and the like. Specific examples of these electronic devices are illustrated in FIG. 30.

Figure 30A:
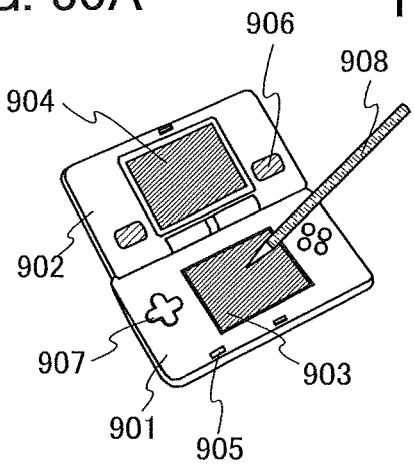
FIGS. 30A-30F are views illustrating an electronic device relating to one embodiment of the present invention.

FIG. 30(A) is a portable game machine including a housing 901, a housing 902, a display portion 903, a display portion 904, a microphone 905, a speaker 906, an operation key 907, a stylus 908, and the like. Although the portable game machine in FIG. 30(A) has the two display portions 903 and 904, the number of display portions included in a portable game machine is not limited to this.

Figure 30B:
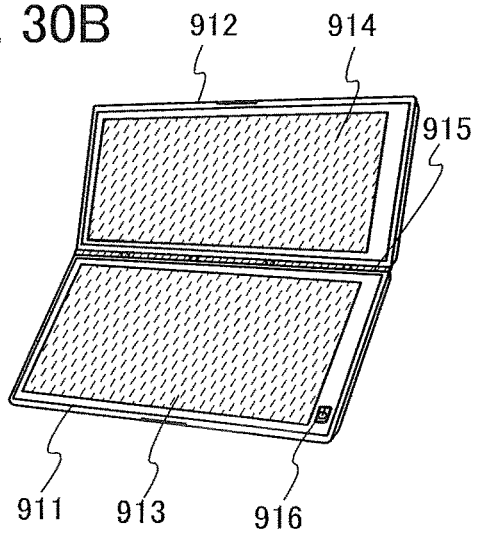

FIG. 30(B) is a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. In addition, the first housing 911 and the second housing 912 are connected to each other with the joint 915, and the angle between the first housing 911 and the second housing 912 can be changed with the joint 915. An image on the first display portion 913 may be switched depending on the angle at the joint 915 between the first housing 911 and the second housing 912. Furthermore, a display device with a function as a position input device may be used as at least one of the first display portion 913 and the second display portion 914. Note that the function as a position input device can be added by provision of a touch panel in a display device. Alternatively, the function as a position input device can be added by provision of a photoelectric conversion element called a photosensor in a pixel portion of a display device.

Figure 30C:
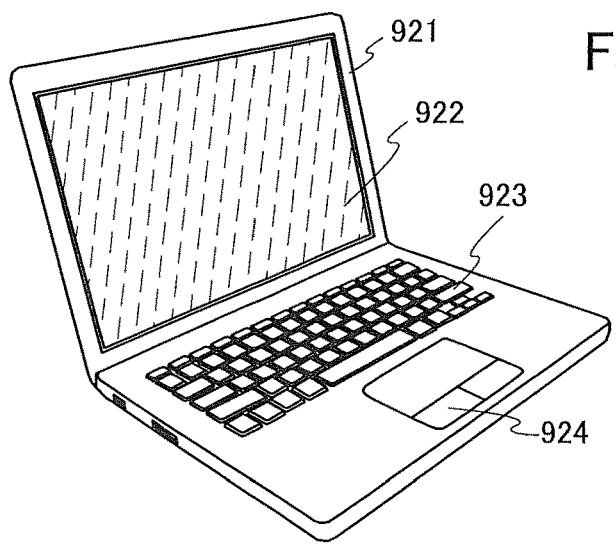

FIG. 30(C) is a laptop personal computer including a housing 921, a display portion 922, a keyboard 923, a pointing device 924, and the like.

Figure 30D:
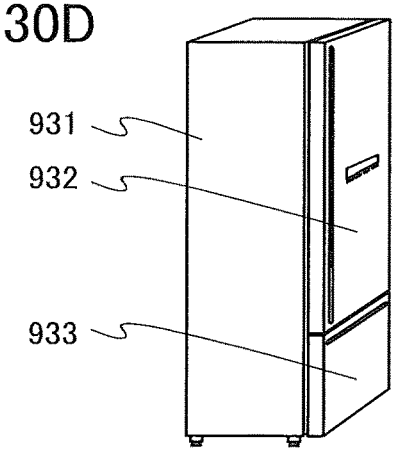

FIG. 30(D) is an electric refrigerator-freezer including a housing 931, a door for a refrigerator 932, a door for a freezer 933, and the like.

Figure 30E:
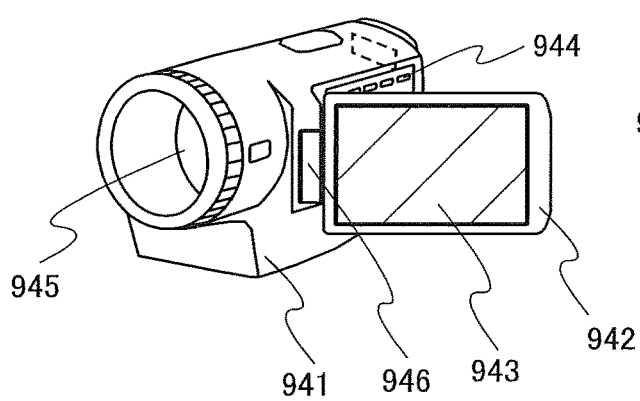

FIG. 30(E) is a video camera including a first housing 941, a second housing 942, a display portion 943, operation keys 944, a lens 945, a joint 946, and the like. The operation keys 944 and the lens 945 are provided for the first housing 941, and the display portion 943 is provided for the second housing 942. In addition, the first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 30F:
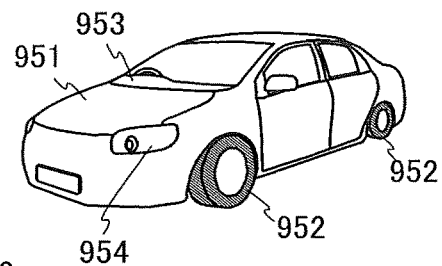

FIG. 30(F) is an ordinary vehicle including a car body 951, wheels 952, a dashboard 953, lights 954, and the like.

When the semiconductor device (cell) of one embodiment of the present invention is used in these electronic devices, reduction of the size, increase in operation speed, reduction of power consumption, and/or reduction of a power supply voltage variation of the electronic device can be achieved. Particularly when Si transistors are only p-channel transistors, the manufacturing cost can be reduced. Consequently, a small electronic device can be fabricated. Furthermore, when the semiconductor device (cell) of one embodiment of the present invention is used, an electronic device with reduced power consumption can be provided. Furthermore, an electronic device capable of high-speed operation can be provided. Furthermore, an electronic device that operates more stably can be provided.

Note that this embodiment can be combined as appropriate with the other embodiments described in this specification.

Note that contents (or may be part of the contents) described in one embodiment may be applied to, combined with, or replaced by different contents (or may be part of the contents) described in the embodiment and/or contents (or may be part of the contents) described in one or a plurality of different embodiments.

Note that in each embodiment, contents described in the embodiment are contents described using a variety of diagrams or contents described with text described in this specification.

Note that by combining a diagram (or may be part of the diagram) described in one embodiment with another part of the diagram, a different diagram (or may be part of the diagram) described in the embodiment, and/or a diagram (or may be part of the diagram) described in one or a plurality of different embodiments, much more diagrams can be formed.

This application is based on Japanese Patent Application serial no. 2014-039280 filed with Japan Patent Office on Feb. 28, 2014, the entire contents of which are hereby incorporated by reference.

What is claimed is:

1. A semiconductor device comprising:
a first transistor, a second transistor, a first conductor, and a second conductor, a first insulator comprising a first opening, a second insulator comprising a second opening, a third conductor, and a fourth conductor,
wherein the second transistor and the first transistor are stacked,
wherein a first power supply voltage is supplied to the first conductor, and a second power supply voltage is supplied to the second conductor,
wherein the second conductor overlaps with the first conductor,
wherein the first conductor includes a first region, and the second conductor includes a second region,
wherein the first region and the second region overlap with each other with one or more layers of insulators therebetween and extend parallel to each other,
wherein one of a source region and a drain region of the first transistor is electrically connected to the first conductor,
wherein one of a source electrode and a drain electrode of the second transistor is electrically connected to the second conductor,
wherein the second transistor is an n-channel transistor, and a channel formation region of the second transistor comprises an oxide semiconductor,
wherein the first transistor is a p-channel transistor, and a channel formation region of the first transistor comprises silicon,
wherein the other of the source region and the drain region of the first transistor is directly connected to the first conductor through the third conductor in the first opening,
wherein the other of the source electrode and the drain electrode of the second transistor is directly connected to the second conductor through the fourth conductor in the second opening,
wherein the first opening and the second opening overlap with each other and
wherein the oxide semiconductor layer comprises a first oxide semiconductor layer, a second oxide semiconductor layer, and a third oxide semiconductor layer, which are stacked.

2. The semiconductor device according to claim 1, further comprising:
an input terminal electrically connected to gate electrodes of the first transistor and the second transistor and an output terminal electrically connected to the other of the source region and the drain region of the first transistor and other of the source electrode and the drain electrode of the second transistor,
wherein a width of the first conductor and a width of the second conductor are larger than a width of a fifth conductor connected to the input terminal and a width of a sixth conductor connected to the output terminal.

3. The semiconductor device according to claim 1, wherein a transistor is provided neither between the first conductor and the second conductor nor between the first transistor and the second transistor.

4. The semiconductor device according to claim 1, wherein no conductor is provided between the first region and the second region.

5. The semiconductor device according to claim 1, wherein the first conductor and the second conductor are formed of conductors in adjacent layers in the thickness direction.

6. The semiconductor device according to claim 1, wherein the channel formation region of the first transistor, the first conductor, the second conductor, and the channel formation region of the second transistor are stacked in this order.

7. The semiconductor device according to claim 1, wherein the channel formation region of the first transistor, the channel formation region of the second transistor are stacked in this order.

8. The semiconductor device according to claim 1, wherein a direction in which the source region, a gate electrode, and the drain region of the first transistor are arranged is parallel to a direction in which the source electrode, the gate electrode, and the drain electrode of the second transistor are arranged, and the gate electrode of the first transistor is electrically connected to the gate electrode of the second transistor.

9. The semiconductor device according to claim 1, wherein a direction of a current flow in the first transistor is parallel or antiparallel to a direction of a current flow in the second transistor, and a gate electrode of the first transistor is electrically connected to the gate electrode of the second transistor.

10. The semiconductor device according to claim 1, wherein the oxide semiconductor forming the channel formation region of the second transistor includes a plurality of crystal parts whose c-axes are aligned, and a region where a diffraction pattern showing crystals whose c-axes are aligned is observed constitutes 90% or more of the oxide semiconductor in a certain range.

11. A storage device comprising a memory cell array including the semiconductor device according to claim 1.

12. A radio frequency identifier tag comprising the semiconductor device according to claim 1 and an antenna connected to the semiconductor device.

13. An electronic device comprising the semiconductor device according to claim 1 and a printed circuit board connected to the semiconductor device.

14. The semiconductor device according to claim 1, wherein a wiring capacitance comprising the first conductor and the second conductor is formed.

15. The semiconductor device according to claim 1, wherein a gate electrode of the second transistor is on an insulator layer and over the oxide semiconductor layer.

16. The semiconductor device according to claim 1, wherein a gate electrode of the second transistor faces a side surface of the oxide semiconductor layer.

17. The semiconductor device according to claim 1, wherein the oxide semiconductor layer is between a gate electrode of the second transistor and the source electrode of the second transistor.

* * * * *